US006442644B1

(12) United States Patent
Gustavson et al.

(10) Patent No.: US 6,442,644 B1
(45) Date of Patent: Aug. 27, 2002

(54) MEMORY SYSTEM HAVING SYNCHRONOUS-LINK DRAM (SLDRAM) DEVICES AND CONTROLLER

(75) Inventors: David B. Gustavson, Los Altos; David V. James, Palo Alto; Hans A. Wiggers, Saratoga, all of CA (US); Peter B. Gillingham; Cormac M. O'Connell, both of Kanata (CA); Bruce Millar, Stittsville (CA); Jean Crepeau, Nepean (CA); Kevin J. Ryan, Eagle, ID (US); Terry R. Lee; Brent Keeth, both of Boise, ID (US); Troy A. Manning, Meridian, ID (US); Donald N. North, Saratoga, CA (US); Desi Rhoden, Phoenix, AZ (US); Henry Stracovsky, San Jose, CA (US); Yoshikazu Morooka, Hyogo (JP)

(73) Assignee: Advanced Memory International, Inc., San Jose, CA (US)

( * ) Notice: Subject to any disclaimer, the term of this patent is extended or adjusted under 35 U.S.C. 154(b) by 0 days.

(21) Appl. No.: 09/132,158

(22) Filed: Aug. 10, 1998

Related U.S. Application Data

(60) Provisional application No. 60/069,092, filed on Dec. 10, 1997, provisional application No. 60/057,687, filed on Aug. 27, 1997, provisional application No. 60/057,092, filed on Aug. 27, 1997, provisional application No. 60/055,368, filed on Aug. 11, 1997, and provisional application No. 60/055,349, filed on Aug. 11, 1997.

(51) Int. Cl.[7] ........................... G06F 12/00; G06F 13/00
(52) U.S. Cl. ......................................... 711/105; 365/194
(58) Field of Search ........................... 711/105; 365/194

(56) References Cited

U.S. PATENT DOCUMENTS 5,477,541 A * 12/1995 White et al. ............... 370/94.1
5,517,505 A * 5/1996 Buchholz et al. ........ 370/105.1
5,862,094 A * 1/1999 Kawabata et al. .......... 365/222

OTHER PUBLICATIONS

High–Speed Memory Architectures for multimedia Applications, IEEE, Circuits & Devices, Jan. 1997.*

Draft/Advance, SLDRAM Inc., SLD4M18DR400/4 Meg x 18 SLDRAM Pipelined, Eight Bank, 2.5V Operation, 400 Mb/s/pin SLDRAM, Rev. Feb. 12, 1998.

Peter Gillingham, MOSAID Technologies, Bill Vogley, Texas Instruments, "SLDRAM: High–Performance, Open–Standard Memory", IEEE MICRO, Nov./Dec. 1997, pp. 29–39.

* cited by examiner

*Primary Examiner*—Matthew Kim
*Assistant Examiner*—Pierre M. Vital
(74) *Attorney, Agent, or Firm*—Fleisler Dubb Meyer & Lovejoy LLP; Gideon Gimlan

(57) ABSTRACT

A SLDRAM System is provided with a plurality of in-circuit, calibratable memory modules and a memory controller for issuing unicast and multicast command packets to the memory modules. Command packets are transmitted over a unidirectional command link that includes a complementary pair of command clock lines, a command FLAG line and a plurality of noncomplemented command bit lines. Each of the command clock lines, command bit lines and the FLAG line is a SLIO transmission line. Data transfer operations are carried out in response to the command packets over one or more bidirectional data links that each includes two complementary pairs of data clock lines, and a plurality of noncomplemented data bit lines. Each of the data clock lines and the data bit lines is a SLIO transmission line. Each SLIO transmission line is single-end terminated and preferably tapped into by way of stub resistors.

40 Claims, 13 Drawing Sheets

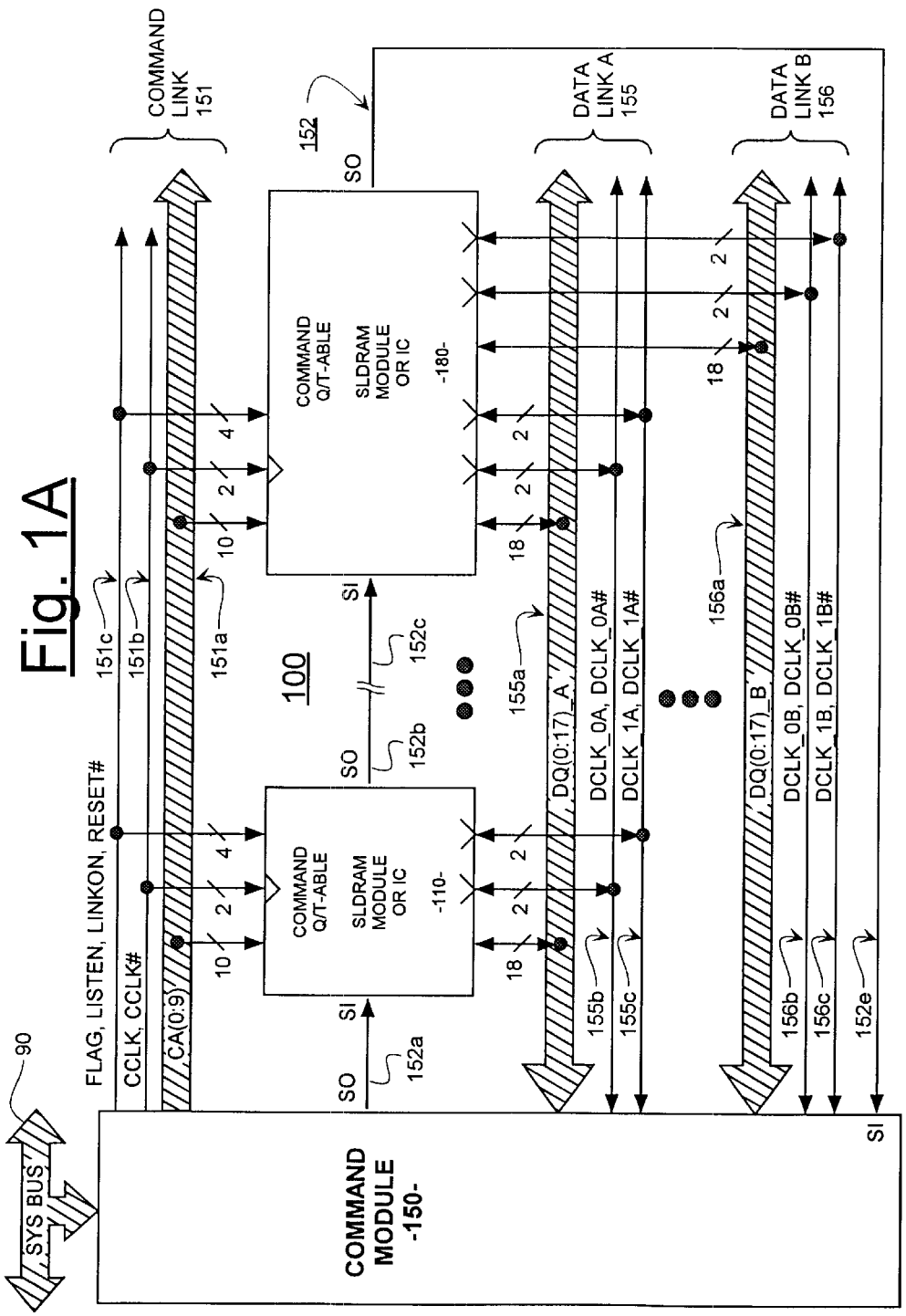

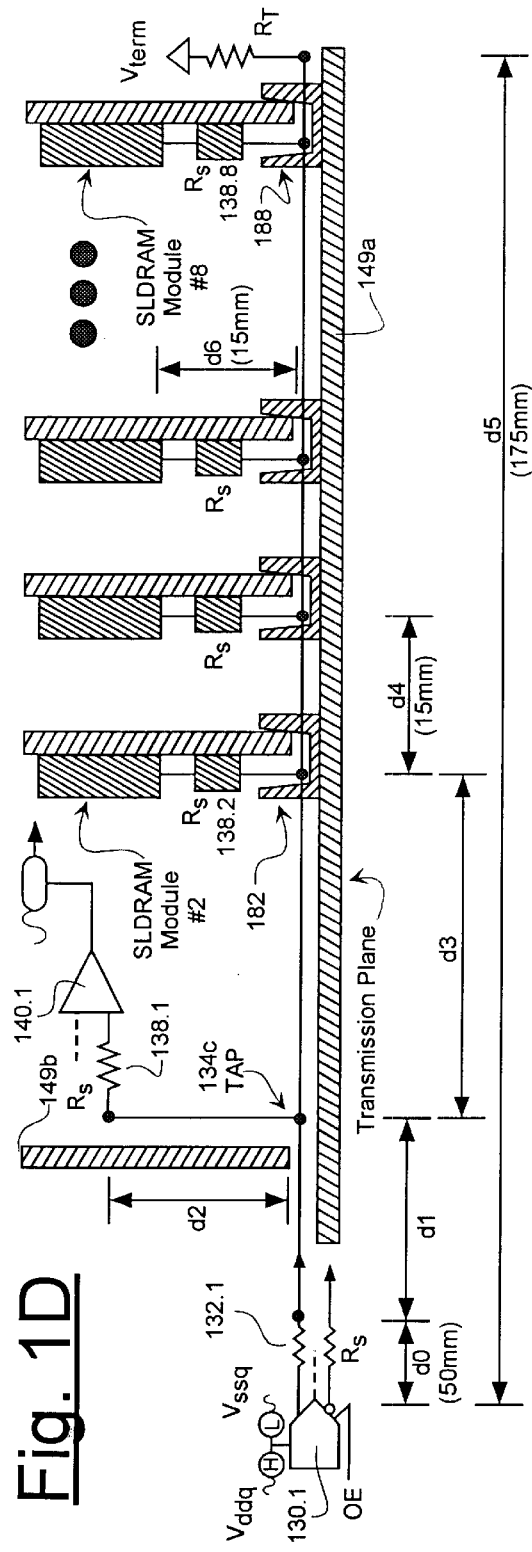

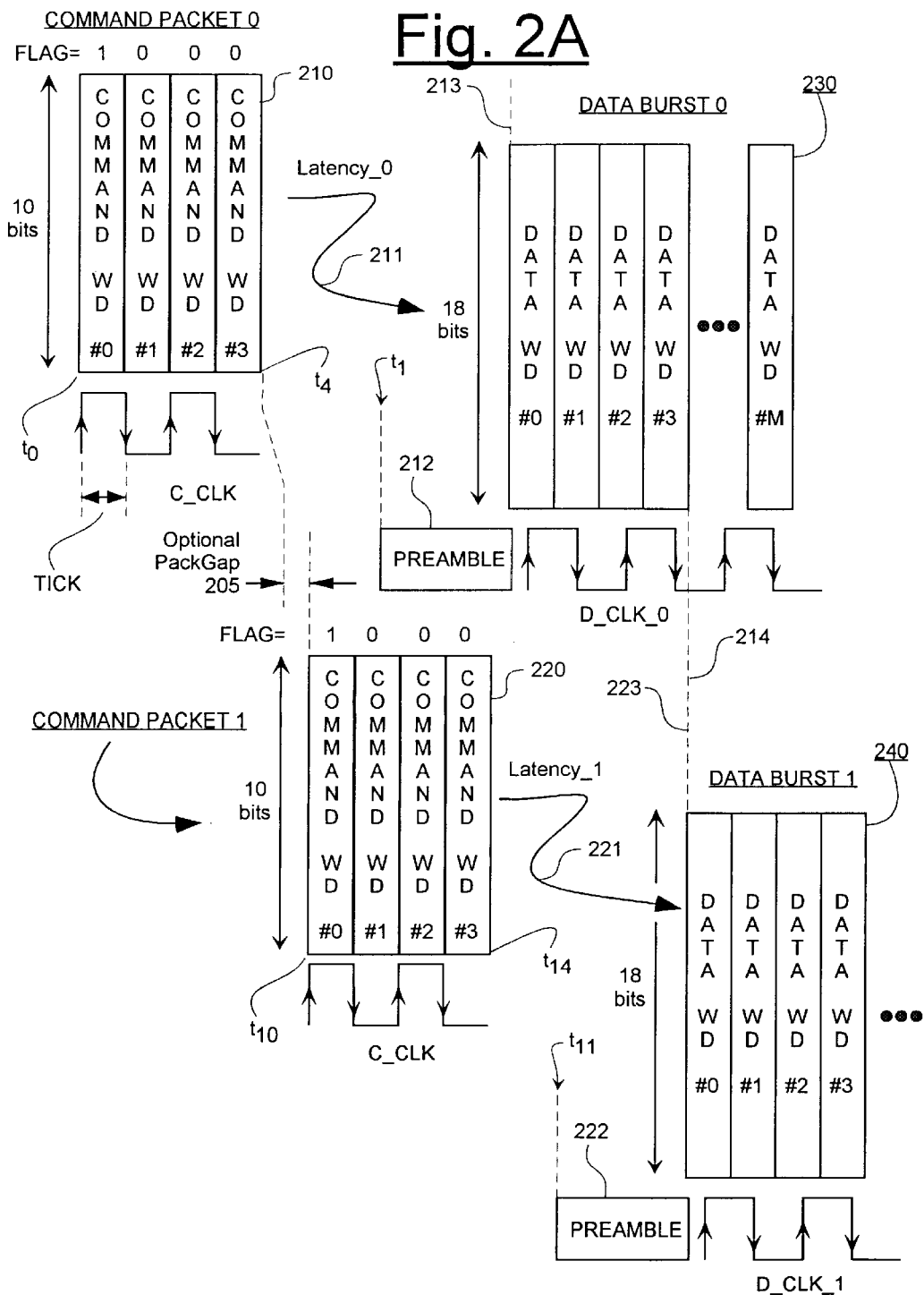

MEMORY SYSTEM HAVING SYNCHRONOUS-LINK DRAM (SLDRAM) DEVICES AND CONTROLLER

2a. CROSS REFERENCE TO RELATED NON-PROVISIONAL APPLICATIONS

The following U.S. non-provisional patent applications are fully owned by the owner of the present application, and their disclosures are incorporated herein by reference:

(A) Ser. No. 08/909,299 filed Aug. 11, 1997, by inventors David B. Gustavson et al. and entitled, BIFURCATED DATA AND COMMAND/ADDRESS COMMUNICATIONS BUS ARCHITECTURE FOR RANDOM ACCESS MEMORIES EMPLOYING SYNCHRONOUS COMMUNICATION PROTOCOLS;

(B) Ser. No. 08/933,713 filed Sep. 19, 1997, by inventor Bruce Millar and entitled, DE-SKEWING DATA SIGNALS IN A MEMORY SYSTEM;

(C) Ser. No. 08/933,710 filed Sep. 19, 1997, by inventor Bruce Millar and entitled, HIGH-SPEED BUS STRUCTURE FOR PRINTED CIRCUIT BOARDS;

(D) Ser. No. 08/933,673 filed Sep. 19, 1997, by inventors Peter Bruce Gillingham and entitled, READ/WRITE TIMING FOR MAXIMUM UTILIZATION OF BIDIRECTIONAL READ/WRITE BUS; and (E) Ser. No. 08/987,328 filed Dec. 9, 1997, by inventors David V. James et al. and entitled, DUAL DATA CLOCK FOR GLITCH-LESS TRANSFER OF TIMING INFORMATION.

2b. CROSS REFERENCE TO RELATED PROVISIONAL APPLICATIONS

The following copending U.S. provisional patent applications are fully owned by the owner of the present application, and their disclosures are further incorporated herein by reference:

(F) Ser. No. 60/055,349 filed Aug. 11, 1997, by inventors Kevin Ryan et al. and entitled, SLDRAM ARCHITECTURE;

(G) Ser. No. 60/057,092 filed Aug. 27, 1997, by inventors David B. Gustavson et al. and entitled, SLDRAM ARCHITECTURE;

(H) Ser. No. 60/057,687 filed Aug. 27, 1997, by inventors David B. Gustavson et al. and entitled, SLDRAM ARCHITECTURE (I) Ser. No. 60/055,368 filed Aug. 11, 1997, by inventors David B. Gustavson et al. and entitled, A HIGH-SPEED MEMORY INTERFACE; and (l) Ser. No. 60/069,092 filed Dec. 10, 1997 by inventors David B. Gustavson et al. and entitled, SLDRAM PROTOCOL AND COMMAND FORMAT.

2c. CROSS REFERENCE TO OTHER DOCUMENTS

The following documents are cited here for purposes of reference:

(a) (SLDRAM White Paper) *SLDRAM Architectural and Functional Overview* by Peter Gillingham, MOSAID Technologies Inc., Aug. 29, 1997 SLDRAM Consortium;

(b) Draft 0.99 Oct. 14, 1996 IEEE Memory Interface (SyncLink) P1596.7-199X entitled, *Draft Standard for A High-Speed Memory Interface* (*SyncLink*) by the IEEE Project 1596.x Working Group including Bill Vogley of Texas Instruments Semiconductor Group and Dr. David B. Gustavson of Santa Clara University; and (c) (Previous SLDRAM device specs) DRAFT/ADVANCE SLDRAM Inc. SLD4M18DR400 4 MEG× 18 SLDRAM PIPELINED, EIGHT BANK, 2.5V OPERATION 400 Mb/s/pin SLDRAM, including original of August 1997, and later revisions of: Sep. 22, 1997; Dec. 4, 1997; Jan. 29, 1998; and Feb. 12, 1998.

2d. REFERENCE TO APPENDED DOCUMENTS

The following documents are appended hereto and form part of the present disclosure. If there are any discrepancies between any of the appended documents and the present, main specification of this application, each shall be deemed as internally consistent with what is described in that document or main specification without disturbing the other. Cross-consistent details of the main specification and appended documents supplement one another:

(a) (Latest SLDRAM device specs) DRAFT/ADVANCE SLDRAM Inc. SLD4M18DR400 4 MEG×18 SLDRAM PIPELINED, EIGHT BANK, 2.5V OPERATION 400 Mb/s/pin SLDRAM, revision of: Jul. 9, 1998;

(b) "SLDRAM: High-Performance Open-Standard Memory", Peter Gillingham and Bill Vogley, IEEE Micro Magazine November/December 1997 pp 29–39;

(c) Draft 0.99 Oct. 14, 1996 IEEE Memory Interface (SyncLink) P1596.7-199X entitled, *Draft Standard for A High-Speed Memory Interface* (*SyncLink*) by the IEEE Project 1596.x Working Group including Bill Vogley of Texas Instruments Semiconductor Group and Dr. David B. Gustavson of Santa Clara University;

(d) Appendices I–IV of above-cited provisional applications including internal sub appendices thereof; and (e) 1998 IEEE International Solid-State Circuits Conference (ISSCC), pp.160–161, 431, 126–127, 385, Y. Morooka et al., "Source Synchronization and Timing Vernier Techniques for 1.2 GB/s SLDRAM Interface".

2e. NOTICE REGARDING COPYRIGHT CLAIMS

This application includes descriptions of algorithms that may be implemented by one or more computer programs. The owner of this application reserves the right to claim certain copyrights in said computer programs. The owner has no objection, however, to the reproduction by others of the descriptions herein of such algorithms if such reproduction is for the sole purpose of studying the disclosure to understand the invention or inventions described herein. The owner reserves all other copyrights in such computer programs, including the right to reproduce Such computer programs in machine-executable form.

BACKGROUND

1. Field of the Invention

The invention relates generally to memory systems that use inexpensive random access memory devices (e.g. DRAM devices). The invention relates more specifically to memory devices that may be programmably-calibrated while in-circuit.

2. Description of the Related Art

Dynamic memory or DRAM (dynamic random access memory) devices are well-known in the industry for providing inexpensive and relatively high-speed storage capabilities. The basic dynamic memory cell comprises a charge-storing capacitor and a gating element (e.g. a field effect transistor) for providing addressable access to the charge in the capacitor for sensing, refresh and overwriting.

Because of the simplicity of the basic dynamic memory cell, many such cells can be crammed economically into industry-standard sized integrated circuit (IC) dice. For example, present day home computers are typically provided with so-called SIMM's (Single Inline Memory Modules) that have 8 or 9 IC packages mounted thereon with each such IC package providing 64 Mb (64 Mega-bits) of DRAM storage. Such SIMM's may be used for providing the main system memory of the computers. Each IC device of the SIMM typically includes a monolithic silicon die or other semiconductor substrate with lithographically defined circuitry provided thereon or therein. The IC device further comprises a sealed package for protecting the substrate and its circuitry, and interconnect pins for providing signal coupling between the package-internal circuitry and external circuits. Multi-Chip Module (MCM) type packages may also be used.

There remains a long-felt desire in the industry to increase the storage density and speed of dynamic memory (e.g., DRAM) systems while simultaneously reducing costs. However, this is not a simple task. Part of the effort toward reduction of costs comes in the form of making ever-smaller dynamic memory cells. But that is not enough. Aside from a large number of dynamic memory cells, a dynamic memory device generally needs additional circuitry for organizing its dynamic memory cells into addressable words, refreshing data held in the memory cells, moving data along internal buses, and interfacing with external circuitry. All these additional circuits introduce varying delays to the data access times of the overall dynamic memory device.

Because of this, it has become difficult to mix and match different dynamic memory devices in a single system. For example, if a computer system requires so-called 70 nS (70 nanosecond) devices, it is not advisable to mix-in faster 60 nS devices while retaining the slower 70 ns devices. The differing response speeds of such mixed devices may create timing problems on the memory bus. Even if all the utilized devices are rated for a same 60 nS speed, sometimes timing problems may still arise if the mix of 60 nS devices is from different manufacturers. Tolerances may vary between manufacturers. Because of this each memory device may have slightly different parametric characteristics than that of its neighbors due to, for example, the use of different semiconductor technologies in their manufacture. This presents problems to users who have invested in a first set of memory chips from a first vendor and want to mix them in a same memory system with a second set of more modern memory chips obtained from a different vendor.

Despite such problems, the relatively low cost of dynamic memory (e.g., DRAM) devices has led to their incorporation into a wide variety of applications including serving as the main memory of both desktop and mobile computer systems, as well as providing image-storing services for real-time and high-resolution video systems. This broad range of applications imposes many demands on future generations of dynamic memory devices including desirabilities for: (a) providing yet-lower per bit cost and higher storage densities, (b) allowing for minimized power usage by each device, (c) providing for wide and sustainable read/write bandwidth capabilities, (d) reducing latency times between each access request and a corresponding read/write operation, (e) providing for easy scalability to deeper and/or wider data storage organizations, (f) permitting mixing and matching of memory devices in legacy systems that still use older technology devices, and (g) providing basic support for different kinds of hierarchical memory configurations.

In an attempt to meet a subset of these challenges, past generations of DRAM devices have evolved through a number of iterations over the years. Fast Page Mode (FPM) devices were early providers of higher speed access to previously opened pages of memory. Extended Data Out (EDO) devices provided for yet faster memory access by overlapping address decode and output operations. SDRAM (Synchronous DRAM) devices provided a higher speed interface by using synchronously-clocked data buses. DDR (Double Data Rate) devices began to take advantage of both edges on each clock pulse to increase throughput rate.

However, none of these evolutionary approaches (FPM, EDO, SDRAM, or DDR) are believed to be sufficient on their own for providing a general solution to the challenges that are expected to arrive in the coming years. Next-generation computer systems are expected to operate at ever-higher switching frequencies and use wider word sizes and deeper (larger) address spaces. Small amounts of skew between data and clock phases may become a problem. Small differences in the various delays that are imposed on parallel signals may become a problem. For example, delay differences may arise due to minor differences between parallel transmission lines that carry parallel clock and/or data signals (e.g., the delay differences may be due to slight mismatches of impedances on printed circuit board traces) and such differences may become a problem. As switching frequencies increase, problems with intersymbol interference, crosstalk, general noise, and so forth are expected to increase. A more comprehensive approach is needed for anticipating such problems and for providing flexible mechanisms to deal with such problems.

SUMMARY OF THE INVENTION

A Synchronous-Link Dynamic Random Access Memory (SLDRAM) System may be provided in accordance with the invention to include: (a) a command module for issuing command packets to uniquely addressable memory units and/or addressable collections of such units; (b) a high-speed command link for carrying the command packets; (c) one or more high-speed data links for carrying data corresponding to packet-commanded data-transfer actions; and (d) one or more, in-circuit programmably-calibratable SLDRAM modules each having one or more addressable memory units, where each SLDRAM module is capable of interfacing with the command link and at least one of the high-speed data links for appropriately responding to informational queries provided by command packets, for further appropriately responding to tuning (adjustment, or calibrating) commands provided by command packets, and for yet further appropriately responding to data addressing and other data-transfer-related commands provided by command packets.

A system initializing method in accordance with the invention comprises the steps of: (a) first initializing an SLDRAM system by broadcasting from a reference location (e.g., from pins of a memory controlling module) a predefined first synchronization sequence over command/address lines (e.g., CA(9:0)) and data lines (e.g., DQ(17:0)) of the system while simultaneously and synchronously outputting from the reference location a continuously-running clock train over one or more clock lines (e.g., CCLK, DCLK0, DCLK1) of the system for allowing one or more SLDRAM modules present in the system to each self-adjust local command-receiving and data-receiving circuits of the SLDRAM module to synchronously recognize the predefined first synchronization sequence at the locality of the self-adjusting SLDRAM module; (b) second initializing the SLDRAM system by sequentially assigning identification codes (ID's and/or sub-ID's) to individually-addressable, memory units within the in-system SLDRAM modules; (c) third initializing the SLDRAM system by sequentially commanding each in-circuit SLDRAM module to adjust output levels of the SLDRAM module's data-clock driving and data-line driving circuits to levels acceptable to an in-circuit memory controller (command module); (d) fourth initializing the SLDRAM system by sequentially commanding each in-circuit SLDRAM module to respectively output a predefined second synchronization sequence (which can be the same as the first) over the data lines (e.g., DQ(17:0)) of the system while simultaneously and synchronously outputting from the commanded SLDRAM module, a continuously-running clock train over one or more data-clock lines (e.g., DCLK0, DCLK1) of the system, this for allowing the in-circuit memory controller to command adjustments (e.g., individual phase changes) to local data-outputting circuits and local data-clock outputting circuits of the sequence-outputting SLDRAM module so that the memory controller will be able to synchronously recognize the predefined second synchronization sequence at the locality of the memory controller; and (e) fifth initializing the SLDRAM system by sequentially determining data read and data write latency times of respective ones of the in-circuit, individually-addressable, memory units.

A system utilization method in accordance with the invention comprises the steps of: (a) synchronously issuing command packets from a reference location (e.g., from a memory controlling module) of an SLDRAM system using command/address lines (e.g., CA(9:0)) of the system and command-clock lines (e.g., CCLK/CCLK#) of the system for transmitting the command packets to one or more in-circuit-calibratable SLDRAM modules of the system, where first ones of the issued command packets individually or collectively address one or more individually-addressable, memory units within the SLDRAM modules and define a data-transfer operation to be carried out by the individually or collectively addressed memory units; and (b) causing the addressed memory units to responsively perform the defined data-transfer operation within a time slot that follows receipt by the memory unit of a respective command packet, where latency between the receipt of the respective command packet and the responsive performance the defined data-transfer operation is adjustable; and wherein second ones of the issued command packets individually address one or more of the individually-addressable, memory units and define one or more respective data-transfer latencies for the individually-addressed memory unit.

A pins and/or traces distribution. pattern in accordance with the invention, as seen across a plane that intersects the pins or the traces (which traces can be printed circuit board traces), is characterized by: one or plural linear series of pins/traces, with each series extending in a lateral first direction between outer extremes of a signal communicating path extending longitudinally in a second, generally orthogonal direction and wherein said pins/traces include: (a) a first pair of complementary command-clock pins/traces for respectively carrying complementary command-clock signals (CCLK, CCLK#), the first pair of command-clock pins/traces being disposed approximately midway between said outer extremes of said signal communicating path; (b) a set of command-packet carrying pins/traces for carrying command words (CA0:9) that are synchronized with the command-clock signals and define command-packets, the command-packet carrying pins/traces being disposed proximate to the first pair of command-clock pins/traces; (c) a packet-flagging pin/trace for carrying a FLAG signal that may be used to identify the beginning or ends of consecutive command-packets, the command-flagging pin/trace being disposed proximate to the command-carrying pins/traces; (d) second and third pairs of complementary data-clock pins/traces for respectively carrying complementary first data-clock signals (DCLK0, DCLK0#) and complementary second data-clock. signals (DCLK1, DCLK1#), the second and third complementary pairs of data-clock pins/traces being disposed proximate to the first pair of complementary command-clock pins/traces; (e) a set of data-word carrying pins/traces for carrying data-words (DQ0:17) that are synchronized with one or the other of the data-clocks (DCLK0, DCLK1), the set of data-carrying pins/traces being distributed symmetrically about the data-clock carrying pins/traces; and (f) data-output powering pins/traces for providing dedicated power rails (VDDQ, VssQ) for line-drivers that output signals onto the data-carrying pins/traces, the data-output powering pins/traces being distributed plurally and symmetrically adjacent to the data-word carrying pins/traces.

Other aspects of SLDRAM systems in accordance with the invention will become apparent from the below detailed description.

BRIEF DESCRIPTION OF THE DRAWINGS

The below detailed description makes reference to the accompanying drawings, in which:

FIG. 1A is a block diagram showing a simplified, high-level view of a SLDRAM system in accordance with the invention;

FIG. 1D is a schematic diagram illustrating a possible configuration of a controller mother board and module daughter boards;

FIG. 1E is a legend for symbols used in FIGS. 1B–1D;

FIG. 2A is a flow diagram showing in simple terms how commands, data clocks and data bus transfers may be pipelined in accordance with the invention;

DETAILED DESCRIPTION

System Overview

Figure 1B:
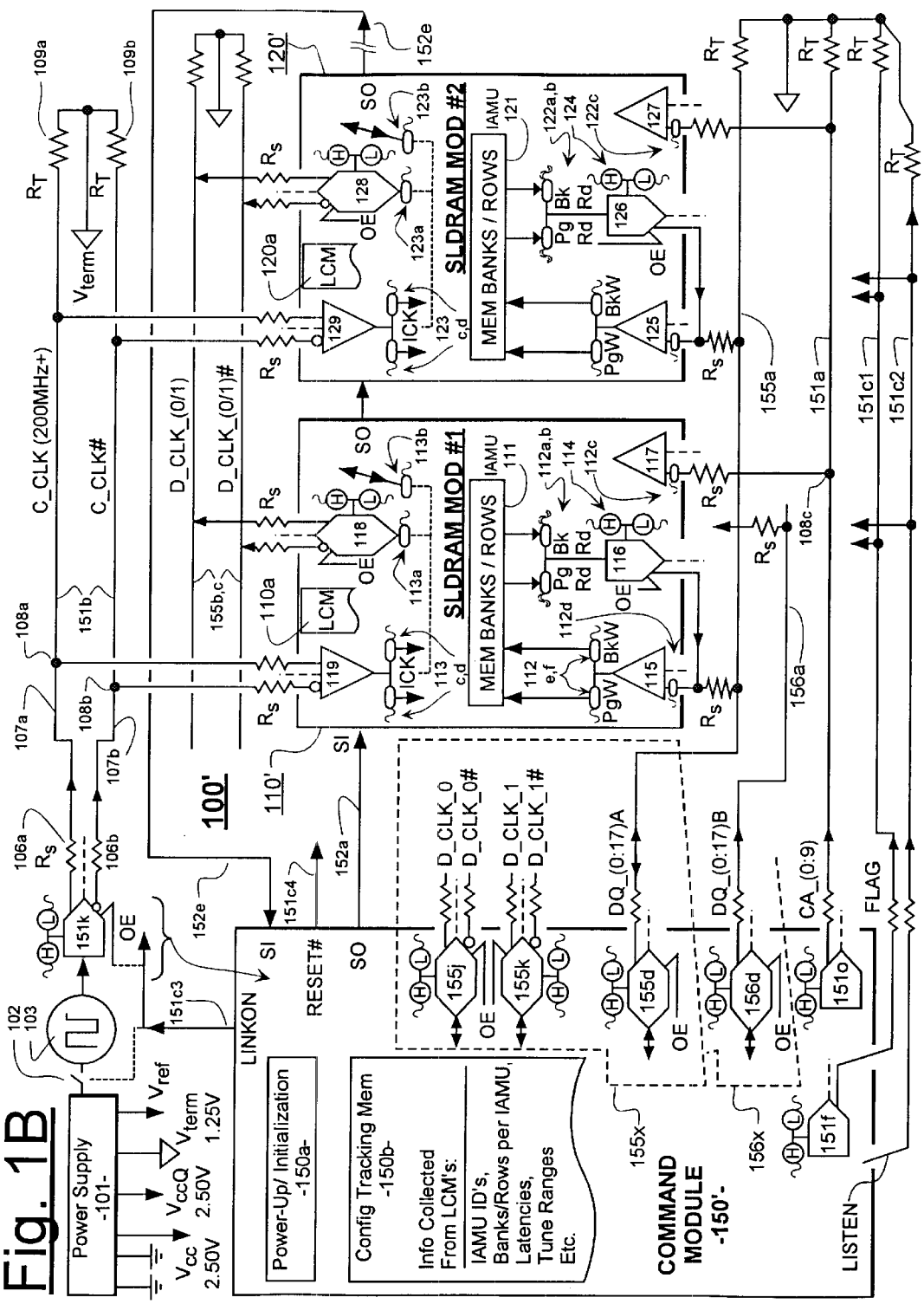
FIG. 1B is a schematic showing a more detailed view of one embodiment of an SLDRAM system in accordance with the invention.

FIG. 1A provides an introduction to a SLDRAM System 100 in accordance with the invention that satisfies at least some of the desirable characteristics set forth above, namely, (a) allowing for low per bit cost, (b) allowing for minimized power usage when devices are not in use, (c) providing for wide and sustainable read/write bandwidth capabilities, (d) where possible, reducing latency times between each access request and a corresponding read/write operation, (e) providing for easy scalability to deeper and/or wider data storage organizations, (f) permitting mixing and matching of memory devices that use different kinds of memory technologies where some are slower than others, and (g) providing basic support for different kinds of hierarchical memory configurations. These aspects will become clearer as various details are discussed in conjunction with the more detailed representation found in FIG. 1B.

A key feature of the SLDRAM System 100 shown in FIG. 1A is the provision of one or more, command-queriable and command-tunable memory modules (command Q/T-able modules) such 110 and 180.

The term 'command-queriable' (command Q-able) indicates here that a command module 150 can send information-seeking, query packets to individually-addressable memory units (IAMU's) for discovering their internal organization and basic characteristics.

Examples of such internal organization information includes number of memory banks, number of memory rows per bank, number of memory columns per row, number of bits or words per column and number of parallel data output lines. Examples of basic characteristics include minimum and maximum latency times for accessing a specific column of an already-opened row in a given bank. Another such example is minimum and maximum latency times for accessing a specific column of a not-yet-opened row in a not-yet-opened bank.

An already-opened row in an already-opened bank is referred to herein as a 'page' and its respective read/write latencies are referred to herein as 'page read' (PgRd) and 'page write' (PgW) latencies. The respective latencies for a specific column of data in a not-yet-opened row of a not-yet-opened bank are referred to herein as 'bank read' (BkRd) and 'bank write' (BkW) latencies. The minimum and maximum values for each of the PgRd, PgW, BkRd and BkW latencies can vary depending on the internal technologies used within given memory devices.

As will be seen, it is useful for the command module 150 to be able to discover what the internal organization and basic characteristics are of the various memory modules 110 through 180 that are present, and operatively in-circuit, within the SLDRAM System 100 so that the command module 150 can tune (calibrate) the memory modules while they are in-circuit and so that the command module 150 can properly interleave data transfers of such in-circuit tuned, memory modules to correspond with respective data time slots.

As used herein, the term 'SLDRAM module' can refer to either a single SLDRAM IC device or to a daughter board containing a buffered group of SLDRAM IC devices. Each 'SLDRAM module' can contain one or a plurality of individually-addressable, memory units (IAMU's). Each so-addressable memory unit (IAMU) may be assigned an ID (identification) number during system initialization. Thereafter, information-seeking, query packets can be directed from the command module 150 to respective IAMU's for discovering their internal organizations and basic characteristics. Calibrating packets may be directed from the command module 150 to respective SLDRAM modules for tuning each module to match in-circuit conditions. Data access (read and write) command packets may be directed from the command module 150 to respective, pre-calibrated SLDRAM modules for timely accessing their data.

In one embodiment, SLDRAM System 100 can support up to 256 IAMU's by using a set of nine identification bits, ID0 through ID8 within command packets. A first half (e.g., ID8=0) of the corresponding address space of 512 locations that is addressable by ID(0:9) is reserved for individually addressing (unicasting to) the IAMU's. At least one unique location within the second half (e.g., ID8=1) of the same address space is reserved for globally addressing all IAMU's. Preferably, this globally-addressing or broadcast code is defined as a setting of each of the ID bits to logic high ('1'). Other locations within the upper half of the address space may be used for addressing subsets of IAMU's in multicast fashion. In a second embodiment, SLDRAM System 100 can support up to 512 IAMU's by using a set of ten identification bits, ID0 through ID9 within command packets. In an alternate embodiment, the number of IAMU's is expanded by retaining ID0 through ID8 and supplementing these 9 address bits with additional, sub-ID bits. Of course, larger address spaces are also contemplated through the use of enlarged command packets that have more ID bits and/or more sub-ID bits.

In FIG. 1A, command packets travel unidirectionally over a CommandLink 151 that couples the command module 150 to each of up to eight further 'loads' (SLDRAM modules 110 through 180). The CommandLink 151 comprises ten, single-end terminated transmission lines for respectively carrying command/address bits zero through nine (CA0:9) in parallel. These ten lines are collectively referred to as the CA bus 151a.

Successive CA0:9 command/address words (each 10-bits wide) are synchronized consecutively with the rising and falling edges of a command clock that is provided as a differential pair of signals, CCLK and CCLK# on two, single-end terminated transmission lines 151b. Description herein of a specific rising or falling clock edge refers to the noninverted signal (e.g., CCLK) rather than to its inverted complement (e.g., CCLK#).

The CommandLink 151 further comprises four command control lines 151c that respectively carry a FLAG signal (151c1), a LISTEN signal (151c2), a LINKON signal (151c3) and a RESET# signal (151c4). The references, 151c1–151c4 are seen in FIG. 1B rather than in 1A.

In one embodiment, command packets each consist of 4 consecutive, 10 bit wide words transmitted over the CA(9:0) bus 151a. The first word of a command is indicated by a '1' in a '01000' command-aligning SLIO stream provided on the FLAG line (151c1). The CCLK/CCLK# signals of transmission lines 151b are preferably free-running square waves during an active, LINKON=1 mode. An expected typical frequency for CCLK is about 200 MHz although other frequencies such as about 300 MHz, about 400 MHz, about 600 MHz, and so forth are contemplated as well. Both edges of the differential free running clock CCLK/CCLK* 151b are used by listening SLDRAM modules (110–180) to synchronously latch command words. Thus the 200 MHz version of CCLK provides a command bandwidth of 400 Mega-bits per second per CA line (400 Mb/s/pin). It is contemplated that alternate embodiments may use more CA words per command packet and/or a wider CA bus having more CA transmission lines 151a.

While the LISTEN line (151c2) is high the SLDRAM modules (110–180) are expected to monitor other parts of the CommandLink 151 for commands. When LISTEN is low there should be no commands present on the CommandLink and SLDRAM modules (110–180) are permitted to enter a power saving standby mode. Each SLDRAM module (110–180) should be able to exit this non-listening standby mode and accept a next command packet within 2 CCLK clock cycles (4 ticks) of LISTEN going back high (to logic '1').

When LINKON (151c3) is brought low the SLDRAM modules (110–180) may enter a shutdown mode in which the complementary CCLK/CCLK# signals 151b can be turned off to achieve a low power consumption condition on the CommandLink 151. The RESET# signal (151c4) is used to put the SLDRAM modules (110–180) into a known state such as on power-up so that initialization may begin.

At least one, bi-directional DataLink (DataLink_A) 155 is provided. This DataLink_A 155 is used by the command module 150 for receiving initialization-query responses and other data (e.g., read data) from each of the SLDRAM modules (110–180). It may also be used by the command module 150 for outputting write data to one or more of the SLDRAM modules. DataLink_A 155 comprises eighteen, single-end terminated transmission lines for respectively carrying data bits zero through seventeen (DQ(0:17)_A) in parallel. These eighteen lines are collectively referred to as the DQ_A bus 155a. Individual lines are respectively referenced by parenthetical number such as DQ(5)_A for line 5 of the DQ_A bus 155a. In one embodiment, aside from the command module 150, each DataLink such as 155 can support no more than eight electrical loads, each of a predefined maximum value of electrical capacitance (e.g., 3 pF).

Successive DQ(0:17)_A data words (each 18-bits wide) are associated consecutively with the rising and falling edges of a command-specified one of plural data clock signals. The command-specified data clock signal may be provided either as differential pair, DCLK0_A and DCLK0_A# on a respective first pair of single-end terminated transmission lines 155b or it may be provided as differential pair, DCLK1_A and DCLK1_A# on a respective second pair of single-end terminated transmission lines 155c. Description herein of a specific rising or falling data clock edge refers to the non-inverted DCLK0 or DCLK1 signal rather than to its inverted complement, the DCLK0# or DCLK1# signal.

Each of the DCLK0 and DCLK1 data-clock signals generally operates at or about the same frequency as the CCLK command-clock. Unlike the CCLK signal, the DCLK0 and DCLK1 data-clock signals are generally time-windowed rather than being free-running. The signal-originating point for each of the DCLK0_A and DCLK1_A data-clock signals should change to correspond with the source point of corresponding data that is to be placed onto the DQ_A bus 155a. As different devices take over mastery of the DQ_A bus 155a the origin point of the corresponding DCLK0_A or DCLK1_A signal also typically changes. Data transmission on the DQ_A bus 155a preferably occurs as bursts of at least 4 consecutive data words each, with each such data word being 18 bits wide (thus providing at least 72 bits of data transfer per burst). Data burst length may be specified by a corresponding command packet.

During read operations, the DCLK0 and DCLK1 signals are each originated from an assigned one of the SLDRAM modules (110–180) that has corresponding mastery over the DQ_A bus 155a for the read operation. During write operations, the command module 150 gives itself corresponding mastery over the DQ_A bus and the DCLK0 and DCLK1 signals are each originated from the command module 150. The phase and magnitudes of the DCLK0 and DCLK1 signals at their respective points of origin can vary depending on the location of the source point along on the DataLink 155.

Typically, a first of the SLDRAM modules (110–180) acts as an originating source for a first of the data-clock signals (e.g., DCLK0/0#) and as a source of a corresponding first data transmission burst while, in preparation for a successive second data transmission burst, a second of the SLDRAM modules (110–180) or the command module 150 begins to act as an active originating source for the second of the data-clock signals (e.g., DCLK1/1#). The second SLDRAM module or the command module 150 should simultaneously prepare itself to be the source of the corresponding, second data transmission burst. Such preparation preferably occurs in parallel with the first transmission so that the second data burst (which in this example happens to be synchronized with DCLK1/1#) may be immediately placed on the DQ_A bus 155a just after the first data burst (which in this example happens to be synchronized with DCLK0/0#) finishes. This allows for time efficient use of the shared, DQ_A bus 155a.

Both edges of each of the differential, and time-windowed data-clock signals, DCLK_0A/DCLK_0A# (155b) and DCLK_1A/DCLK_1A# (155c) are used to latch data words on the shared DQ_A bus 155a. Thus a 200 MHz CCLK version of SLDRAM System 100 provides a per data-link bandwidth of 400 Mega-bits per second per DQ line (400 Mb/s/pin). It is contemplated that alternate embodiments may use a wider DQ_A bus 155a having more than 18 transmission lines. The eighteen bits of each data word may be designated as desired, including two for carrying parity or other error-related code and the remaining sixteen for carrying corresponding data bytes of 8 bits each.

The illustrated, second DataLink_B 156 is optional and may be used in conjunction with at least some of the SLDRAM modules (such the illustrated module 180) that have data ports which are wider than DQ_A bus 155a. In the illustrated example, module 180 has a 36-bit wide, parallel data-transmission capability while module 110 has only a 18-bit wide, parallel data-transmission capability. All of the SLDRAM modules (110–180) convey their initialization information over the primary DataLink_A 155. However, if the command module 150 learns from the initialization process that module 180 has the wider, 36-bit parallel data-transmission capability, the command module 150 may instruct module 180 to convey the upper half of its 36-bit wide data by way of DataLink_B 156 while the lower half is simultaneously conveyed by way of DataLink_A 155. Thus, scaling to wider data paths and higher bandwidths is supported.

DataLink_B 156 is preferably structured in the same way as DataLink_A 155 to have eighteen, single-end terminated transmission lines for respectively carrying secondary data bits zero through seventeen (DQ(0:17)_B)) in parallel. These eighteen lines are collectively referred to as the DQ_B bus 156a. Similarly, successive DQ(0:17)_B data words (each 18-bits wide) are associated consecutively with the rising and falling edges of a command-specified one of plural data clock signals of the secondary link 156. The command-specified data clock signal of the DQ_B bus 156a may be provided either as differential pair, DCLK0_B and DCLK0_B# on a respective first pair of single-end terminated transmission lines 156*b* or it may be provided as differential pair, DCLK1__B and DCLK1__B# on a respective second pair of single-end terminated transmission lines 156*c*. Again, the outputting source of a respective one of DCLK0__B/B# and DCLK1__B/B# also acts as the outputting source of the corresponding data bursts on DQ__B bus 156*a*.

Although not shown, SLDRAM System 100 may have yet further data links in addition to 155 and 156. These additional data links may be similar to 155 or wider or narrower as appropriate for the different kinds of SLDRAM modules (110–180) used in the system 100.

Mechanically-speaking, for each DataLink (155, 156, etc.), the clock and data transmission lines of that DataLink should be run closely together so that they all exhibit substantially same transmission characteristics for the utilized clock frequency and so that data and clock transmissions closely track one another. This is why the DCLK__0A/DCLK__0A# lines (155*b*) and DCLK__1A/DCLK__1A# (155*c*) are shown lumped together close to the DQ__A bus 155*a*. For the same reason, the DCLK__0B/DCLK__0B# lines (156*b*) and DCLK__1B/DCLK__1B# (156*c*) are shown lumped together close to the DQ__B bus 156*a*. Also, the CCLK lines should run close to the CA(0:9) and FLAG lines so that these exhibit substantially same transmission characteristics for the utilized clock frequency and mechanical layout. Additionally, the CCLK lines should run close to the DCLK0 and DCLK1 lines of at least one DataLink so that these exhibit substantially same transmission characteristics for the utilized clock frequency and mechanical layout. One embodiment follows the trace-wire dispersal pattern shown in FIG. 4.

A daisy chained, serial bus 152 is further shown in FIG. 1A. This serial bus 152 includes provision of an input SI terminal and output SO terminal on each module, 110–180 and also 150. Serial bus 152 is used on power-up and resets to serially step through the SLDRAM modules (110–180), to tune their command-receiving phases, and to thereafter assign unique ID's to each IAMU (individually-addressable, memory unit). Each SLDRAM module (110–180) may contain one or more respective IAMU's.

On power-up/reset, RESET# (151*c*4) is activated. In response all SLDRAM modules (110–180) and the command module 150 drive their respective SO terminal low. This signals to the next module in the daisy chain 152 that the previous module has not yet finished initializing. The command module 150 should be initialized first. Such initialization may or may not include output level tuning and/or clock tuning as appropriate for a specific implementation of command module 150. Initialization of the command module 150 may be self-mediated or controlled through a system bus 90. The system bus 90 may couple to a CPU (central processing unit) or to another, like high-intelligence system. The command module 150 may be a low cost, packaged device that supports only the minimal requirements set forth herein or it may be more complex, as desired. The intent here is to allow the basic SLDRAM System 100 (with the exception of system bus 90 and its interface) to be of low cost and compact size.

Once initialization of the command module 150 completes, it drives its SO terminal 152*a* to logic high ("1") for a first time in order to begin a broadcast initialization sequence. The command module 150 asserts mastery over both the DCLK__0A/DCLK__0A# bus (155*b*) and the DCLK__1A/DCLK__1A# bus (155*c*) and begins continuous transmission of the CCLK signal onto these buses 155*b,c* as well as onto the CCLK transmission lines 151*b*. At the same time and in synchronism with the CCLK signal, the command module 150 begins continuous transmission of a predefined first synchronization sequence onto each of the lines of the CA(0:9) bus 151*a*, onto each of the lines of the DQ(0:17)__A bus 155*a*, and onto the FLAG line (151*c*1). In one embodiment, this predefined first synchronization sequence comprises a repeat of the 15-bit, pseudo-random SYNC sequence: '111101011001000' (four 1's, two 01's, two 100's, and a 0). This pattern provides every possible 4-bit sequence except 0000. Other similar sequences may of course be possible.

In one embodiment, the SYNC sequence is staggered across lines as indicated by Table 0.5.

TABLE 0.5

| SIGNAL | SYNC PATTERN ALIGNMENT REPEATING PATTERN . . . |
|---|---|
| FLAG | 1 1 1 1 0 1 0 1 1 0 0 1 0 0 0 . . . |
| CA9 | 0 0 0 0 1 0 1 0 0 1 1 0 1 1 1 . . . |
| CA8 | 1 1 1 1 0 1 0 1 1 0 0 1 0 0 0 . . . |
| CA7 | 0 0 0 0 1 0 1 0 0 1 1 0 1 1 1 . . . |
| CA6 | 1 1 1 1 0 1 0 1 1 0 0 1 0 0 0 . . . |
| CA5 | 0 0 0 0 1 0 1 0 0 1 1 0 1 1 1 . . . |
| CA4 | 1 1 1 1 0 1 0 1 1 0 0 1 0 0 0 . . . |
| CA3 | 0 0 0 0 1 0 1 0 0 1 1 0 1 1 1 . . . |
| CA2 | 1 1 1 1 0 1 0 1 1 0 0 1 0 0 0 . . . |
| CA1 | 0 0 0 0 1 0 1 0 0 1 1 0 1 1 1 . . . |
| CA0 | 1 1 1 1 0 1 0 1 1 0 0 1 0 0 0 . . . |
| DQ17 | 0 0 0 0 1 0 1 0 0 1 1 0 1 1 1 . . . |
| DQ16 | 1 1 1 1 0 1 0 1 1 0 0 1 0 0 0 . . . |
| DQ15 | 0 0 0 0 1 0 1 0 0 1 1 0 1 1 1 . . . |
| DQ14 | 1 1 1 1 0 1 0 1 1 0 0 1 0 0 0 . . . |
| DQ13 | 0 0 0 0 1 0 1 0 0 1 1 0 1 1 1 . . . |
| DQ12 | 1 1 1 1 0 1 0 1 1 0 0 1 0 0 0 . . . |
| DQ11 | 0 0 0 0 1 0 1 0 0 1 1 0 1 1 1 . . . |
| DQ10 | 1 1 1 1 0 1 0 1 1 0 0 1 0 0 0 . . . |
| DQ9 | 0 0 0 0 1 0 1 0 0 1 1 0 1 1 1 . . . |
| DQ8 | 1 1 1 1 0 1 0 1 1 0 0 1 0 0 0 . . . |
| DQ7 | 0 0 0 0 1 0 1 0 0 1 1 0 1 1 1 . . . |
| DQ6 | 1 1 1 1 0 1 0 1 1 0 0 1 0 0 0 . . . |
| DQ5 | 0 0 0 0 1 0 1 0 0 1 1 0 1 1 1 . . . |
| DQ4 | 1 1 1 1 0 1 0 1 1 0 0 1 0 0 0 . . . |
| DQ3 | 0 0 0 0 1 0 1 0 0 1 1 0 1 1 1 . . . |
| DQ2 | 1 1 1 1 0 1 0 1 1 0 0 1 0 0 0 . . . |
| DQ1 | 0 0 0 0 1 0 1 0 0 1 1 0 1 1 1 . . . |
| DQ0 | 1 1 1 1 0 1 0 1 1 0 0 1 0 0 0 . . . |
| CCLK | 1 0 1 0 1 0 1 0 1 0 1 0 1 0 1 . . . |
| DCLK1 | 1 0 1 0 1 0 1 0 1 0 1 0 1 0 1 . . . |
| DCLK0 | 1 0 1 0 1 0 1 0 1 0 1 0 1 0 1 . . . |

The predefined first synchronization sequence is known to each of the SLDRAM modules (110–180) and each enters into its own self-synchronizing operation wherein it adjusts internal parameters (e.g., internal clock phases and/or delays) so as to optimize local recognition of the predefined synchronization sequence in synchronism with a respective one of the locally-received CCLK, DCLK0 and DCLK1 signals. This will be better appreciated when FIG. 1B is discussed.

Once each of the SLDRAM modules (110–180) finishes its self-synchronizing operation, it sets its SO line high if its SI line is also high. The low to high transition at the end of the chain, at 152*e*, informs the command module 150 that all the present modules 110–180 have finished their respective self-synchronizing operations and are now in condition to receive command packets. If a predefined maximum time elapses and command module 150 does not see the expected low to high transition at the end of the chain 152*e*, the command module 150 may send a message to a system BIOS (Basic Input Output System, not shown) by way of bus 90 to indicate that SLDRAM System 100 has experienced an initialization error and that intervention is needed to fix the fault.

In response a successful return of a first low to high transition at the end of the chain 152e, command module 150 stops broadcasting the synchronization sequence over the CA, DQ and FLAG lines. Then module 150 brings its SO line 152a low. The low ripples through the serial chain 152 back to the last SI terminal 152e. In response, command module 150 drives its SO terminal 152a to logic high ("1") for a second time in order to begin an identification assignment sequence. Some time before this step, all the SLDRAM modules (110–180) should have reset respective identification registers within themselves to a broadcast-recognition value (e.g., a local ID and sub-ID's of all 1's).

The first SLDRAM module in the chain 152 that has the broadcast-recognition value as its ID (e.g., module 110) and sees the second ripple-high of its SI terminal (e.g., 152a) responsively enters into an identification assignment procedure. If the SLDRAM module (110) has more than one IAMU (not shown), each IAMU may have its own SI/SO terminal for continuing the identification assignment daisy chain internally within the SLDRAM module. Each IAMU can therefore individually declare its presence during the initialization process. In response to one or more, ID-register write-request packets, each successive IAMU within the SLDRAM module (110) whose respective SI/SO state is 1/0, and whose current ID is all ones, accepts a next successive and typically-unique identification comprised of a main ID part (e.g., 9 bits) and optionally, a sub-ID part (e.g., 4 bits). Identification assignment is thus daisy chained from one IAMU to the next inside each of the SLDRAM modules (110–180) and similarly from one SLDRAM module to the next. Accordingly, when SLDRAM module 110 is finished, its SI line 152a will be high and its SO line 152b will be also be high. This SI/SO state of 1/1 causes SLDRAM module 110 to ignore further ID assignment commands. The next successive SLDRAM module takes over.

When the last SLDRAM module in the chain (e.g., 180) is finished, its SI line 152c will be high and its SO line 152e will go high. The end-of chain SO line 152e returns to the SI input of the command module 150 and is used for letting module 150 know that the end of the chain has been again reached. If a predefined maximum time elapses and command module 150 does not see the expected low to high transition at the end of the chain 152e, the command module 150 may send a message to the system BIOS by way of bus 90 to indicate that SLDRAM System 100 has experienced an initialization error during ID assignment and that intervention is needed to fix the fault.

When a successful return of the second low to high transition occurs at the end of the chain 152e, the command module 150 should know how many IAMU's (individually-addressable, memory units) are present in SLDRAM System 100 and it should know what unique (or nonunique) ID has been assigned to each such IAMU.

In a subsequent set of individualized query and tuning operations, the command module 150 may query each uniquely-identified IAMU to learn about its internal capabilities. It may then individually tune the DCLK and DQ output drivers of each SLDRAM module so as to optimize synchronous recognition at the receipt plane of the command module 150 of DCLK and DQ signals output from differently situated ones of the SLDRAM modules (110–180). These aspects will become clearer as various details FIG. 1B are discussed.

Following the individual query and tuning operations, the command module 150 may begin to send individualized data access and other command packets to each IAMU. It may also send group command packets to groups of IAMU's on a multicast basis. It may also send global command packets to all the IAMU's on a broadcast basis as will be seen.

Signaling levels and directions within SLDRAM System 100 may vary according to Table 1.0. In Table 1.0, SLIO stands for a 3-level, synchronous link input/output signaling system as will be detailed by FIG. 1C. LVCMOS stands for a binary, low-voltage (e.g., 0–2.5V) CMOS signaling system. TTL or LVTTL may be used instead of LVCMOS if desired. MC is the memory controller (also referred to as command module) 150. (At times throughout this document, an asterisk '*' is used interchangeably with the pound sign '#' to indicated a complementary signal.)

TABLE 1.0

| | Signal Name | Description | Direction | Level |
|---|---|---|---|---|
| Command-Link | CCLK/ CCLK* | Command Clock | MC→SLDRAM | SLIO |
| | FLAG | Command Word Flag | MC→SLDRAM | SLIO |
| | CA[9:0] | Command Address Bus | MC→SLDRAM | SLIO |
| | LISTEN | Standby Mode | MC→SLDRAM | SLIO |
| | LINKON | Shutdown Mode | MC→SLDRAM | LVCMOS |
| | RESET* | Hard Reset | MC→SLDRAM | LVCMOS |
| Data-Link | DCLK0/ DCLK0* | Data Clock 0 | MC<->SLDRAM | SLIO |
| | DCLK1/ DCLK1* | Data Clock 1 | MC<->SLDRAM | SLIO |
| | DQ[17:0] | Data Bus | MC<->SLDRAM | SLIO |
| Serial | SI | Serial Input | MC→SLDRAM, SLDRAM→SLDRAM | LVCMOS |
| | SO | Serial Output | MC→SLDRAM, SLDRAM→MC | LVCMOS |

SLIO Signaling

The SLIO signaling system of SLDRAM System 100 may be viewed as an improved and more rigid version of the JEDEC SSTL_2 signaling system (Series Stub Termination Logic for 2.xV logic circuits). SLIO is used for high speed signaling. Output drive levels are more tightly specified in SLIO to achieve faster bus settling and improved noise margin. The Controller 150 and SLDRAM devices 110–180 each employ a noise-isolated, 2.50V $V_{ccQ}$ supply to power the respective $V_{ddQ}$ drain terminals of their respective output drivers. A corresponding noise-isolated, ground line is similarly used to power the respective $V_{ssQ}$ source terminals of their respective output drivers. See FIGS. 1B and 1C. Other parts of the system that operate at lower frequencies and/or are generally less sensitive to noise (e.g., LVCMOS lines) preferably use a more general 2.50V $V_{cc}$ supply rail and corresponding signal ground.

Each differential or nondifferential SLIO signal of the CommandLink 151 and of the DataLinks 155 (and optionally 156, etc.) is transmitted over a single-end terminated, transmission line. Preferably, each. such SLIO line is resistively urged to a midpoint reference level of about $V_{term}$= 1.25V by a termination resistor $R_T$ of approximately 30Ω, see FIGS. 1B–1C) provided at the far end of the line, away from the command module (MC) 150. Such single end termination helps to save power consumption as compared against more-standard, double-ended termination systems.

Figure 1C:
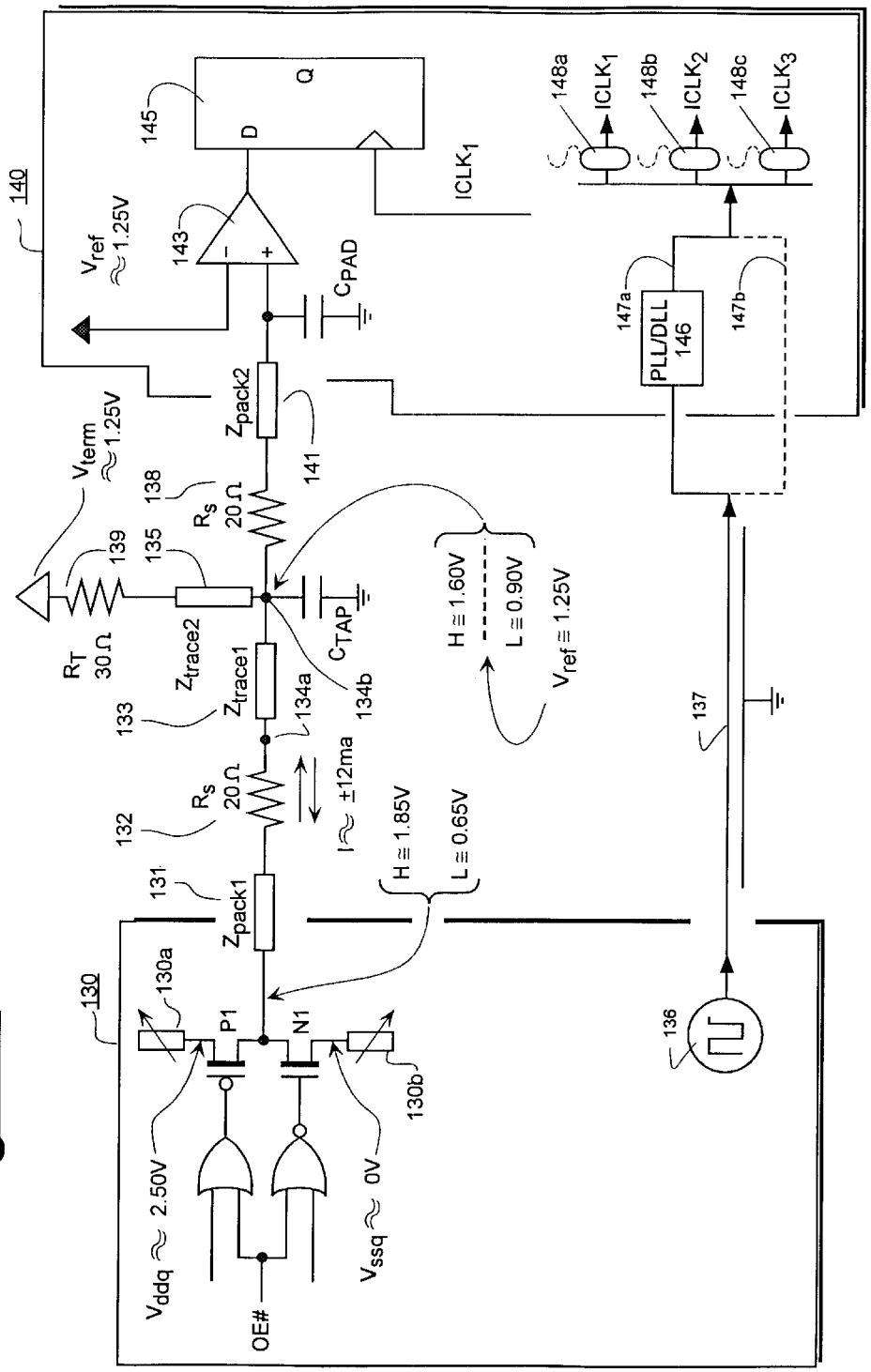
FIG. 1C is a schematic diagram for illustrating general aspects of a SLIO (SynchronousLink Input/Output) connection.

As seen in FIGS. 1B and 1C, a series stub resistor ($R_S$) of approximately 20Ω each or a generally equivalent isolation means is provided at each tap point into each SLIO transmission line to help isolate the major part of the transmission line from load perturbations that may be presented by module inputs and outputs (roughly 3 pF each).

In FIG. 1C, circuit 130 is representative of a SLIO output driver such as may found for example inside the package of the command module 150. Circuit 140 is representative of a spaced-apart SLIO receiver such as may found for example inside the package of a SLDRAM module (e.g., 110). Clock source 136 is representative of a synchronization means such as may be further found for example inside the package of the command module 150. Clock source 136 is coupled by a transmission means 137 (e.g., an RF transmission line) to the locality of receiver circuit 140. The separation between the SLIO line driver circuit 130 and the SLIO receiver circuit 140 may be on the order of about 50 mm (millimeters) to 175 mm.

A major portion of an exemplary SLIO transmission line is represented by trace impedance elements 133 ($Z_{trace1}$) and 135 ($Z_{trace2}$). These elements 133, 135 may be generally implemented as printed circuit board traces on mother and daughter boards. Other forms of implementing compact transmission lines for carrying SLIO signals of 200 MHz or higher switching frequencies may used instead as appropriate.

A first tap into the exemplary SLIO transmission line 133/135 is represented by dot 134a and may occur for example at the MC-near end of the line. A second tap into the SLIO transmission line 133/135 is represented by dot 134b and may occur for example anywhere between the MC-near end of the line and the termination (139) far end of the line.

Element 131 ($Z_{pack1}$) represents a first package interconnect impedance associated with line-driving circuit 130. The value of $Z_{pack1}$ may vary depending on specific package design. In one embodiment, it should be no more than about a 3 pF capacitance to AC ground.

The internal representation of the SLIO line-driver circuit 130 may also vary depending on what specific IC technology is used. In FIG. 1C, element P1 represents in general, a current sourcing element that couples to the SLIO power rail, $V_{ccQ}$. N1 represents in general, a current sinking element that couples to the corresponding SLIO ground rail. The illustrated, tristate CMOS design that includes P-channel MOSFET P1, N-channel MOSFET N1 and the OR and NOR gates may be used for supporting 3-level signaling that includes a HI-Z output state when OE is inactive (when OE# is high). Other equivalents that can support such 3-level signaling may be used instead.

Elements 130a, 130b represent programmably-configurable tuning means for tuning the respective $V_{OH}$ and $V_{OL}$, binary output levels of line-driver 130. Although elements 130a, 130b are shown as being in series with elements P1, N1, it is to be understood that such an arrangement is conceptual. The tuning of the respective $V_{OH}$ and $V_{OL}$, binary output levels may be instead performed by parallel circuitry in which the effective channel width of transistors such as P1, N1, is modulated, for example by enabling more or fewer transistors that operate in parallel with P1, N1. If such a parallel-tuning approach is used, voltage levels $V_{ccQ}$ and $V_{ddQ}$ are essentially the same. In one embodiment, $V_{ddQ}$ is about 2.50V, $V_{ssQ}$ is about 0V, and due to the source-to-drain on-resistances (or effective channel widths) of MOSFET elements P1, N1, the respective $V_{OH}$ and $V_{OL}$ output levels are approximately 1.85V and 0.65V at the output pin of module 130. The $V_{term}$ level is about midway between $V_{OH}$ and $V_{OL}$ such that source current flow is about +12 mA for representing a SLIO logic high ('1') and sink current flow is about −12 mA for representing a SLIO logic low ('0').

With this circuit configuration, the respective high (H) and low (L) voltage levels at second tap point 134b are about 1.60V and 0.90V. A locally-situated reference voltage level $V_{ref}$ that is provided at the SLIO receiver circuit 140 is positioned about midway between these H/L levels of tap point 134b and is supplied to one input terminal of receiver circuit 140, for example to a minus (−) input of comparator 143.

In the illustrated example of SLIO receiver circuit 140, a second input terminal of comparator 143 (e.g., the plus (+) terminal) couples to the SLIO transmission line 133/135 by way of tap point 134b, and by further way of isolating stub resistor 138 and package interconnect impedance 141 ($Z_{pack2}$) The value of $Z_{pack2}$ may vary depending on specific package design of circuit 140.

Further in this example, an output of comparator 143 couples to a D input of flip flop 145 and indicates whether at a given point in time, the received signal level is above or below the local $V_{ref}$. Alternative methods for detecting the state of tap point 134b may be used. This is merely an example.

Further in this example, an internal first clock, $ICLK_1$ of SLIO receiver circuit 140 controls the latching instant of flip flop 145. Alternative methods for defining the state-sampling time or times for tap point 134b may be used. This is merely an example. The internal first clock, $ICLK_1$ may be generated in a variety of ways. For example, a phase-lock loop (PLL) circuit or delay-locked loop (DLL) circuit 146 may be coupled to clock source 136 by way of coupling means 137. A phase and/or frequency locked output 147a of the PLL/DLL circuit may be supplied to plural delay elements 148a, 148b, 148c, etc. Alternatively, a differently buffered route 147b may be used to couple means 137 to the delay elements 148a, 148b, 148c, etc. Some or all of the delay elements 148a, 148b, 148c, etc. may be programmably-adjustable so as to selectively provide different vernier values of phase shift over the cycle length of clock source 136. The respective, phase-shifted versions, $ICLK_1$, $ICLK_2$, $ICLK_3$, etc. may be distributed about SLIO receiver circuit 140 as appropriate. Again, this is merely an example of how to establish vernier control over sampling time. Other approaches may be taken.

During power-up and periodic recalibration modes, the output drive levels of respective line drivers such as 130 should be tuned by the memory controller 150 to achieve and maintain over time, the expected 0.90 v and 1.60 v drive levels on the main SLIO transmission line (e.g., at tap points 134a and 134b). Transmission means 137 can be a second, so-tunable SLIO path. However, here we are focusing on the adjustments made for keeping SLIO transmission line 133/135 within calibration.

In FIG. 1C, $C_{TAP}$ represents a lumped and parasitic, impedance perturbation due to tap point 134b disturbing the distributed impedance of the main SLIO transmission line 133/135. This lumped, impedance perturbation can be attributed to a via hole passing through a printed circuit board (PCB) and/or a slot connector on a controller mother board that removably receives a SLDRAM module package or IC package. $C_{PAD}$ represents a lumped and parasitic, impedance perturbation due to an internal IC pad within receiver circuit 140. Stub resistor 132 helps to isolate the main SLIO transmission line 133/135 from load perturbations and signal reflections that may be presented to the line by driver 130. Stub resistor 138 helps to isolate the main SLIO transmission line 133/135 from load perturbations and signal reflections that may be presented to the line by receiver 140. Line terminating resistor 139 ($R_T$) is approximately 30Ω.

Many factors can contribute to variations in the parametric values of elements such as 131–135, 138, 141, $C_{TAP}$ and $C_{PAD}$, where these elements influence the signal levels and phases seen by comparator 143.

FIG. 1D illustrates a possible mechanical arrangement for an SLDRAM system. Here, a first transmission plane 149a represents a controller mother board. An orthogonally-disposed second transmission plane, 149b represents a SLDRAM module or daughter board. Node 134c is representative of a tap means that allows unit 149b to be removably inserted for tapping into the SLIO transmission line. An example of such connectors are shown at 182 and 188.

Distance d0 is a lead-in separation between the package pin of SLIO line driver 130.1 and stub resistor 132.1. Distance d1 is a first PCB trace length from the front end of the SLIO transmission line to tap point 134c. Distance d2 is a second line length from the tap point 134c to stub resistor 138.1 on the daughter board 149b of receiver of unit 140.1. Distance d3 is a third line length from the tap point 134c to an $R_T$ termination on the mother board 149a.

Designers of PCB's (printed circuit boards) and IC's (integrated circuits) are relatively free to optimize this arrangement as they see fit for reducing noise, cross-talk, package size and so forth. As such, the ultimate parametric values that are seen on each SLIO transmission line (e.g., 133/135 of FIG. 1C) may vary. In one embodiment, lead-in distance d0 is approximately 50 mm; the maximum trace length d5 on the mother board is approximately 175 mm; and inter-module spacing d4 is approximately 15 mm. Wire length d6 on each daughter board 149b from connector (182, 188) to the SLDRAM module (including through the stub resistor) is about 15 mm. Further in this one embodiment; trace widths are approximately 6-mils per track and track pitch is approximately 20-mils. The characteristic impedance of each SLIO trace taken by itself is about 60Ω to 65Ω. The presence of the closely-spaced stub resistors reduces the effective line impedance to about 30Ω to 35Ω, which close to the value of the termination resistor. Ground lines and/or planes may be interleaved between SLIO traces to provide shielding and reduce cross-talk.

It should be apparent in view of the above description of FIG. 1C that in-circuit tuning during the initialization phase and during periodic re-calibration operations is expected to compensate for design differences, including different values of line distances d1, d2, d3, etc. (FIG. 1D); different values of package impedances such as $Z_{pack1}$, $Z_{pack2}$; different values of trace impedances such as $Z_{trace1}$, $Z_{trace2}$; different values of other load disturbances such as $C_{TAP}$, $C_{PAD}$ and changes over time due to voltage drift, temperature drift, mechanical reconfiguration of where different SLDRAM modules are inserted, and so forth. The tunable values include variable driver-output levels as represented in FIG. 1C by elements 130a, 130b and variable sampling times as represented in FIG. 1C by elements 146, 148a–148c.

FIG. 1E provides a legend of some symbols used in the drawings. A generally-tunable delay element or phase-defining means is represented by an oval and sine-wave tail as shown at 191. As is understood in the art, there are many ways to define the phase of a given signal. These techniques. can employ analog or digital delay elements or latches that are strobed by differently phased clock signals or combinations of such elements. The phase defining operation can operate similarly on both rising and falling edges of a given signal or differently with respect to each edge. The general intent of symbol 191 is to convey that the phases of one or both of the rising and falling edges of the more signals (e.g., input and output) passing along the indicated path are adjustable on one or both of a fine and coarse adjustment scales as appropriate for the context of the illustrated path. For input signals, phase adjustment is to be understood to include some way of defining when the input signal is sampled so as to determine its state at the sampling time. For output signals, phase adjustment is to be understood to include some way of defining when the output signal transitions from one state to another (e.g., from low to high).

A coarsely and vernierably-fine tunable delay element or phase-defining element is represented by an oval and two sine-wave tails (one dashed) as shown at 192. A vernierably-fine tunable delay element or phase-defining element is represented by an oval and a dashed sine-wave tail as shown at 193. In one embodiment, coarse delay/phase tunings are provided in quantums of CCLK clock ticks while vernier-fine tunings are provided in fractional quantums of a CCLK clock tick. A CCLK clock 'tick' is the time length between a rising and successively falling edge of a CCLK pulse.

Further in FIG. 1E, a generally-tunable, output-level defining element is represented by a circle and a sinewave tail as shown at 195. A "H" in the symbol indicates that it is for tuning the $V_{OH}$ level of the corresponding driver output while a "L" in the same symbol indicates that it is for adjusting the $V_{OL}$ output level of the tunable output driver. Thus, the composite symbol shown at 197 represents an SLIO transmitter with individually-tunable $V_{OH}$ and $V_{OL}$ output levels. The OE (output-enable) terminal of symbol 197 indicates that the symbol further represents a tristatable driver which provides a high-impedance (HI-Z) state at each of its respective outputs when OE is brought low (deactivated). In accordance with traditional symbolism, the output of the driver 197 that has an open circle (bubble) represents the inverted output while the solid output line above it carries the non-inverted complementary output signal. The dashed line coming from the middle right of symbol 197 indicates that it is a SLIO transmitter that is driven by the noise-isolated $V_{ccQ}$ and ground power rails.

Similarly, symbol 196 represents a SLIO receiver. The dashed line at one of its inputs indicates that SLIO receiver 196 is responsive to a locally-supplied $V_{ref}$ reference level for determining the state at its other, solid input terminal. Although not specifically shown, it understood that a SLIO receiver which receives complementary, inverted and non-inverted SLIO signals may employ differential techniques for removing common mode noise before comparing against the locally-supplied $V_{ref}$ reference level.

Connections to SLIO transmission lines may be bidirectional such a same tap is used for both input and output. The multi-directed symbol at 198 represents a SLIO transceiver that provides bidirectional buffering. It is understood to be a combination of differential driver 197 and either two copies of SLIO receiver 196 (one for each of the differential lines) or a differential SLIO receiver.

Given the above introduction, reference is now made to FIG. 1B for a better understanding of details of the there illustrated SLDRAM System 100'. It should be understood with regard to FIG. 1B that various liberties were taken due to space limitations in the drawing. For example, LINKON line 151c3 is not shown extending to and coupling to all SLDRAM modules (110', 120', etc.). Such coupling is nevertheless understood. Similarly, the couplings of RESET# line 151c4, LISTEN line 151c2 and FLAG line 151c1 to all SLDRAM modules (110', 120', etc.) is not fully shown but nevertheless understood. Additionally, reference 155b,c is intended to cover four, single-end terminated, clock lines even though the drawing shows only two such lines at the local of reference 155b,c. (All four lines are shown at the local of elements 155j, 155k.) Moreover, symbol 118 is intended to correspondingly represent two SLIO transceivers coupling respectively to the four lines of 155b,c. Symbol 113a may represent a plurality of tunable delay or phase-establishing elements (e.g., each for a respective rising or falling pulse edge and/or each for a respective input or output signal) although only one symbol is shown at 113a. There are other examples of such drawing liberties as will become apparent from the below, detailed description.

In the illustrated SLDRAM system 100', power supply 101 provides a sequence of power levels upon system turn-on. First, a general LVCMOS voltage rail $V_{cc}$ (typically +2.50V) is activated. Then, after a predefined start-up delay of say 2 microseconds, the SLIO dedicated supply $V_{ccQ}$ (also typically +2.50V) is activated. Termination voltage $V_{term}$ is turned on thereafter. Reference voltage $V_{ref}$ may be turned on simultaneously with $V_{term}$ or shortly thereafter. SLIO receivers should ignore their inputs and output a default state at least until their local $V_{ref}$ is activated. $V_{term}$ is preferably turned on after $V_{ccQ}$ so as to avoid latch-up problems.

The $V_{cc}$, $V_{ccQ}$, and $V_{ref}$ power levels are respectively applied to the illustrated command module 150' and the daisy-chained sequence of SLDRAM modules 110', 120', etc. (only two shown) in accordance with the above sequence. It is understood that SLDRAM System 100' can have more than just the illustrated two SLDRAM modules 110', 120' and that general descriptions herein extend generally to such further SLDRAM modules.

A free-running oscillator 103 is provided for generating the CCLK (command clock) signal from a reference point when LINKON 151c3 is active. If desired, a power saving switch 102 may be included to disable oscillator 103 when LINKON is low. The frequency, waveshape and voltage levels of oscillator 103 may be programmably adjustable or not, as desired. The oscillator output is coupled to the CCLK bus 151b by way of a differential-output, SLIO driver 151k. Line-driver 151k may have tunable output levels or not, as desired. Additionally, it may be tristatable or not, as desired. If it is tristatable, its OE terminal should be driven by the LINKON signal 151c3 so that power is conserved when LINKON is false. Typically, line-driver 151k and at least part of oscillator 103 will be included within the sealed package of command module 150' so that the pins of module 150' serve as a reference plane. Driver 151k is shown outside for clarity and to emphasize the point that data transfer operations of SLDRAM System 100' are mediated by synchronous command packets, where such command packets are synchronized to a reference point that outputs the CCLK signal. If desired, oscillator 103 may be replaced by a distant clock source at a distal end of system bus 90. A DLL or PLL may be used locally to regenerate a local reference version of that distal clock source.

Stub resistor 106a couples the non-inverting, CCLK output of line-driver 151k to SLIO transmission line 107a. Stub resistor 106b couples the inverting CCLK# output of line-driver 151k to SLIO transmission line 107b. Node 108a represents a first tap into line 107a by a CCLK-receiving part of a first SLDRAM module 110'. Node 108b represents another tap into line 107b by the CCLK-receiving part (119) of module 110'. Termination resistor ($R_T$) 109a is provided at the end of line 107a and coupled thereafter to $V_{term}$. Similarly, termination resistor ($R_T$) 109b is provided at the end of line 107b and coupled thereafter to $V_{term}$. In one embodiment, each SLIO transmission line such as 107a and 107b is structured to operate with a switching frequency of about 200 MHz or higher.

Figure 5A:
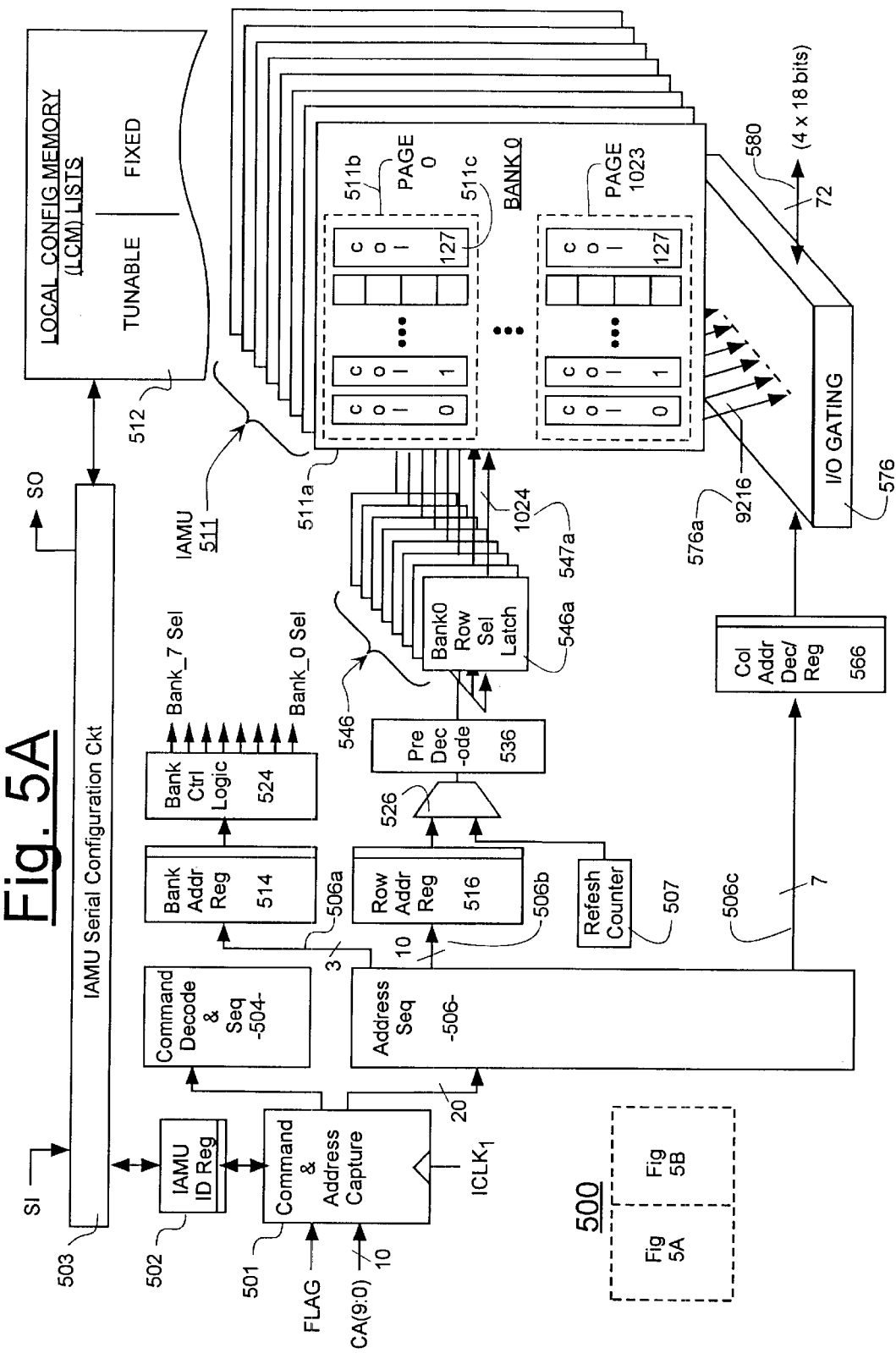
FIGS. 5A–5B combine to form a schematic diagram of an SLDRAM module in accordance with the invention.

SLDRAM module 110' includes at least one individually-addressable memory unit (IAMU) 111. This IAMU 111 comprises a plurality of selectable memory banks. See for example, the selectable Bank0 (511a) in the illustrated group of banks 511 of FIG. 5A. Each bank includes a plurality of selectable rows. See for example, the selectable top row 511b of Bank0 of FIG. 5A. (Note that an already-opened (currently selected) row is referred to herein as a "page".) Each row comprises a plurality of selectable columns. See for example, column 511c of FIG. 5A. Each column (e.g., 511c) comprises a plurality of dynamic memory cells for storing a respective plurality of data bits. In one embodiment of IAMU 511 (FIG. 5A), each column stores 72 bits; each row contains 128 columns; each bank contains 1024 rows (1K of rows); and the IAMU 511 has 8 banks. This provides a DRAM data storage capacity of 9,437,184 bits per bank or 75,497,472 bits (72 Mb) for all 8 banks. Other configurations are possible. Each given IAMU can have a different number of banks, a different number of rows per bank, and a different number of columns per row. Different embodiments of system 100' can even have different numbers of bits per column. FIG. 5A merely provides an illustrative example.

A page read latency value is associated with IAMU 111. In FIG. 1B such a PgRd latency is associated with coarse-and-tunable delay element 112a. This tunable PgRd delay 112a indicates at minimum how much time it would take to read an already-opened row (a page) within an already-opened bank after a page-read command packet is issued by command module 150'. The delay of tunable PgRd delay element 112a may be increased by the command module 150' to provide a longer delay as appropriate for scheduling page-read bursts. It is seen in FIG. 1B that the conceptual flow of read data is from IAMU 111 through PgRd element 112a and through output-level tunable line-driver 116 (tristatable) to the DQ_A bus 155a. The value of the PgRd latency 112a is generally tuned or set by the command module 150 during module-read initialization and subsequent, periodic recalibrations.

Another fine-and-coarse tunable delay element of FIG. 1B, namely 112b (BkRd) represents at least the latency delay of IAMU 111 for a given bank read operation where the bank read operation generally requires the selecting or opening of a specific bank, in combination with the selecting or opening of a specific row. The delay of tunable BkRd delay element 112b may be increased by the command module 150' to provide a longer delay as appropriate for scheduling bank-read bursts. Again, the data flow path is conceptually from IAMU 111 through delay element 112b, through line-driver 116 to the DQ_A bus 155a. In the actual device, the tunable delay is usually established by vernier shifting of phases of internal clocks that strobe respective latches of the data pipeline instead of using analog delay elements. However, any kind of delay technology may be used as appropriate. The SLDRAM system definition does not mandate a specific internal technology for each SLDRAM module.

Data read operation over DQ_A bus 155a continue in system 100' with the receipt by an SLIO transceiver 155d within the command module 150' of the SLIO. transmitted signal. During initial read-calibration and periodic recalibrations, the tunable output elements 114 of line-driver 116 are adjusted by the command module 150' to optimize the transfer of data from line-driver 116 to transceiver 155d by way of bus 155a. Specifics of this optimization process is left to design choices made by designers of the overall system 100'. A main feature of the present invention is that SLDRAM module 110' may be manufactured with loose tolerances so as to minimize its costs. The in-circuit tunability of delay elements such as 112a,b and of level-controlling elements such as 114 allow for in-circuit matching of the characteristics of the SLDRAM module 110' to the characteristics of the in-circuit data bus 155a and to those of the in-circuit command module 150'.

In one embodiment, after individual ID's have been assigned, the SLDRAM system 100' is further initialized by sequentially commanding each in-circuit SLDRAM module 110', 12', etc., to adjust output levels of the SLDRAM module's respective data-line driving circuits (116, 126) and data-clock driving circuits (118, 128) to H and L levels that are acceptable to the in-circuit command module 150'. This may be done using DC levels as will be seen. After the H and L levels are tuned using command-tunable elements such as 114, 124, etc, the SLDRAM system 100' may be further initialized by sequentially commanding each in-circuit SLDRAM module 110', 120' to respectively output a predefined second synchronization sequence (which can be the same as the first synchronization sequence, e.g., '111101011001000') over the data lines (e.g., DQ(17:0) 156a) of the system while simultaneously and synchronously outputting from the clock-drivers 118, 128 of the commanded SLDRAM module, a continuously-running clock train over one or both of the data-clock lines (e.g., DCLK0, DCLK1) of the system. This allows the in-circuit memory controller to command adjustments (e.g., individual phase changes) to the delay elements such as 112a,b, 122a,b of the local data-outputting circuits and/or to delay elements (or phase-setting elements) such as 113a, 123a of local data-clock outputting circuits of the sequence-outputting SLDRAM module so that the memory controller will be able to synchronously recognize the predefined second synchronization sequence at the locality 156d, 155j, 155k of the memory controller 150'.

Matching of the in-circuit characteristics for data write operations follows a similar approach. During the initial broadcasting of the first synchronization sequence (e.g., '111101011001000') by SLIO transceiver 155d and line-driver 155o of the command module 150', vernier delay elements such as 112d may be locally adjusted by their respective SLDRAM modules, 110', 120', etc. to optimally detect the predefined synchronization sequence. In one embodiment, wherein the initial broadcasting of the first synchronization sequence is aligned with the CCLK at the reference plane (the pins) of command module 150', vernier delay/phase units such as 113c,d are locally adjusted by their respective SLDRAM modules, 110', 120', etc. to define the sampling times of SLIO receivers 115, 117 such that units 115, 117 optimally detect the predefined synchronization sequence on the DQ and CA buses. In a subsequent, individual tuning operation, coarse delays such as those of PgW 112e and BkW 112f are set in accordance with commands sent from the command module 150'.

Thereafter, data flow during write operations conceptually flows from SLIO transceiver 155d, through DQ bus 155a, through vernier delay (or detection phase setting) 112d, through SLIO receiver 115, through a corresponding one of coarse delays 112e, 112f, and then into IAMU 111 for performing either a page write (PgW) or a bank write (BkW) operation.

Command output operations of the command module 150' are synchronized with the command clock (C_CLK/C_CLK#) of bus 151b, which CCLK generally originates from module 150'. Data write operations are similarly synchronized to the command clock by having the command module 150' drive a corresponding one of the D_CLK_0/0# or D_CLK_ 1/1# from respective SLIO transceivers 155j and 155k. On the other hand, data read operations are synchronized with a command-specified one of the D_CLK0 and D_CLK1 signals, where the command-specified data clock originates from the data-sourcing SLDRAM module 110', 120', etc. These SLDRAM module sourced signals are received respectively by transceivers 155j and 155k of command module 150'. SLIO transceiver 155d uses the received one of the D_CLK0 and D_CLK1 signals to sample its data from DQ_A bus 155a.

Within each SLDRAM module, internal clocks (ICLK's) of each SLDRAM module are formed as delayed counterparts of the CCLK signal. In SLDRAM module 110' for example, the differential SLIO receiver 119 acquires the CCLK signal from its respective tap points (108a,b) on lines 107a,b. The switching signal that is there detected by SLIO receiver 119 is operatively coupled to one or more vernierably tunable delay means (or phase-defining means) such as 113c,d for producing local ICLK signals. These local ICLK signals may be used during the broadcast synchronization operation to establish the signal latching phases of SLIO receivers such as 115, 117. Additionally, vernierably tunable delay/phase means such as 113a,b are operatively coupled to SLIO transceiver 118 for producing locally-phased versions of the DCLK_0A/DCLK_0A# (155b) and DCLK_1A/DCLK_1A# (155c) clock signals.

As seen, SLDRAM module 120' has its own set of separately tunable delay/phase means 123c,d and its own set of counterpart SLIO receivers 125 (for data read) and 127 (for command receive). The specific values of tuned delay in each respective SLDRAM module 110', 120', etc. can be adjusted in accordance with the impedances of respective local tap points such as 108a,b and in accordance with respective transmission line lengths present between the C_CLK source 151k and the respective circuits (e.g., 119, 115, 117, 129, 125, 127) within the corresponding SLDRAM module 110', 120', etc.

When signals flow the other way during a read operation, from a given SLDRAM module (110', 120') to command module receiver 155i, the respective module 110', 120' is responsible for generating a correspondingly phased data clock onto respective bus 155b or 155c. Due to space constraints, both of the DCLK0 and DCLK1 differential buses are shown in FIG. 1B as combination 155b,c above modules 110' and 120'. It is to be understood that the corresponding, differential bus-transceivers 118, 128 each actually represents two such SLIO differential transceivers, one dedicated to the D_CLK_0 bus 151b and the other dedicated to the D_CLK_1 bus 151c. The clock phase for each of these two data clock buses 155b,c are respectively controllable by tunable delay elements such as 113a, 113b and 123a, 123b.

Thus, the separate tap and transmission line characteristics attributed to each SLDRAM module and to each data clock bus 155b,c may be individually compensated for based on the specific in-circuit location of the data originating SLDRAM module relative to the command module 150'. This compensation accounts for the round trip path taken starting with the issuance of command packets from the command module 150, where these packets travel synchronously to an addressed SLDRAM module by way of the CA lines 151a while accompanying clock signals travel along the CCLK lines 151b. The pre-tuned SLIO receiver such as 117 or 127 of the addressed IAMU introduces the command at the appropriate time into its SLDRAM module because of the synchronization-time pre-tuning of delay/phasing means 112c and 122c, or 113c,d and 123c,d.

The addressed IAMU responds to its command blindly. Its response latency is compensated for by individually calibrated elements such as 112a,b; 112e,f; 122a,b; etc. Thus, in a read operation, compensation continues by having the data clock signal DCLK0/1 originate in the data-sourcing SLDRAM module and having it move through delay or phase-establishing elements such as 113a, 123a and local clock transceivers 118, 128 onto the DCLK bus 155b,c. At the same time, a correspondingly synchronized burst of read data moves from the addressed IAMU (e.g., 111, 121) and through delays 112a,b or 122a,b and the in-circuit-calibrated driver 116 or 126 back to the command module 150' by way of DQ_A bus 155a. Thus each SLDRAM module includes local compensating means for compensating for its unique, in-circuit situation.

In other words, if data is to be sourced from line-driver 126 of second module 120'—and module 120' has substantially different latencies than first module 110'—the correspondingly tuned data clock (DCLK0/0# or DCLK1/1#) will be generated by transceiver 128 of second module 120'. Corresponding tunable phase-establishers 123a,b will be used to define the local phase of the originated DCLK signal. Corresponding tunable phase-establishing elements 122a,b and 124 will be used to define the local phase and H/L levels of the originated burst of read data. If the read data is to be instead sourced from differently positioned line-driver 116 of first module 110', the correspondingly tuned data clock will be generated by transceiver 118. Corresponding tunable elements 113a,b, may be used to define the local phase of the there originated DCLK signal. Corresponding tunable elements 112a,b and 114 may be used to define the local phase and H/L levels of the there originated burst of read data. As such, the unique positionings and other variances of each SLDRAM module 110', 120', etc. and of the command module 150' may be compensated for individually by appropriate tuning of the tunable elements in each SLDRAM module 110', 120', etc.

The tuning ranges that are available for each respective set of tuning elements may be set forth in a corresponding, local configuration memory (LCM) 110a, 120a, etc. of the respective module 110', 120', etc. The organization of memory banks, rows and columns should also be set forth in the corresponding LCM 110a, 120a, etc. for each IAMU 111, 121, etc. Local configuration memories such as 110a, 120a, etc. may come in mixed forms such as ROM (read only memory) or PROM (once-programmable memory) or EEPROM (electrically-erasable and re-writable nonvolatile memory) and registers or SRAM. These local configuration memories 110a, etc. are used for storing fixed data and variable calibration settings of their respective SLDRAM modules.

During initialization (but after ID assignment), the command module 150' should address each SLDRAM module 110', 120', etc. individually and tune its respective $V_{OH}$ and $V_{OL}$ output levels for line drivers such as that of 116 and 118 in module 110'. The command module 150' may do so by commanding the addressed SLDRAM module to output a selected one of a DC (direct current) '0' level and '1' level onto a corresponding one of the DQ_A bus lines 155a and/or the DCLK_0A/DCLK_0A# (155b) lines and/or the DCLK_1A/DCLK_1A# (155c) lines. Then in response to the levels detected at its end of each of these buses 155a, 155b, 155c; the command module 150' may command the addressed SLDRAM module to increment or decrement the tunable $V_{OH}$ and $V_{OL}$ levels until a satisfactory state is reached. In general, the command module 150' uses its local $V_{ref}$ to define what received $V_{OH}$ and $V_{OL}$ levels are satisfactory.

After $V_{OH}$ and $V_{OL}$ calibration, the command module 150' should instruct each SLDRAM module in turn to individually output the predefined synchronization sequence (e.g., '111101011001000') onto each line of the DQ_A bus 155a. In FIG. 1B this output comes from line-driver 116 when 110' is the addressed module. At the same time, the command module 150' should instruct the addressed module to begin a free-running output of its local clock onto both the DCLK_0A/DCLK_0A# (155b) bus and the DCLK_1A/DCLK_1A# (155c) bus. In FIG. 1B these outputs comes from transceivers 118 (only one of a pair shown) when 110' is the addressed module. Then in response to the synchronized samplings detected at its end of each of these buses 155a, 155b, 155c; the command module 150' may command the addressed SLDRAM module to increment or decrement the tunable vernier setting of delay element such as 112a,b 113a,b until a satisfactory state is reached. That satisfactory state is of course, acceptable discrimination of the predefined synchronization sequence (e.g., '111101011001000') on each line of the DQ_A bus 155a in synchronism with the received clock signals of each of DCLK buses 155b and 155c.

After the individualized read synchronization process completes, the command module 150' should instruct each SLDRAM module in turn to individually perform one or more Bank Read operations and one or more Page Read operations while all other SLDRAM modules remain quiet. These read commands should use both of the DCLK buses 155b, 155c, each in turn. A DCLK preamble waveshape (see FIGS. 2A–2B) should be seen on the respective DCLK bus 155b, 155c just before the responsive burst of read data comes in. The command module 150' should measure the time between its command issuance and its receipt of the DCLK preamble waveshape to determine what the current latency of the addressed SLDRAM module is. (During active RESET#, each SLDRAM module should have reset itself to have its own minimum page and bank latencies. Thus, the read latencies measured shortly after RESET should be the respective minimum page read and bank read latencies of each respectively addressed SLDRAM module.) Information collected about the current read latencies of all the SLDRAM modules may next be used to define a smallest-allowed value for each of the page read and bank read latencies for the SLDRAM System 100' as a whole. Typically, these smallest-allowed values will be the page/bank read minimums of the slowest-to-read-from SLDRAM module (110', 120', etc.) in the system 100'.

After the individualized read latencies measurements complete, the command module 150' should measure the write latencies of each SLDRAM module in turn. This may be done by having the command module 150' output an extended burst of write data onto the DQ_A bus 155a immediately in conjunction with an ungapped series of write commands. The ungapped series of write commands should address consecutive locations within the SLDRAM module that is being tested. The corresponding extended burst of write data should first contain a slate-cleaning code such as all zeroes. Then the operation is repeated over an upper subset of the same set of addresses with the extended burst of write data now containing a predefined unique sequence of codes such as the values, 0, 1, 2, . . . , 31. This latter operation assumes a write latency of zero. The addressed SLDRAM module will have a greater write latency however. As such, one or more of the early members of the unique sequence of codes will not be written successfully into the addressed SLDRAM module. The corresponding memory locations will still have the clean slate code. The first memory location that does get written successfully into will contain a respective member of the unique sequence of codes (e.g., 5, 6, 7, 8, etc.).

By simply reading back the memory locations to see which memory location is the first to have had a member of the unique sequence of codes over-written successfully thereat, the command module 150' (or an upstream, more intelligent master) can determine what the current write latency is of the SLDRAM module that is being tested. Again, these write latency tests should be conducted for both page write and bank write operations using respective ones of the DCLK buses, 155b and 155c, so as to obtain a fair measure of overall system. performance. (During active RESET#, each SLDRAM module should have reset itself to have its own minimum page and bank latencies. Thus, the write latencies measured shortly after RESET should be the respective minimum page write and bank write latencies of each respectively addressed SLDRAM module.) Information collected about the current write latencies of all the SLDRAM modules may next be used to define a smallest-allowed value for each of the page write and bank write latencies for the SLDRAM System 100' as a whole. Typically, these smallest-allowed values will be the page/bank write minimums of the slowest-to-write-to SLDRAM module (110!, 120', etc.) in the system 100'.

During initialization (but after ID assignment and read synchronization), the command module 150' may address each SLDRAM module 110', 120', etc. individually to collect from the addressed module, certain characteristics information stored within the respective LCM (110a, 120a, etc.) of the SLDRAM module. Either the command module 150' or an upstream more-intelligent controller (not shown but understood to couple by way of system bus 90) may store the collected information from the LCM's in its own configuration-tracking memory. In FIG. 1B such a configuration-tracking memory 150b is shown situated within the package of module 150'. If desired, the configuration-tracking memory 150b may be located outside the package of module 150 in another, more intelligent and upstream means that couples to module 150' by way of system bus 90. See FIG. 1A.

This configuration-tracking memory 150b may be used after initial calibration or after periodic re-calibration operations to keep track of the currently-tuned states of each of the SLDRAM modules 110', 120', etc. and of their respective memory organizations. This information may be used to appropriately schedule data read and data write operations over a shared data bus (e.g., 155a) such that contention is avoided between SLDRAM modules 110', 120', etc. The tracking information may be further used to optimize read and write scheduling so that wasteful time gaps between data bursts may be avoided or at least minimized. Such minimization of wasteful time gaps helps to obtain maximal usage of the bandwidth provided by the shared data bus 155a.

It should be understood from FIG. 1B that dashed box 155x represents the resources of a first DataLink (A) corresponding to 155 of FIG. 1A while dashed box 156x represents the resources of an optional second DataLink (B) corresponding to 156 of FIG. 1A. Although not fully shown, the resources 156x of the optional secondary DataLink are understood to include dual differential transceivers such as 155j, 155k and a set of eighteen data line transceivers such as represented by 156d. All the calibration and measurement operations that have been described above for DataLink_A 155 may be further employed for the optional DataLink_B 156 if it is present. It is left to the command module 150' to read the LCM's (110a, 120a) of the respective SLDRAM modules for determining whether the optional DataLink_B 156 is functionally present in the system and whether and how such an additional DataLink_B 156 should be used to improve read and write bandwidths.

FIG. 2A provides a simple, first example of how latency information for each SLDRAM module may be advantageously used to closely pack respective data bursts on a shared DataLink (e.g., 155) while avoiding contention. A first command packet 210 consisting of four 10-bit wide command words is posted onto the CommandLink 151 beginning at time $t_0$. Successive command words are synchronized with respective 'ticks' of the CCLK. A tick corresponds to the duration between a rising and subsequently falling edge of the C_CLK. A '1' in the 5-bit FLAG sequence '01000' identifies the beginning of the command packet 210.

It is assumed here that command packet 210 is a data read command addressed to a given first SLDRAM module (e.g., 110'). The response latency of the addressed first module is represented by time passage 211. Starting at a time point $t_1$, the addressed first SLDRAM module outputs a predefined preamble waveshape 212 onto a command-specified one of the D_CLK buses, 155b or 155c (assume it is D_CLK_0 here).

The predefined preamble waveshape 212 should have a duration that is not longer than that of two minimum data bursts (so that minimum bursts can be interleaved using the DCKL0 and DCLK1 buses). It should be distinguishable from an alternating train of successive 1's and 0's (10101010 . . . ) as well as from maintenance of a power-conserving HI-Z state. It should also include at least one L-to-H transition and one H-to-L transition for removing intersymbol interference (ISI). Furthermore, the preamble waveshape 212 should have a continuous period of at least two clock ticks where its level is all 1's or all 0's during which the receiving device can safely enable its DCLK clock input without seeing any transitional glitches on the DCLK lines. In one embodiment, the predefined preamble waveshape 212 has a duration of 5 DCLK ticks (5 data word time slots) and consists of the 5 bit L/H sequence: 00010.

A first data word output by the addressed SLDRAM module appears on the DQ_A bus 155a in alignment with an end 213 of the predefined preamble waveshape 212. At the same time, the data originating module (e.g., 110') toggles its assigned D_CLK_0 bus with a windowed running of the data clock train immediately following the preamble waveshape 212. This windowed running of the data clock is used for synchronizing remaining words of its output data burst 230. Illustration here of the DCLK edges centering with the middle of each data word is purely conceptual and not intended to imply that such is necessarily the case. The phase relationship between a given data clock signal and its data words depends on where physically along their respective transmission lines each one is observed. During data read operations, the phase of the DCLK at its point of origin will generally not be the same as the phase of the CCLK at its point of origin. This is what the illustration here of the DCLK edges centering with the middle of each data word is intended to convey. In general, the embodiments disclosed herein rely on source synchronous clocking. This means that a known phase relationship exists between clock edges and their corresponding data (or clock) words at the source point on the bus where the respective clock and data (or command) signals are injected into the bus. The clock edges and the corresponding data (or command) words should track one another very closely as they move along the bus for receipt by a distant receiving device. The receiving device is expected to have internal, fine vernier phase adjustment means for compensating for fine skews of phase that may occur as respective clock and data (or command) signals move into the receiving device.

In one embodiment, data burst 230 consists of a minimum of four consecutive data words, each 18 bits wide. The corresponding command packet 210 may define the burst length as being the minimum or longer. Thus, for each read command packet in general, a responsive data burst 230 is produced by the addressed SLDRAM module and this data burst is defined as consisting of M consecutive words, where M is an integer equal to or greater than 4, and more preferably where M is a whole number multiple of 4.

Command packet 210 finishes using the CommandLink 151 at time point $t_4$. At a time point $t_{10}$, which latter point can be coincident with $t_4$ or it can come later, a next successive command packet 220 is placed on the CommandLink 151. Interpacket gaps such as 205 are optional and may be used to avoid contention on the shared DQ bus (e.g., 155a) between responsive data bursts.

In this example, the second command packet 220 is a read command that is addressed to a second SLDRAM module (e.g., 120') different from that targeted by first command packet 210. A second response latency 221 is associated with the reaction of the second SLDRAM module to second command packet 220. In accordance with the invention, the optional interpacket gap 205 should be adjusted such that the beginning 223 of the next data burst 240 (the one output by the second SLDRAM module) comes as close as possible to the end (214) of the first data burst 230 (the one associated with the first SLDRAM module) while avoiding contention on the shared DQ bus 155a. Preamble waveshape 222 may begin to be output by the originator (120') of the second data burst 240 onto the alternate DCLK bus (155c) at a time point $t_{11}$ even while the originator (110') of the first data burst 230 is still using the first DCLK bus (155b) and the DQ_A bus 155a.

Note that the use of dual data clock buses 155b,c allows for simultaneous compensation for the different positionings or other attributes of spaced-apart SLDRAM modules (e.g., 110', 120') and that such use also permits close coincidence between the end 214 of a first data burst 230 output by one such module and the beginning 223 of a second data burst 240 output by another such module. (In the example where 214 is the end of burst 230, it is to be understood that burst 230 consists of just the 4 data words, DATA_WD#0 through DATA_WD#3 rather than the more generic case represented by DATA_WD#M. Second data burst 240 may comprise more than its illustrated 4 data words.)

Note further from FIG. 2A that the use of dual data clock buses 155b,c allows the recipient (e.g., command module 150') of each corresponding data burst to prepare ahead of time for receipt of the beginning (213 or 223) of each respective data burst (230 or 240) by locking onto the preceding, preamble waveshape 212 or 222. Preambles such as 212 and 222 may overlap in time as will be seen.

Figure 2B:
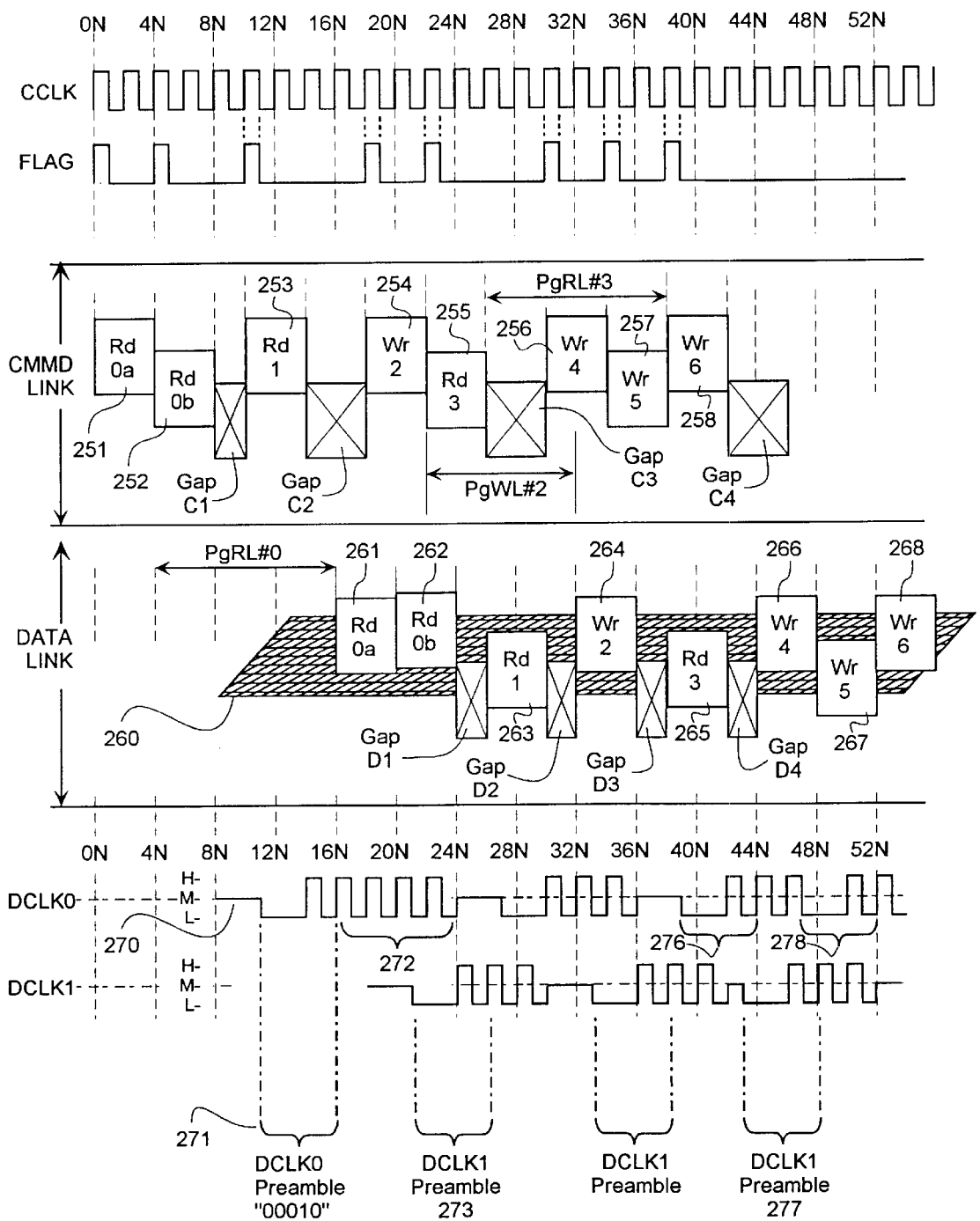
FIG. 2B is a timing diagram showing in more detail how commands, data clocks and data bus transfers may be interleaved in accordance with the invention.

FIG. 2B provides a vertically aligned timing diagram that shows a series of Page Read and Page Write commands as may be issued by the memory controller 150 to respective ones of the SLDRAM modules 110–180. FIG. 2B shows the relationship of these commands and their responsive data bursts to the CCLK, FLAG, DCLK0 and DCLK1 signals. For purposes of illustration all responsive data burst lengths are shown as 4N (where N is length of a CCLK tick) although 4N, 8N and/or longer data bursts can be dynamically intermixed if desired.

The read access time to a pre-opened row in a pre-opened bank, also known as Page Read Latency (PgRL#0), is shown in FIG. 2B as a 12N distance (e.g., 30 ns for a 200 MHz CCLK) between the end of the first command packet 251 and the beginning of the first responsive data burst 261. Each SLDRAM module can have its own, different Page Read Latency value as well as different Page Write and Bank Read/Write latency values. Thus the illustrated PgRL#0 applies to a respective SLDRAM module #0 but not necessarily to other modules (e.g., not to an SLDRAM #2 which in FIG. 2B is shown to have a shorter Page Write Latency value).

The first two illustrated command packets 251, 252 (Rd_0a and Rd_0b) are Page Reads to different banks in a same SLDRAM #0. The corresponding read data bursts 261, 262 both appear on the same data bus 155a along with a companion DCLK0 signal on bus 155b. As indicated by bracket 271 the preamble. waveshape consists here of the 5-bit times, 3-level sequence: '00010' wherefor '0' represents a L voltage level, '1' represents a H voltage level, and '—' represents a M voltage level, in other words the midlevel on the SLIO line between the H and L levels. In this example, the DCLK0 preamble waveshape 271 is immediately preceded by M train 270 ('——') and immediately followed by a subsequent, 8 ticks-long '101010 . . . ' train 272. The combination of preamble waveshape 271 and the subsequent '101010 . . . ' train 272 provides the memory controller 150 with synchronizing edges for preparing to, and for strobing-in the read data bursts 261, 262.

Because the first two Page Read commands 251, 252 are addressed to the same SLDRAM module, the first DCLK0 preamble 271 can provide pre-data synchronization for both of the first two Page Read bursts 261, 262. It is not necessary to insert a gap between the two 4N data bursts 261, 262. The data-outputting SLDRAM module itself can ensure that DCLK0 is driven continuously without any substantial glitch.

The responsive data burst 263 for the following Page Read command 253 (which command 253 is addressed to a different SLDRAM #1), should be separated from the preceding burst 262 by a data gap (Gap D1) of at least 2N duration to allow settling of the DataLink bus and to compensate for timing uncertainties between the data-clock generators of SLDRAM #0 and SLDRAM #1. A 2N data gap should be included each time control of the shared DataLink 155 passes from one module to another. This includes changeover of bus mastery, as such occurs in successive reads from different SLDRAM modules or as such occurs in read to write and write to read transitions where the command module 150 is master during the write operation and a pre-commanded SLDRAM module is master during the read operation.

The memory controller 150 is responsible for assuring that the 2N gap (e.g., GapD1) will be inserted between data bursts as appropriate. The command module 150 can do so by inserting a corresponding 2N gap (e.g., GapC1) or longer gaps between consecutive read or write command packets. It may alternatively create a DataLink gap by inserting on the CommandLink 151, command packets for operations other than those that use the affected DataLink 155.

The illustrated Read1 command 253 instructs the addressed SLDRAM #1 to use the DCLK1 bus 155c instead of the DCLK0 bus 155b. The responsive preamble 273 appears on the DCLK1 bus 155c at the same time the Rd0b data bursts 262 is still using the DCLK0 bus 155b. This parallel use of the DCLK0 and DCLK1 buses 155b,c allows SLDRAM #1 to begin mastering and conditioning its respectively-assigned DCLK lines well in advance of the actual data burst. Shaded parallelogram 260 is provided as a visual aid for visually distinguishing between those data transmissions that use the DCLK0 bus 255b for synchronization (this being indicated by having the respective Rd or Wr blocks shown to be isometrically positioned on top of the parallelogram 260) and those that use the DCLK1 bus 155c (this being indicated by having the respective Rd or Wr blocks shown to be isometrically positioned off and in front of the parallelogram 260).

The next command 254 (Wr2) in the example is a write command using DCLK0 to strobe write data from command module 150 into SLDRAM #2. The Page Write Latency (PgWL#2) of this SLDRAM #2 is taken to be pre-programmed to a value equal to PgRL#0–2N (two ticks less than the Page Read Latency of SLDRAM #0). In order to create a 2N-long mastery-changeover gap (GapD2) on the DQ_A bus 155a between the SLDRAM#1-mastered read operation Rd1 (263) and the controller-mastered write operation Wr2 (264), the controller 150 delays the issuance of the Write2 command 254 by including a 4N gap (GapC2) after the Read1 command 253. The programming of write latency values in this manner (e.g., PgWL#2 equals PgRL#0–2N) may be intentional so as to create one or more open 4N command slots on the CommandLink 151, which 4-word slots (e.g., GapC2, GapC3) could then be used for issuing 4-word commands of the non-data transfer kind such as row open, row close, register write or refresh. These non-transfer operations can be executed without consuming time slots on the DataLink 155.

The next command 255 in the example of FIG. 2B is a read command (Rd3) addressed to SLDRAM #3. An inter-packet gap is not needed between the Rd3 command 255 and the preceding Wr2 command 254 to create a 2N mastery-changeover gap (GapD3) on the DQ_A bus 155a because the latency difference between the programmably-established values, PgWL#2 and PgRL#3 provides such a gap (GapD3).

The command module 150 is master over the DataLink 155 when the respective data transfer operations 266, 267 and 268 of the last three, illustrated write commands, 256, 257 and 258 are executed. As such, 2N mastery-changeover gaps are not provided between the data bursts 266, 267 and 268 even though these write to different SLDRAM modules (#4, #5 and #6). However, different DCLKs should be generated by the command module 150 alternatingly on the DCLK0 and DCLK1 lines, 155b and 155c, so that each of the addressed SLDRAM modules (#4, #5 and #6) can lock onto the start of it's respective write data burst (as announced by respective preambles, 276, 277 and 278). Since all write data originates from the memory controller there should be no glitches of timing as between consecutive data bursts 266 (Wr4), 267 (Wr5) and 268 (Wr6) on the DQ_A bus 155a and the respective data clock signals on the DCLK0 and DCLK1 lines, 155b and 155c.

DataLink Mastery and Data Clocks

To summarize the above: for one embodiment of the invention, when control of a DataLink (e.g., 155, 156 of FIG. 1A) is passed from one module to another, each line of the databus portion (e.g., 155a) should be left to drift to a midpoint level (M) for nominally two ticks (2N) of the CCLK 151b. Such a mastery-changeover gap may produce indeterminate voltage levels between L and H, and possibly multiple transitions at the input terminals of receivers coupled to the DQ bus (155a). This transient state is acceptable for the data lines themselves, but not for the data clocks which will be used to strobe in new data once it becomes valid. To solve this problem, a predefined preamble waveshape such as 271 of FIG. 2B is output onto each respective data clock bus (155b,c) before the occurrence on the data clock bus of the first H/L transition which is associated with a corresponding first bit of read or write data (R/W data). The module that is commanded to receive the R/W data can enable it's command-identified one of two DCLK input buffers anytime during the period of the first three ticks (the initial '000' period) of the preamble wave-shape (271). At least one pair of dummy transitions '10' (L-to-H and H-to-L) is included in the preamble to allow the data receiver to remove pulse width dependent skew from its internal version of the DCLK signal. Accordingly, the receiving device ignores the first dummy rising and dummy falling edge of the locally-received DCLK signal and begins latching valid R/W data on the second rising edge (e.g., the beginning of period 272 of FIG. 2B). Two data clock buses are provided so that gapless 4N write bursts (e.g., 266–268) to different SLDRAM modules can be accommodated and so that minimally-gapped 4N read bursts (e.g., 262, 263) from different SLDRAM modules can be accommodated. The controller 150 indicates in each command packet which of the DCLK buses 155b,c is to be used for synchronizing each respective R/W data transfer.

In one embodiment, the controller 150 transmits CCLK edges that are coincident with edges of CA(9:0) command words and edges of the FLAG line (151c1). If the DCLK signal originates from the controller 150, the DCLK edges originating from the controller are also coincident with the CCLK edges at the controller end of CCLK transmission lines 151b as are the edges of the DQ(17:0) data.

The SLDRAM modules should be able to add fraction-of-a-tick delay to incoming CCLK and DCLK signals so that such modules can produce vernier-adjustable, internal clocks for sampling commands and write data at optimum time points. The SLDRAM modules (110–180) are generally programmed by the controller 150 to add the appropriate amount of fractional delay to DCLKs generated by the SLDRAM modules (110–180). These programmably-defined delays allow the controller 150 to accurately strobe in read data using the received DCLK signal without the need for any further internal delay adjustments within the controller 150.

Timing Adjustments

To recap, further in the one embodiment the controller 150 is expected to program each SLDRAM module with at least 4 respective timing parameters; Page Read Latency (PgR), Page Write Latency (PgW), Bank Read Latency (BkR), and Bank Write Latency (BkW). These latency values define the number of clock ticks between the end of a received command packet and the start of the associated data burst. For consistent operation of the memory subsystem, it is recommended that each SLDRAM module 110–180 should be programmed so as to appear to provide same values for the 4 different latencies as viewed from the vantage of the controller pins. Due to different round-trip bus delays from command-issuance by the controller 150 through recognition and response by the differently situated SLDRAM modules, due to the presence or absence of buffers in the system, and due to varying performances of individual SLDRAM devices, the actual values programmed into each SLDRAM module may differ considerably. On power up reset, latency registers within each SLDRAM module should automatically reset to their respective minimum values. The controller can measure the response times of each SLDRAM module after reset and then make appropriate adjustments to obtain consistent operation across the system 100.

In one embodiment, read latency (PgR, BkR) is made programmably adjustable in both coarse increments of unit bit intervals (unit ticks) and fine increments of fractional bit intervals (equal fractions of a tick). The controller should program the coarse and fine read latency of each SLDRAM so that read data bursts from different SLDRAM modules, at different electrical distances from the controller, all arrive back at the controller with equal delay as measured from issuance of the command packet at the controller pins. The controller 150 may, of course alternatively choose other latency schedules as allowed by the characteristics of the in-circuit SLDRAM modules. The uniform schedule one is merely the easiest to administer.

In one embodiment, write latency (PgW, BkW) of each SLDRAM module is made programmably adjustable by the controller 150 only in terms of coarse increments. The write latency values programmed into each SLDRAM module by the controller 150 determine when the SLDRAM module will begin looking for transitions on the command-specified DCLK lines in order to strobe in write data.

SLDRAM Command Format

Each SLDRAM command packet of one embodiment is organized as four 10-bit wide words that are transmitted over the CA(9:0) bus and are further aligned with a predefined FLAG sequence (01000) that indicates the presence of a command. The specific command packet depicted in Table 2.0 is designed for individually addressing up to 256 IAMU's (individually-addressable, memory units) where each such IAMU can have as many as 8 banks of DRAM storage, with each bank having as many as 1024 individually addressable rows of DRAM storage, and each row having as many as 128 individually addressable columns of DRAM storage. A column of DRAM storage comprises a plurality of DRAM cells whose respective bits of data are accessed as a collective burst. For the case where each column has 64 DRAM cells, this combination of banks, rows and columns represents a maximum DRAM storage capacity of 64 Megabits (64 Mb). For the case where each column has 72 DRAM cells, this represents a maximum DRAM storage capacity of 72 Mb (8×1024×128×72=75497472 bits=72 Mb).

In the command packet of Table 2.0, there are 9 bits (ID(8:0)) for addressing IAMU's individually or as groups. There are 3 bits for bank address, BNK[2:0], 10 bits for row address, ROW[9:0], and 7 bits for column address, COL [6:0]. The first row of x's represents a don't care. This means that the command receiver may detect the first zero in a 01000 FLAG sequence but is expected to ignore the bits of the CA(9:0) bus as they may apply to this specific command packet. They may belong to a previous command. Many other organizations and densities of memory can be accommodated within the same 40 bits of a command packet. Table 2.0 is merely an example.

On power up, the memory controller 150 should poll all the SLDRAM modules of the system 100 to determine how many banks, rows and columns each IAMU of each SLDRAM module has. The controller can then include the appropriate number of address bits in the command packet for each individual memory unit.

expected to ignore any command whose ID field (ID(8:0)) does not designate the local ID of the IAMU either individually, globally or on a multi-cast basis. Local ID's are assigned by the controller 150 on power-up using the SI/SO signals. This allows the controller to uniquely address every IAMU in the system without the need for separate chip enable signals or glue logic. The packet ID field comprises 9 bits. These bits, ID(8:0) are used for commanding up to 256 IAMU's over a given CommandLink 151. Half of the 512 location address space of ID(8:0) is reserved for broadcasting and multi-casting. Multi-casting may be used to simultaneously command groups of 2, 4, 8, 16 etc. IAMU's with a single command packet. This is useful for initialization, refresh, and multiple DataLink configurations. Table 2.1 depicts one allocation of the ID(8:0) address space for individual, multi-cast and broadcast commanding. Other allocations are of course possible.

TABLE 2.1

| ID8 | ID7 | ID6 | ID5 | ID4 | ID3 | ID2 | ID1 | ID0 | Addressed IAMU's |
|---|---|---|---|---|---|---|---|---|---|
| 0 | 0 | 0 | 0 | 0 | 0 | 0 | 0 | 0 | 0 |
| 0 | 0 | 0 | 0 | 0 | 0 | 0 | 0 | 1 | 1 |
| 0 | 0 | 0 | 0 | 0 | 0 | 0 | 1 | 0 | 2 |
| — | — | — | — | — | — | — | — | — | — |
| 0 | 1 | 1 | 1 | 1 | 1 | 1 | 1 | 1 | 255 |
| 1 | 0 | 0 | 0 | 0 | 0 | 0 | 0 | 0 | 0:1 |
| 1 | 0 | 0 | 0 | 0 | 0 | 0 | 0 | 1 | 0:3 |
| 1 | 0 | 0 | 0 | 0 | 0 | 0 | 1 | 0 | 2:3 |
| 1 | 0 | 0 | 0 | 0 | 0 | 0 | 1 | 1 | 0:7 |
| 1 | 0 | 0 | 0 | 0 | 0 | 1 | 0 | 0 | 4:5 |
| 1 | 0 | 0 | 0 | 0 | 0 | 1 | 0 | 1 | 4:7 |
| 1 | 0 | 0 | 0 | 0 | 0 | 1 | 1 | 0 | 6:7 |
| 1 | 0 | 0 | 0 | 0 | 0 | 1 | 1 | 1 | 0:15 |
| 1 | 0 | 0 | 0 | 0 | 1 | 0 | 0 | 0 | 8:9 |
| 1 | 0 | 0 | 0 | 0 | 1 | 0 | 0 | 1 | 8:11 |
| — | — | — | — | — | — | — | — | — | — |
| 1 | 0 | 0 | 0 | 0 | 1 | 1 | 1 | 1 | 0:31 |
| — | — | — | — | — | — | — | — | — | — |
| 1 | 0 | 1 | 1 | 1 | 1 | 1 | 1 | 1 | 0:255 |
| 1 | 1 | — | — | — | — | — | — | — | Other |
| 1 | 1 | 1 | 1 | 1 | 1 | 1 | 1 | 1 | 0:255 |

The multicasting pattern of Table 2.1 may be thought of as a pyramid whose base layer contains the 128 address space pairs, 0:1, 2:3, 4:5, . . . 254:255. The next higher layer of the pyramid contains the 64 address space quartets, 0:3, 4:7, 8:11, . . . 252:255. The next layer of the pyramid contains the 32 address space quartets, 0:7, 8:15, . . . 248:255. And so on.

SLDRAM Commands

The command field of the packet shown in Table 2.0 includes the 6 bits, CMD(5:0). Table 2.2 illustrates one possible allocation of the 64 locations in the CMD(5:0)

TABLE 2.0

DATA READ/WRITE PACKET

| FLAG | CA9 | CA8 | CA7 | CA6 | CA5 | CA4 | CA3 | CA2 | CA1 | CA0 |
|---|---|---|---|---|---|---|---|---|---|---|
| 0 | x | x | x | x | x | x | x | x | x | x |
| 1 | ID8 | ID7 | ID6 | ID5 | ID4 | ID3 | ID2 | ID1 | ID0 | CMD5 |
| 0 | CMD4 | CMD3 | CMD2 | CMD1 | CMD0 | BNK2 | BNK1 | BNK0 | ROW9 | ROW8 |
| 0 | ROW7 | ROW6 | ROW5 | ROW4 | ROW3 | ROW2 | ROW1 | ROW0 | 0 | 0 |
| 0 | 0 | 0 | 0 | COL6 | COL5 | COL4 | COL3 | COL2 | COL1 | COL0 |

Memory Unit ID and Multicasting

The first CA(9:0) word of the command packet of Table 2.0 contains the ID bits for addressing individually-addressable, memory units (IAMU's). Each IAMU is address space. CMD(5:3) define eight major command space areas as follows: (0) Page-accesses that produce a responsive burst of 4 data words; (1) Page-accesses that produce a responsive burst of 8 data words; (2) Bank-accesses that produce a responsive burst of 4 data words; (3) Bank-accesses that produce a responsive burst of 8 data words; (4) Row-operations/Register-operations/Event-commands; (5) Synchronization commands; (6) Reserved for future expansion; and (7) Reserved for future expansion. When the most significant bit CMD5=0, normal read or write commands are executed. The selection of Page-based or Bank-based access, Burst Length, Read or Write, Autoprecharge, and DCLK are subselections of this main selection. Page-based access implies that a bank has been opened ahead of time and a row has been opened within that bank. When CMD5=1, other operations such row open/close, register accesses, events, or special synchronization commands may be selected.

TABLE 2.2

| CMD5 | CMD4 | CMD3 | Command | CMD2 | CMD1 | CMD0 | Subcommand |
|---|---|---|---|---|---|---|---|
| 0 | 0 | 0 |  | 0 | 0 | 0 | Read Access, Leave Row Open, Drive DCLK0 |
| 0 | 0 | 0 |  | 0 | 0 | 1 | Read Access, Leave Row Open, Drive DCLK1 |
| 0 | 0 | 0 |  | 0 | 1 | 0 | Read Access, Close Row after, Drive DCLK0 |
| 0 | 0 | 0 | Page Access: Burst of 4 Data Words | 0 | 1 | 1 | Read Access, Close Row, Drive DCLK1 |
| 0 | 0 | 0 |  | 1 | 0 | 0 | Write Access, Leave Row Open, Use DCLK0 |
| 0 | 0 | 0 |  | 1 | 0 | 1 | Write Access, Leave Row Open, Use DCLK1 |
| 0 | 0 | 0 |  | 1 | 1 | 0 | Write Access, Close Row, Use DCLK0 |
| 0 | 0 | 0 |  | 1 | 1 | 1 | Write Access, Close Row, Use DCLK1 |
| 0 | 0 | 1 |  | 0 | 0 | 0 | Read Access, Leave Row Open, Drive DCLK0 |
| 0 | 0 | 1 |  | 0 | 0 | 1 | Read Access, Leave Row Open, Drive DCLK1 |
| 0 | 0 | 1 |  | 0 | 1 | 0 | Read Access, Close Row, Drive DCLK0 |
| 0 | 0 | 1 | Page Access: Burst of 8 Data Words | 0 | 1 | 1 | Read Access, Close Row, Drive DCLK1 |
| 0 | 0 | 1 |  | 1 | 0 | 0 | Write Access, Leave Row Open, Use DCLK0 |
| 0 | 0 | 1 |  | 1 | 0 | 1 | Write Access, Leave Row Open, Use DCLK1 |
| 0 | 0 | 1 |  | 1 | 1 | 0 | Write Access, Close Row, Use DCLK0 |
| 0 | 0 | 1 |  | 1 | 1 | 1 | Write Access, Close Row, Use DCLK1 |
| 0 | 1 | 0 |  | 0 | 0 | 0 | Read Access, Leave Row Open, Drive DCLK0 |
| 0 | 1 | 0 |  | 0 | 0 | 1 | Read Access, Leave Row Open, Drive DCLK1 |
| 0 | 1 | 0 |  | 0 | 1 | 0 | Read Access, Close Row, Drive DCLK0 |
| 0 | 1 | 0 | Bank Access: Burst of 4 Data Words | 0 | 1 | 1 | Read Access, Close Row, Drive DCLK1 |
| 0 | 1 | 0 |  | 1 | 0 | 0 | Write Access, Leave Row Open, Use DCLK0 |
| 0 | 1 | 0 |  | 1 | 0 | 1 | Write Access, Leave Row Open, Use DCLK1 |
| 0 | 1 | 0 |  | 1 | 1 | 0 | Write Access, Close Row, Use DCLK0 |
| 0 | 1 | 0 |  | 1 | 1 | 1 | Write Access, Close Row, Use DCLK1 |
| 0 | 1 | 1 |  | 0 | 0 | 0 | Read Access, Leave Row Open, Drive DCLK0 |
| 0 | 1 | 1 |  | 0 | 0 | 1 | Read Access, Leave Row Open, Drive DCLK1 |
| 0 | 1 | 1 |  | 0 | 1 | 0 | Read Access, Close Row, Drive DCLK0 |

TABLE 2.2-continued

| CMD5 | CMD4 | CMD3 | Command | CMD2 | CMD1 | CMD0 | Subcommand |
|---|---|---|---|---|---|---|---|
| 0 | 1 | 1 | Bank Access: | 0 | 1 | 1 | Read Access, Close Row, Drive DCLK1 |
| 0 | 1 | 1 | Burst of 8 | 1 | 0 | 0 | Write Access, Leave Row Open, Use DCLK0 |
| 0 | 1 | 1 | Data Words | 1 | 0 | 1 | Write Access, Leave Row Open, Use DCLK1 |
| 0 | 1 | 1 |  | 1 | 1 | 0 | Write Access, Close Row, Use DCLK0 |
| 0 | 1 | 1 |  | 1 | 1 | 1 | Write Access, Close Row, Use DCLK1 |
| 1 | 0 | 0 |  | 0 | 0 | 0 | Reserved |
| 1 | 0 | 0 |  | 0 | 0 | 1 | Open Row |
| 1 | 0 | 0 | Row Ops, | 0 | 1 | 0 | Close Row |
| 1 | 0 | 0 | Register Access, | 0 | 1 | 1 | Register Write |
| 1 | 0 | 0 | or Event | 1 | 0 | 0 | Register Read, Use DCLK0 |
| 1 | 0 | 0 |  | 1 | 0 | 1 | Register Read, Use DCLK1 |
| 1 | 0 | 0 |  | 1 | 1 | 0 | Reserved |
| 1 | 0 | 0 |  | 1 | 1 | 1 | Event |
| 1 | 0 | 1 |  | 0 | 0 | 0 | Read Sync (Drive both DCLKs) |
| 1 | 0 | 1 |  | 0 | 0 | 1 | Stop Read Sync |
| 1 | 0 | 1 |  | 0 | 1 | 0 | Drive DCLKs LOW |
| 1 | 0 | 1 | Data | 0 | 1 | 1 | Drive DCLKs HIGH |
| 1 | 0 | 1 | Sync | 1 | 0 | 0 | Write Sync (Both DCLKs toggling) |
| 1 | 0 | 1 |  | 1 | 0 | 1 | Reserved |
| 1 | 0 | 1 |  | 1 | 1 | 0 | Disable DCLKs |
| 1 | 0 | 1 |  | 1 | 1 | 1 | Drive DCLKs Toggling |
| 1 | 1 | 0 | Reserved | x | x | x | Reserved |
| 1 | 1 | 1 | Reserved | x | x | x | Reserved |

For register operations {CMD(5:3)=100} bits representing memory bank number, row number and column number are not required. Their fields in the command packet are instead filled to define register address and register write data. Since register writes do not use the DataLink 155, registers within SLDRAM modules can be written to before write synchronization is completed. Register read data appears on the DataLink 155 with DCLK exactly like a normal read. Table 2.3a shows one possible configuration for register read packets. Bits marked as 'uu' are unused and preferably each filled with a zero. Table 2.3b shows one possible configuration for register write packets. RD(9:0) define 10 bits of data that may be written to the addressed register, where the latter is addressed by REG(6:0). Bits SID(4:0) define a device sub-ID value.

TABLE 2.3a

REGISTER READ PACKET

| FLAG | CA9 | CA8 | CA7 | CA6 | CA5 | CA4 | CA3 | CA2 | CA1 | CA0 |
|---|---|---|---|---|---|---|---|---|---|---|
| 0 | x | x | x | x | x | x | x | x | x | x |
| 1 | ID8 | ID7 | ID6 | ID5 | ID4 | ID3 | ID2 | ID1 | ID0 | CMD5 |
| 0 | CMD4 | CMD3 | CMD2 | CMD1 | CMD0 | REG6 | REG5 | REG4 | REG3 | REG2 |
| 0 | REG1 | REG0 | uu | uu | uu | uu | uu | uu | uu | uu |
| 0 | uu | uu | uu | uu | uu | uu | uu | uu | uu | uu |

TABLE 2.3b

REGISTER WRITE PACKET

| FLAG | CA9 | CA8 | CA7 | CA6 | CA5 | CA4 | CA3 | CA2 | CA1 | CA0 |
|---|---|---|---|---|---|---|---|---|---|---|
| 0 | x | x | x | x | x | x | x | x | x | x |
| 1 | ID8 | ID7 | ID6 | ID5 | ID4 | ID3 | ID2 | ID1 | ID0 | CMD5 |
| 0 | CMD4 | CMD3 | CMD2 | CMD1 | CMD0 | SID4 | SID3 | SID2 | SID1 | SID0 |
| 0 | REG6 | REG5 | REG4 | REG3 | REG2 | REG1 | REG0 | uu | uu | uu |
| 0 | RD9 | RD8 | RD7 | RD6 | RD5 | RD4 | RD3 | RD2 | RD1 | RD0 |

Event-commands may include commands such as for Auto-Refresh, Self-Refresh, Reset, and Close All Rows. Calibration commands such as Read-Data Fine-Vernier Adjustment, Read-Data DCLK-Offset Adjustment, and $V_{OH}/V_{OL}$ Adjustments are also implemented as event commands. These event commands along with the special synchronization commands can provide the very tight signal timing and voltage levels that may be required in a given SLDRAM memory system. These tunable settings may be initialized and maintained over time by the memory controller 150.

Table 2.4a shows one possible configuration for event-request packets. Bits E(6:0) define specific events. Bits ADJ(4:0) provide adjustment setting codes. Bits DO(4:0) provide offset setting codes such as may be used in DQ output tuning. Table 2.4b shows one possible allocation of the E(6:0) address space.

TABLE 2.4a

EVENT REQUEST PACKET

| FLAG | CA9 | CA8 | CA7 | CA6 | CA5 | CA4 | CA3 | CA2 | CA1 | CA0 |
|---|---|---|---|---|---|---|---|---|---|---|
| 0 | x | x | x | x | x | x | x | x | x | x |
| 1 | ID8 | ID7 | ID6 | ID5 | ID4 | ID3 | ID2 | ID1 | ID0 | CMD5 |
| 0 | CMD4 | CMD3 | CMD2 | CMD1 | CMD0 | SID4 | SID3 | SID2 | SID1 | SID0 |
| 0 | E6 | E5 | E4 | E3 | E2 | E1 | E0 | uu | uu | uu |
| 0 | ADJ9 | ADJ8 | ADJ7 | ADJ6 | ADJ5 | DO4 | DO3 | DO2 | DO1 | DO0 |

TABLE 2.4b

EVENT DEFINITION CODES

| E(6:3) | E2 | E1 | E0 | EVENT ACTION(S) |
|---|---|---|---|---|
| 0 | 0 | 0 | 0 | RESET DEVICE, Set its ID register to 255, set its sub-ID register to 15 |
| 0 | 0 | 0 | 1 | RESET DEVICE, Leave its ID REGISTER and SUB-ID REGISTER unchanged |
| 0 | 0 | 1 | 0 | Perform an AUTO-REFRESH |
| 0 | 0 | 1 | 1 | CLOSE all ROWS |
| 0 | 1 | 0 | 0 | Enter SELF-REFRESH mode |
| 0 | 1 | 0 | 1 | Exit SELF-REFRESH mode |
| 0 | 1 | 1 | 0 | Adjust Settings |
| 0 | 1 | 1 | 1 | Reserved |
| 1 | x | x | x | Reserved |
| 2 | x | x | x | Reserved |
| 3 | x | x | x | Reserved |
| 4–7 | x | x | x | Open Space for Vendor Specific Events |

Device-internal registers and other memory may be used for storing device local ID codes, calibration values and other information. Table 2.5 shows one possible configuration for allocation of registered information over the address space of REG(0:6). This space is divided into a write-only side to which ID and calibration data can be written, and into a read-only side which stores device characteristics information such number of banks, delay values, and so forth. The 'Configuration' data includes an indication of how many DQ lines are present in the device (e.g., 16, 18, 32, 36, 64, 72, etc.). This lets the controller 150 know if multiple datalinks may be available for use.

TABLE 2.5

REGISTER SPACE

| REG (6:3) | REG2 | REG1 | REG0 | WRITE ONLY (CONTROL) | READ-ONLY (STATUS) |
|---|---|---|---|---|---|
| 0 | 0 | 0 | 0 | ID | Configuration (No. Banks, Rows, Columns, DQ_lines) |
| 0 | 0 | 0 | 1 | SUB-ID | Actual Delays |
| 0 | 0 | 1 | 0 | Frequency (current) | Minimum Delays |
| 0 | 0 | 1 | 1 | Test | Maximum Delays |
| 0 | 1 | 0 | 0 | Page Read Delay (PgR) | Test |

TABLE 2.5-continued

REGISTER SPACE

| REG (6:3) | REG2 | REG1 | REG0 | WRITE ONLY (CONTROL) | READ-ONLY (STATUS) |
|---|---|---|---|---|---|
| 0 | 1 | 0 | 1 | Page Write Delay (PgW) | tRAS/tRP (RowOpenTime/PreCharge) |
| 0 | 1 | 1 | 0 | Bank Read Delay (BkR) | tRC1/tRC2 (RowOpenTime/AutoRefresh Time) |
| 0 | 1 | 1 | 1 | Bank Write Delay (BkW) | tRRD/tXSR (BankOpenTime/Exit Self Refresh Time) |
| 1 | 0 | 0 | 0 | Reserved | tWR/tWRD (Write to Read Time Delay) |
| 1 | 0 | 0 | 1 | Reserved | tPR/tBR (Max_PgR/Max_BkR) |
| 1 | 0 | 1 | 0 | Reserved | tPW/tBW (Min_PgW/Min_BkW) |
| 1 | x | x | x | Reserved | |
| 2–7 | x | x | x | Reserved | |

In response to the command module 150' placing a code representing the current frequency of CCLK in the 'Frequency' register of a given SLDRAM module, the latter module will generally alter the characteristics information (e.g., min/max delay times) it provides on the read-only side of its LCM. Analog behavior of certain parts of the SLDRAM module may vary according to what CCLK frequency is being currently used by the controller 150.

SLDRAM Module Initialization and Calibration

System level calibration of individual SLDRAM module timings and output drive levels allows for high manufacturing yield using more mature semiconductor processes and lower cost for SLDRAM components. Individual devices are not required to meet tight AC and DC parametric specifications. Rather, these are calibrated at the system level both during initialization, and later periodically over time to compensate for wide variation in individual device parameters and time-dependent drift.

In one embodiment, when the SLDRAM memory subsystem 100 is powered up, the controller 150 must take the following steps, STEP1–STEP8 before normal memory operations can begin.

STEP1 (Power Up): $V_{cc}$, $V_{ref}$ and $V_{ccQ}$ are applied first followed later by application of $V_{term}$ (the 1.25 v CommandLink and DataLink termination supply), this being done to avoid latchup.

STEP2 (Reset): The RESET* pin on each SLDRAM module is held low. This clears the SLDRAM module's internal synchronization indication and sets device ID=255.

STEP3 (Synchronization): The controller begins transmitting CCLK and drives both DCLKs with continuous transitions, and sets its SO to '1'. On DQ[17:0], CA[9:0], and FLAG the controller transmits inverted and non-inverted versions of the 15 bit repeating pseudo-random SYNC sequence "111101011001000". The SLDRAM modules recognize this condition from the presence of 2 consecutive '1's on the FLAG line. Each SLDRAM module then determines for itself an optimum internal delay for CCLK and both DCLKs to optimally sample incoming bits. Before the SLDRAM module has synchronized it will set SO=0. Once the SLDRAM has synchronized and the appropriate delays for CCLK, DCLK0 and DCLK1 have been programmed, the SLDRAM module will set its SO=SI. The controller stops sending the SYNC pattern when its SI=1. It then resets its SO=0 which ripples through all SLDRAMs.

STEP4 (ID Assignment): The controller sets its SO=1 once again and sends out an 'ID Register Write' command packet having the write data field filled as the value, 0. Only the SLDRAM module with its SI=1 and ID=255 will respond to this command. This responding SLDRAM module overwrites its ID Register with the register-write data value of 0 and sets its SO=1. After sufficient delay (e.g., 4 ticks), the controller continues to output 'ID Register Write' command packets having their write data field filled with a next successive value, such as 1 and so on until it observes a high logic level on its SI. Then the controller knows ID's have been assigned to each in-circuit device. If the sequential ID values at the controller side exceed a predefined maximum number (e.g., 256) and the controller 150 has still not seen its SI line 152e go high, it can conclude that there is a break in the SI/SO chain. System BIOS may then output a message indicating that there is such a break in the SI/SO chain due to a defective SLDRAM module or other reasons.

In an alternate approach for ID assignment, rather than waiting a predefined number of ticks before issuing the next ID-assigning command, the controller 150 sends to the just-assigned module, one or more a drive-DQ to static high commands ('Drive DCLKs=1') and drive-DQ to static low commands ('Drive DCLKs=0'). If an appropriate response is seen on the DQ lines, the controller 150 knows the ID assignment has completed properly and proceeds to assigning the next module its ID. If an appropriate response is seen on the DQ lines within a predefined reasonable time frame, the controller 150 can conclude after one or more retries that the corresponding SLDRAM module is defective. System BIOS may then output a message indicating that there is a break in the SI/SO chain and where the break is located. (The controller can keep track of how many modules responded before the problem was encountered.) The user may be instructed to replace the Nth module in the series of present modules.

STEP5 (Voh, Vol Calibration): The controller calibrates each SLDRAM module's I/O levels by sending 'Drive DCLKs=0' or 'Drive DCLKs=1' commands to each device and then issuing 'Increment/Decrement Voh/Vol Event' commands until the levels match the controller's own reference. This step may be integrated with the above alternate method for assigning ID's where the 'Drive DCLKs=0' and 'Drive DCLKs=1' commands are used for verifying proper acceptance of each assigned ID.

STEP6 (Read Synchronization): The controller issues a 'Read Sync' command to each SLDRAM module. In response, the SLDRAM module then transmits continuous transitions on both DCLKs and the 15 bit pseudo-random synchronization pattern on DQ(17:0). The controller first adjusts the position of the data burst bits using the 'Increment Fine Vernier Event' command and then adjusts the delay of DQ edges relative to DCLK edges, using the 'Increment/Decrement DCLK Offset Event' command, to sample the synchronization pattern at the optimum point.

STEP7 (Read Latency Calibration): After RESET the SLDRAM module read and write latencies are set to their minimum values. For each SLDRAM module the controller issues a Drive DCLKs=0 command followed by a 'Read' command. The controller monitors the specified DCLK for the transitions which accompany the responsive data burst to measure latency. Once the minimum latencies have been measured for each SLDRAM module, an appropriate read latency value can be calculated and programmed into each device by writing to its Read Delay Registers.

STEP8 (Write Latency Programming): The controller issues to each SLDRAM module a write command with zero write latency and an extended 32N extended burst of data. Words in the write burst are incremented 0, 1, 2, 3, . . . 31. After the write command the controller reads the locations addressed by the write command. The first word contains an indication of the minimum write latency. With this information the controller can set the write latencies of all SLDRAM modules to a common value by writing to their respective Write Delay Registers.

Recalibration During Operation

During normal operations, calibrated timing and voltage level parameters may drift due to changes in temperature and/or supply voltages and/or passage of time. SLDRAM modules should be recalibrated periodically to ensure robust operation. Recalibration operations can be hidden during AutoRefresh and SelfRefresh periods so as not to affect system performance.

Buffered Modules

The SLDRAM protocol allows the addressing of hierarchical memory subsystems having more devices than a single electrical interface can support. Buffered modules permit deeper and/or wider memory configurations than the basic unbuffered configuration having only 8 SLDRAM chips. Buffered and unbuffered modules can be mixed in a system. The initialization and synchronization sequence will accommodate the additional delays added by the buffers.

Figure 3:
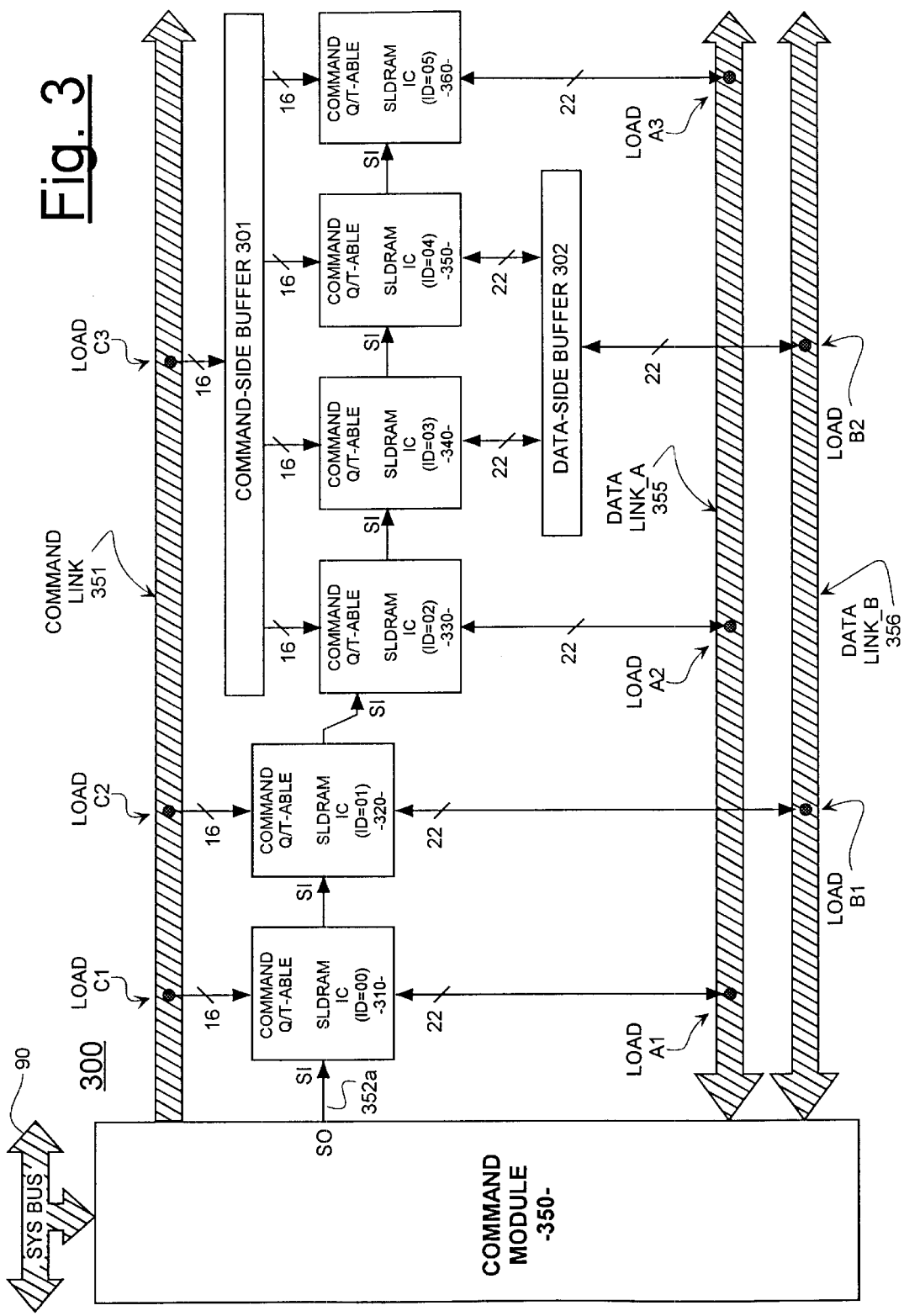
FIG. 3 is a block diagram of a buffered system.

FIG. 3 shows an example of an SLDRAM system 300 that includes buffers. Where practical, like reference numbers in the '300' century series are used for elements having like counterparts of the '100' century series in FIG. 1A. As such, details do not have to be repeated. Each of devices 310, 320, 330, 340, 350 and 360 is a packaged integrated circuit (IC) which includes command-queriable and command-tunable memory resources in accordance with the descriptions given above.

SLDRAM system 300 is shown in a post-initialization state. Unique identification numbers have already been assigned to each IAMU. SLDRAM IC 310 has been assigned an identification of ID=00. IC 320 has been assigned ID=01, and so forth. As explained above, in accordance with one embodiment, the number of SLIO electrical loads (a maximum of about 3 pF's each) that may be placed on each of the CommandLink 351, DataLink_A 355 and DataLink_B 356 is limited to eight, not counting the command module 350. The command-side of SLDRAM device 310 couples directly to CommandLink 351 to thereby define a first electrical load (LOAD C1) on the CommandLink. The data-side of SLDRAM device 310 connects directly to DataLink_A 355 to thereby define a first electrical load on that DataLink (LOAD A1). SLDRAM device 320 similarly creates a second load (LOAD C2) on the CommandLink 351 and a first load (LOAD B1) on DataLink_B 356.

A command-side first buffer 301 is interposed between SLDRAM devices 330–360 and the CommandLink 351. Accordingly, all four devices 300–360 represent only a single electrical load (LOAD C3) to the CommandLink. The data-side of device 330 connects directly to DataLink_A and thereby defines a second electrical load (LOAD A2) on that link 355. Similarly, the data-side of device 360 connects directly to DataLink_A and thereby provides a third electrical load (LOAD A3) on that link 355.

A data-side, second buffer 302 is interposed between the data-sides of devices 340, 350 and DataLink_B (356). As such, both devices 340-350 represent only a single electrical load (LOAD B2) on DataLink 356.

The illustrated use of buffers and direct connections within FIG. 3 is merely for purposes of illustration. Buffered and non-buffered modules may be mixed and matched in many further ways. For example, command-side buffering and data-side buffering may be hierarchical. Additionally, there may be more than just the illustrated two DataLinks 355, 356.

Because plural devices are connected in FIG. 3 to each of plural DataLinks (355, 356), multicasting may be used to simultaneously command the transfer of data along the plural DataLinks. For example, a first multicasting, command packet may simultaneously instruct device 310 (ID=00) and device 320 (ID=01) to perform a read data operation on their respective DataLinks 355, 356. A next multicasting command may instruct devices 330 (ID=02) and 340 (ID=03) to perform a data write operation on their respective DataLinks 355, 356. A yet further, multicasting command. may instruct devices 350 (ID=04) and 360 (ID=05) to perform a refresh during the time that devices 330 and 340 are using respective DataLinks 355 and 356.

In an alternate variation of the above multicasting technique, both of devices 310, 320 would be assigned a same identification, say ID=10 (not shown) instead of different ID's. Devices 310, 320 would be further assigned different sub-ID's. Similarly, devices 330 and 340 would be assigned a same next ID, say ID=11, but different sub-ID's. And correspondingly, devices 350 and 360 would be assigned a same next ID=12 while being given different sub-ID's. In this alternate configuration, a non-multicast R/W command to ID=10 will be simultaneously obeyed by devices 310 and 320. A non-multicast R/W command to ID=11 will be simultaneously obeyed by devices 330 and 340. A non-multicast R/W command to ID=12 will be simultaneously obeyed by devices 330 and 340. Tuning commands (register write commands) can be directed individually to devices according to sub-ID values. Thus each device can be individually tuned even though it may not have a unique ID assigned to it.

Given the mix and match assortment of buffered and non-buffered devices in FIG. 3, it should be apparent that turnaround time between command issuances and completions of execution can be quite different for each of the SLDRAM devices 310–360. For example, DataLink_A (355) may be differently loaded than DataLink_B (356) and may therefore exhibit different delay times for similarly situated modules. The response time of SLDRAM device 330 includes the delay of the command-side buffer 301 while the response time of device 310 does not. The response time of device 340 includes the combined delays of buffers 301 and 302. However, this is generally not a problem because the in-circuit tuning features of the present invention gives the command module 350 flexibility in setting the response times of each device 310–360 and in scheduling respective commands.

Buffered CommandLink

As seen in FIG. 3, wide modules (e.g., 330–360) with multiple DataLinks may provide higher memory bandwidth. Commands, however, may be issued over a shared and optionally buffered (301) CommandLink 351. CommandLink overhead, including pins on the controller, motherboard tracks and termination networks, termination power dissipation, and module connectors, is therefore not duplicated for each DataLink and savings are seen as system bandwidth is scaled upwardly by adding more DataLinks.

Buffered CommandLink and DataLink

As further seen in FIG. 3, the configuration of devices 340–350 allows a controller with a single SLDRAM interface to address a larger memory depth than 8 individual unbuffered SLDRAM devices (e.g., 310, 320) would allow. The CommandLink buffer 301 and the DataLink buffer 302 may be combined into a single chip with memory units 340–350. Alternatively, a single chip may contain just command buffer 301 and direct-to-DataLink units such as 330 and 360.

Pin Assignment and Board Trace Distribution

Figure 4:
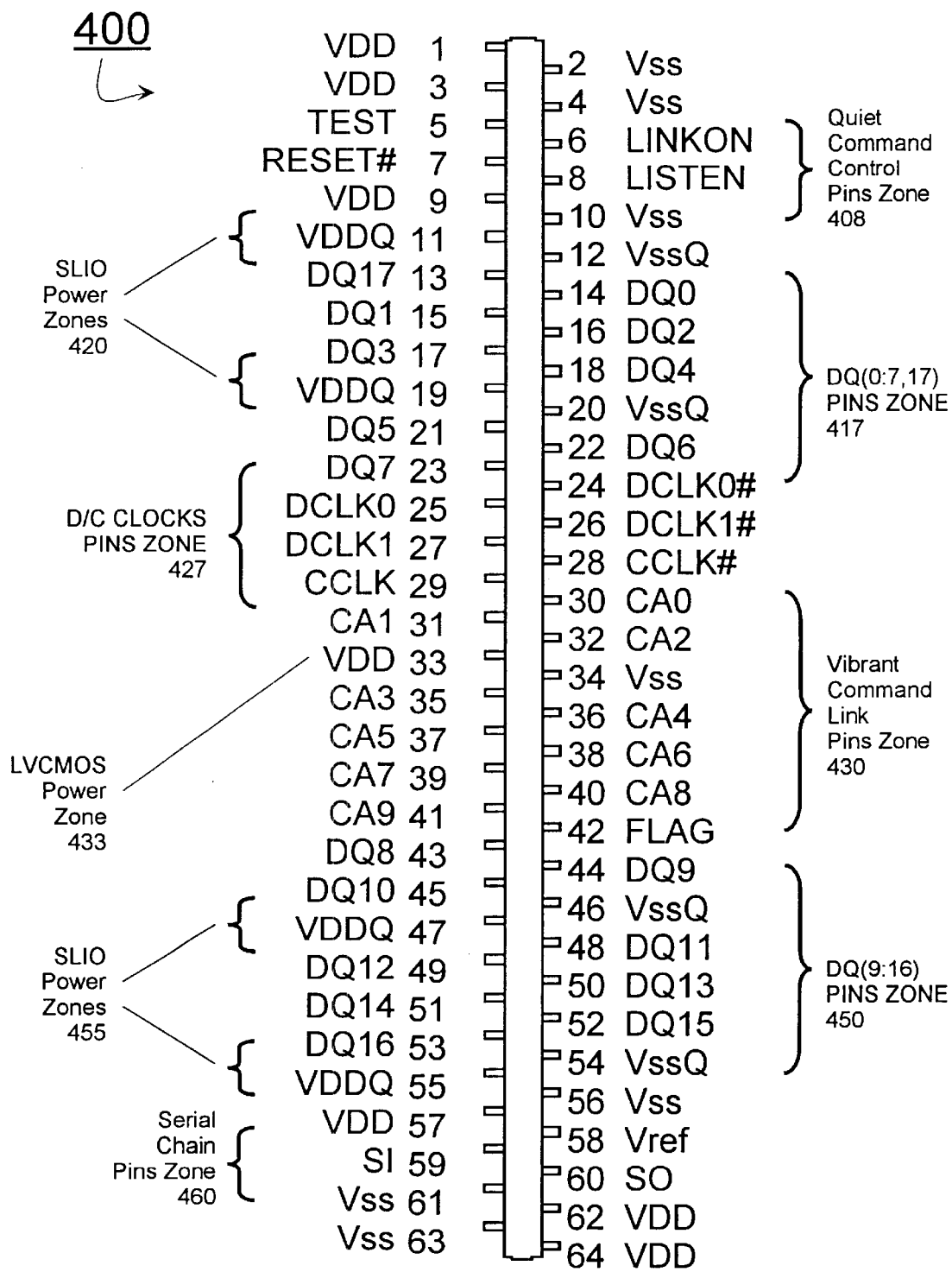
FIG. 4 is a top-view pinout diagram showing an interleaving of interconnect pins on opposed sides of a bottom of a Vertically Standing Module Package (VSMP) in accordance with the invention.

FIG. 4 illustrates a possible pinout arrangement 400 for an SLDRAM module or integrated circuit in accordance with the invention. Each SLDRAM integrated circuit or module may be a Vertically Standing Module Package (VSMP) which has interleaved pins on opposed sides thereof as shown. The pins may be used for removable insertion of the VSMP into a like-configured connector or for soldering into like-configured printed circuit board (PCB). Odd-numbered traces may appear on the top surface of the printed circuit board while even-numbered traces may run opposingly on the bottom surface of the PCB or vice versa. Other configurations are, of course, possible.

In the 64-pin layout of FIG. 4, signals that generally transition the least (e.g., $V_{DD}$ and $V_{ss}$) are provided at opposed outer portions (peripheral ends) of the odd/even serial pin distributions: 1, 3, 5, . . . , 63 and 2, 4, 6, . . . ,64. Relatively quiet (e.g., lower frequency) I/O pins such as the LVCMOS lines (pins 59, 60) of a serial chain zone 460 (SI/SO) are also provided near the bottom, outer extreme. Similarly, relatively-quiet command control signals (RESET#, LINKON, LISTEN) are carried by pins provided in a quiet command control zone 408 near an upper outer extreme of the pins series. Because the outer pins such as 1, 2 and 63, 64 are generally associated with the longest, diagonally extending traces in the lead frame of each IC, and these have relatively poor electrical characteristics, the lowest frequency signals (e.g., $V_{DD}$, $V_{ss}$, SI, SO, TEST, etc.) are positioned near these outer extremes.

In contrast, the signals with the highest frequency content (the generally most vibrant), namely the data clocks and the command clocks, are carried by pins provided generally in the middle of the serial pinout series. These pins (24–29) are generally designated in FIG. 4 as those of a D/C Clocks Pins zone 427. It should also be noted that in general, for most integrated circuit packaging designs, the internal lead frames have their shortest traces near the middle portion of the package side. These shorter lead frame traces typically exhibit the lowest capacitances, smallest inductances of the package and thereby provide superior electrical performance for transmitting signals with high-frequency content. Positioning of the command and data clock pins in such a zone 427 takes advantage of this general characteristic.

Immediately adjacent to the CCLK pins 28, 29 are the command word carrying pins 30–42, including the pin 42 that carries the FLAG signal. This pins grouping is generally denoted in FIG. 4 as a Vibrant CommandLink Pins zone 430. A relatively quiet LVCMOS power zone 433 separates the CA(0:2) pins from the more significant CA(3:9) pins.

An advantage of positioning the clock pins 427 and the command pins 430 centrally relative to a side of the integrated circuit die within the IC package is that such clock and command signals can be routed inside the IC package and die with equal delay to equidistant memory arrays on different halves of the IC chip.

Above the D/C Clocks Pins zone 427 there are provided the pins which carry the signals of data lines DQ(0:7,17). This grouping of pins is generally denoted as the DQ(0:7,17) Pins zone 417. Two SLIO Power zones 420 are interspersed in the area of DQ Pin zone 417. Each SLIO Power zone includes a $V_{DDQ}$ pin and a $V_{ssQ}$ pin.

Another grouping of data pins DQ(9:16) is provided in Pins zone 450 just to the outside of the CommandLink Pins zone 430. Two further SLIO Power zones 455 are distributed in the general region of the DQ(9:16) Pins zone 450.

In one embodiment, memory arrays are distributed such that those arrays which store an upper half of each data word are positioned near one end of the chip and those that store a lower half of the same memory word (e.g., lower byte) are disposed in the other half of the IC chip. The pins of DQ zones 417 and 450 are organized according to this distribution so that each data bit can travel along a relatively short path to reach its respective memory array rather than having to travel the full length of the IC chip. (In one embodiment, data bit DQ17 represents a parity bit that covers data bits DQ(9:16). Similarly data bit DQ8 represents a parity bit that covers data bits DQ(0:7). Note that the parity data bits DQ8 and DQ17 are disposed in the pin groups 430 and 417 opposite to that of their respectively covered data bits.)

The overall organization of pin layout 400 is structured to encourage substantial similarity in the electrical characteristics of the printed circuit board traces and pins that carry the D/C synchronization clocks (zone 427). Pin layout 400 is further structured to encourage substantial similarity of characteristics for the pins of the some-what-centralized zone 430 which carry the more Vibrant CommandLink signals (FLAG) and CA(0:9). DQ zones 417 and 450 straddle zones 427,430 so as to further encourage conformity in delay times between the DataLink lines and the CommandLink lines.

SLIO Power zones 420, 455 are symmetrically distributed relative to signal-sourcing SLIO lines so as to reduce ground bounce and provide uniform distribution of power to respective SLIO line drivers. The Vibrant CommandLink Pins zone 430 is not a signal-sourcing region of each respective SLDRAM module. Instead, it is a signal-receiving zone. It is the command module 150 that generally outputs signals onto the CommandLink 151. As such, there is no need to include an SLIO power zone in the middle of command zone 430.

Internal Structure of an SLDRAM Module

Figure 5B:
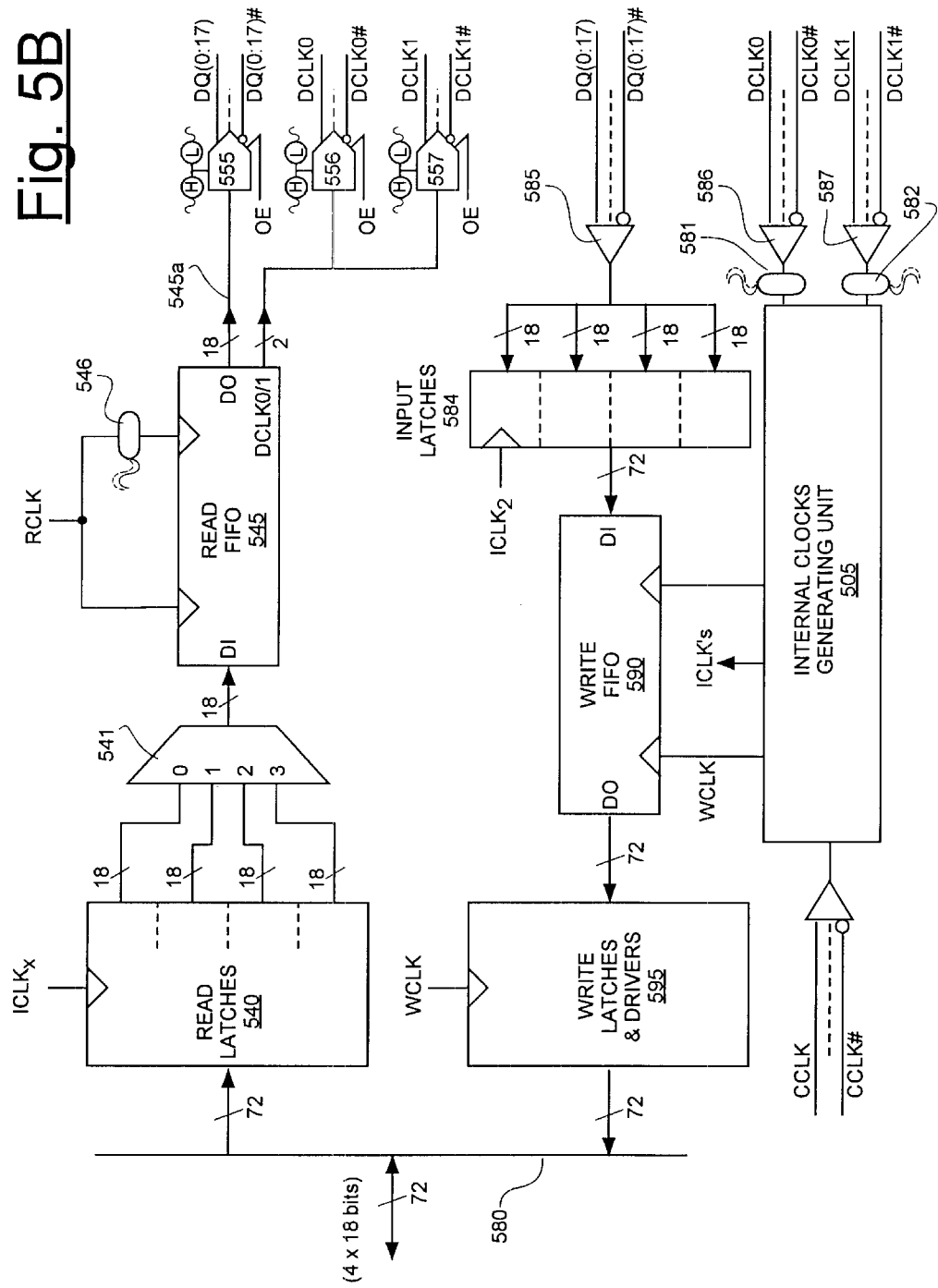

Referring to FIGS. 5A–5B, internal components of an SLDRAM module 500 that is in accordance with the invention will now be described. In SLDRAM module 500, CommandLink words are captured by a command-and-address capture unit 501. The signal latching time of unit 501 is controlled by a respective one ($ICLK_1$) of a plurality of internal clock signals (ICLK's) produced by an internal clocks generating unit (ICGU) 505. ICGU 505 is responsive to the locally received version of the command clock signals (CCLK) and to the locally received version of elsewhere-sourced data clock signals (DCLK0/1). A DLL (delay-locked loop, not shown) may be used inside ICGU 505 to produce a stable internal clock reference that runs in synchronism with the external CCLK. Respective phases of various ones of the internal clocks (ICLK's) are tuned during initialization and periodic recalibrations. ICGU 505 may include various phase-locked loops (PLL's, not shown) and/or other clock producing components, as appropriate.

Local ID register 502 is consulted by the CA capture unit 501 to determine whether a captured command is addressed to the present module 500. ID register 502 is shown separately but is understood to be part of a larger, LCM (local configuration memory) 512. LCM 512/502 is configured by IAMU configuration circuit 503 during initialization and calibration or re-calibration operations.

In response to captured commands, if it is so directed (by individual, or multicast, or broadcast addressing), command packet processing is initiated, or allowed to continue, in a command decoding and sequencing unit 504 as well as in an address sequencing unit 506. Twenty bits of data representing Bk(2:0), Row(9:0) and Col(6:0) are extracted from each general R/W command packet and sent to address sequencing unit 506 for decoding. Command decoding and sequencing unit 504 processes other information within the command packet.

A 3-bit wide first output portion 506a (Bk(2:0)) from the address sequencer 506 is sent to bank address register 514 to designate the currently open bank (e.g. Bank0 511a). The bank designating code within register 514 does not change during page access operations. Appropriate strobing of the bank address register 514 is provided by internal control logic (not shown).

A 10-bit wide second portion 506b (Row(9:0)) of the address sequencer output is supplied to row address register 516. The loading of a new value into row address register 516 corresponds to an open-new-row operation. Row address register 516 is strobed by internal control logic as appropriate. Multiplexer 526 routes the output of row address register 516 to an address pre-decoding unit 536. Pre-decoding unit 536 begins to decode a more significant part of the row address into parallel selection information. The decoding process is completed in pipelined fashion by an address-specified one of a plurality of row selection and decoding units 546. Each such unit is dedicated to a respective bank of memory. Accordingly, previously-made row selections may be retained on a bank by bank basis. Row selection decoding and latching unit 546a, for example, is dedicated to Bank0 (511a). Each of the row selection units 546 has a corresponding output of 1K lines (1,024 lines). Accordingly, row selection unit 546a has a first complement 547a of 1K parallel selection lines, each for respectively activating a corresponding one of the 1,024 rows (511b) in Bank0 (511a). The next, behind-shown, row selection unit has its respective complement of 1K parallel selection lines, and so forth.

Bank control logic unit 524 has an output comprised of eight bank selecting lines for respectively activating memory banks 0 through 7. Each successively-activated bank may use a retained row selection (row opening) as defined by a respective one of the row selection decoding and latching units 546.

During DRAM refresh operations, the output of a refresh counter 507 alternatively passes through multiplexer 526 for decoding by circuits 536 and 546.

A 7-bit wide, third output portion 506c (Col(6:0)) of the address sequencer is coupled to a column address decoding and registering unit 566. The latched output of unit 566 couples to an I/O gating unit 576.

Each of the eight memory banks of IAMU 511 includes its own set of sense amplifiers and a bidirectional data-carrying section having 9,216 lines (72 bits per column times 128 columns). These lines couple to the I/O gating section 576. One such grouping of 9,216 lines is shown at 576a. In response to a column address output by unit 566, and due to the activation or opening of a specific bank and pre-addressing of a specific row within that bank, I/O gating unit 576 gates a specific column of data to bidirectional data bus 580. In this particular embodiment, each column (511c) of memory stores 72 bits (which bits may be seen as four data words, each 18 bits wide).

Referring to FIG. 5B, data bus 580 couples to a quartet 540 of read latches, each 18 bits wide. These latches 540 are used for capturing read data output by gating unit 576. Multiplexer 541 sequences through the respective 18-bit outputs of each of latches 540 and supplies the selected 18-bits of data to a data input (DI) port of a read-side FIFO 545. FIFO (first in/first out) unit 545 resynchronizes the read data to align with one of the data clocks (DCLK0/1). Phase difference is compensated by, for example, command-tunable delay element 546. The resynchronized data is output from a DO port of FIFO 545 onto bus 545a and coupled thereby to DQ line drivers 555. The corresponding DCLK signal; whose phase is defined by command-tunable delay element 546, is output by an enabled one of DCLK bus drivers, 556 and 557.

When write data is provided from the command module 150, SLIO receiver 585 receives the DQ(0:17) signals while a command-selected one of SLIO receivers 586 and 587 is used for acquiring the controller-produced DCLK signals. Command-tunable delay elements 581, 582 are used to compensate for the in-circuit placement of module 500.

One of the internal clock signals $ICLK_2$ produced by ICGU 505 sequentially strobes a quartet 584 of 18-bit wide input latches for timely capturing a respective burst of four data words supplied on DQ(0:17). For longer bursts, a round-robin set of more than four input latches may be used. The showing of just four latches in group 584 is for purpose of example.

A corresponding, 72-bit wide output of the input latches group 584 is supplied to a data input port (DI) of write FIFO 590. Internal clock signals (ICLK's) are used for timely strobing the DI and DO sides of FIFO 590 so that the output data is in phase with an internal write clock WCLK. A 72-bit wide set 595 of data latches and gate-unit drivers then supply the column data to gating unit 576 by way of bus 580. The addressed column of the then open row is overwritten with the new data.

Internal Structure of a Memory Controller

Figure 6A:
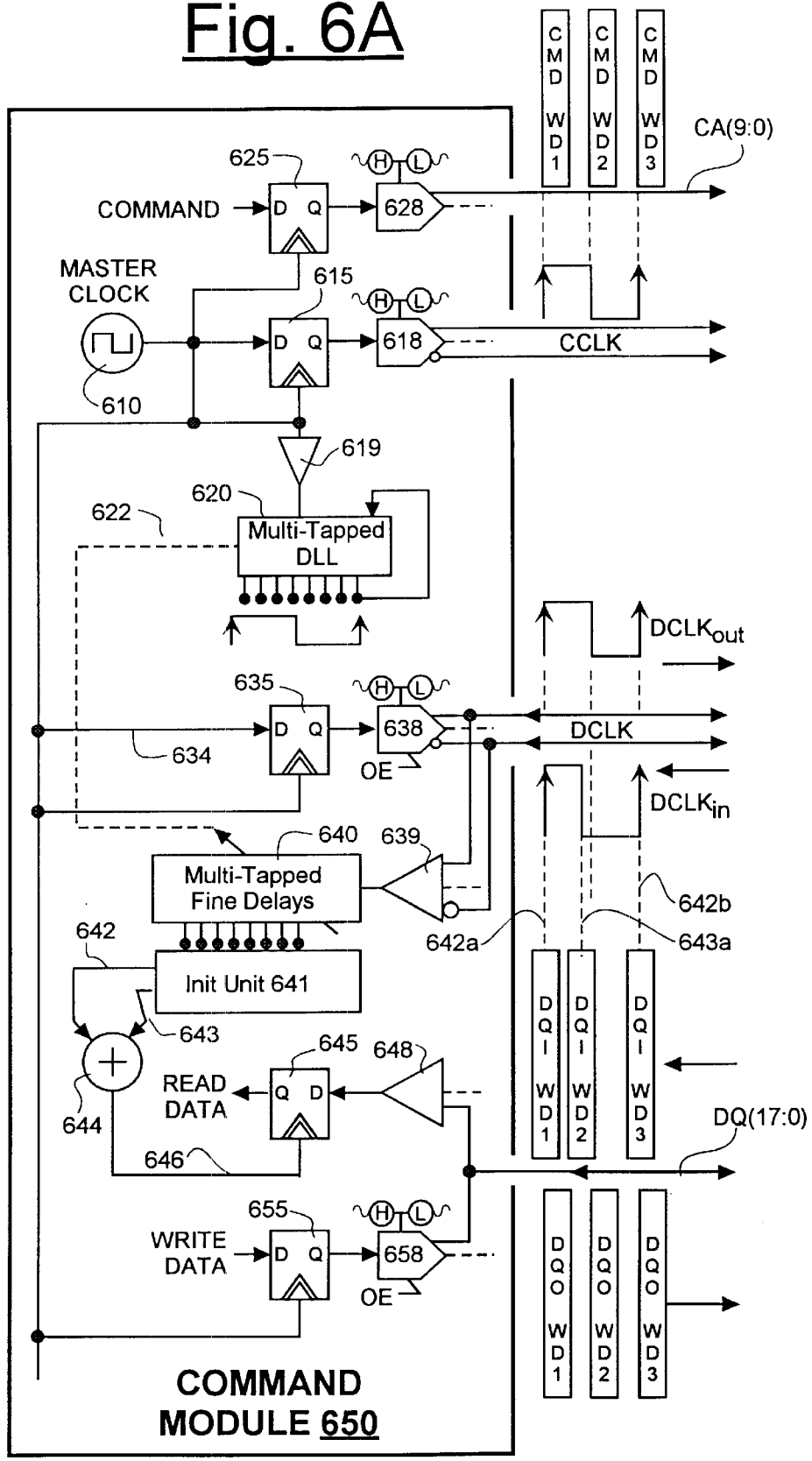
FIG. 6A is a block diagram of a memory controller in accordance with the invention.

FIG. 6A illustrates internal components of a command module 650 that is in accordance with the invention. Each dual-arrowed symbol such as at 615 represents a latch that acts on both the rising and falling edges of its respective clock signals. Master clock 610 drives both the clock input and D input of dual-edge latch 615. The Q output of dual-edge latch 615 drives SILO output buffer 618 to produce the external reference CCLK signal with respective rising and falling edges aligned to those of master clock 601.

Dual-edge latch 625 is also strobed by the master clock 610. A first command word (CMD_WD1) appears on the Q output of latch 625 in synchronism with a rising edge of master clock 610. The next subsequent command word (CMD_WD2) appears on the Q output of latch 625 in synchronism with the immediately next, falling edge of master clock 610. Subsequent CMD_WD3 appears in alignment with the-next rising edge. Non-differential SILO driver 628 outputs the respective command words onto the CA(9:0) bus. Line drivers 618 and 628 should be matched so that the same synchronism between rising and falling edges of the CCLK and validity of the command words is maintained at the output pins of command module 650.

Buffer 619 couples the master clock 610 to a first input of a multi-tapped DLL (delay locked loop). An end-tap of DLL 620 is coupled to its feedback input. There is a voltage-controlled delay (VCD) or a like variable delay means within DLL 620. (See for example DLL 620' of FIG. 6B.) Internal controls within DLL 620 modulate the variable delay (e.g., VCD) until successive rising edges at the feedback input are in phase with the rising edges of the master clock 610. There are enough tapped delays in DLL 620 such that the tapped delays define fractional units of one clock period of the master clock 610. In one embodiment, the master clock period is divided into 16 equal subunits of time by action of the DLL 620.

A signal 622 which defines the locked delay amount of DLL 620 is coupled to a like-designed unit 640. Unit 640 has multi-tapped fine delays controllable in the same manner as are the fine delay units of DLL 620. Because unit 640 is manufactured on the same IC as unit 620, the tapped delays of units 620 and 640 mimic one another despite changes in environmental temperature or voltage and despite process variations between one mass-produced IC chip and another.

Initialization unit 641 couples to the plural taps of variable delay unit 640. During read synchronization (when one of the SLDRAM modules is outputting the predefined SYNC pattern onto the DQ(17:0) bus as input words, DQI_WD1, DQI_WD2, etc., and is further toggling the DCLK buses (only one shown in FIG. 6A)), the corresponding $DCLK_{in}$ edges are received by SLIO receiver 639 and fed into tapped delay unit 640. Fractional adjustments are made to the phases of the rising and falling edges that are ultimately applied to a clock input 646 of dual-edge latch 645 for strobing in DQI words. To make these phase adjustments, initialization unit 641 connects an initialization-selected first of the taps of unit 640 to output line 642 for defining the phase of rising edges supplied to clock input 646. Initialization unit 641 further connects an initialization-selected second of the taps of unit 640 to output line 643 for defining the phase of falling edges supplied to clock input 646. Combining unit 644 combines the phased signals of lines 642 and 643 to produce the corresponding rising and falling edges on line 646.

The read synchronization adjustments to the phases on lines 642, 643 place sampling line 642a (which corresponds to a rising edge of $DCLK_{in}$) at a 'bulls-eye' time point relative to the DQI_WD1 signal that is received by way of SLIO receiver 648. They further place sampling line 643a (which corresponds to a falling edge of $DCLK_{in}$) at a 'bulls-eye' time point relative to the DQI_WD2 signal that is next received over the DQ bus. Sampling line 642b (which corresponds to a next rising edge of $DCLK_{in}$) is automatically at a 'bulls-eye' time point relative to the next, DQI_

WD3 signal because each SLDRAM module is required in this embodiment to maintain a fixed rise-to-rise period on the DCLK signals output by that SLDRAM module. In one embodiment, the rise-to-rise period on the DCLK signals output by each SLDRAM module match the rise-to-rise period of the CCLK signals output by the command module 650. (Timing between rising and falling edges is harder to control, as is understood in the art, because current sourcing and current sinking devices such as the P1 and N1 transistors of FIG. 1C tend to have different characteristics.)

When command module 650 performs a write operation, write data is output by way of dual-edge latch 655 and tristate SILO driver 658 to the DQ(17:0) bus. Latch 655 is strobed by the master clock 610. Dual-edge latch 635 is also strobed by the master clock 610 and produces the output data clock ($DCLK_{out}$) of the command module for output by tristate SILO driver 638 to the DCLK bus. Latches 635 and 655 are matched. SILO line-drivers 638 and 658 are matched. Thus the rising and falling edges of the $DCLK_{out}$ signal are aligned with the DQO words output by command module 650. SILO line-drivers 638 and 658 should be further matched to SILO line-driver 618 so that the DQO words output by command module 650 are in synchronization with the CCLK.

The $V_{OL}$ and $V_{OH}$ levels of SILO line-driver 638 may be tuned by the command module 650 itself based on how receiver 639 sees clock signals output by 638 while 638 is connected to the corresponding DCLK line of the system. Similarly, the $V_{OL}$ and $V_{OH}$ levels of SILO line-driver 658 may be tuned by the command module 650 itself based on how receiver 648 sees data signals output by 658 while 658 is connected to the corresponding DQ line of the system.

Figure 6B:
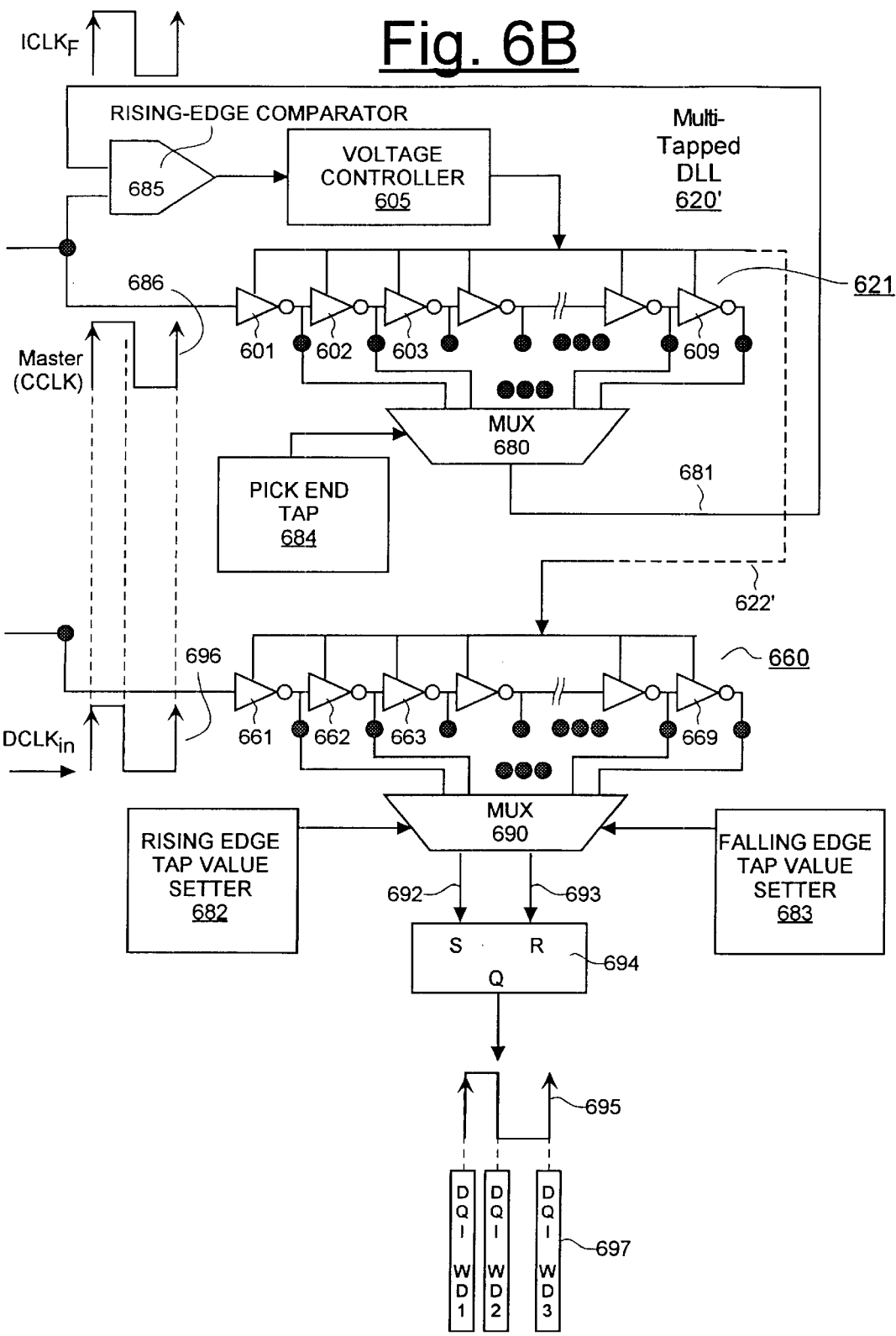
FIG. 6B is a schematic of a DLL circuit and a matched delay circuit that may be used in the memory controller of FIG. 6A.

Referring to FIG. 6B, an embodiment 620' for a multi-tapped DLL is described. The master clock signal 686 is applied as a reference to the input of a first, variable delay means (e.g., a CMOS amplifier) 601. Variable delay means 601 is part of a first serial chain 621 of variable delay means further including like elements 602, 603, . . . , 609. In one embodiment, a variable voltage supply/controller 605 controls the power supply voltage that is applied to each of the delay elements 601, 602 . . . , 609. This modulates their respective signal propagating times. Multiplexer 690 is fixed to return the output tapped from an end element (e.g., 609) of series 621 back to a phase comparator 685. Unit 684 determines which tap point is the end point and thereby determines how many fractions the period of master clock 686 will be divided into. All tap points of series 621 are equally loaded, for example by corresponding inputs of multiplexer 690.

Phase comparator 685 compares the phase difference between the rising edges of the fed-back output 681 of multiplexer 690 (also referenced as feedback signal $ICLK_F$) and the rising edges of the master clock signal 686. The phase comparator 685 then instructs the voltage controller 605 to modulate applied power supply voltage 622' of delay elements 601, 602, . . . , 609, so as to bring rising edges of the reference and feedback signals (686, 681) into synchronization with one another.

The synchronization-achieving, voltage 622' is further fed to a replica delay chain 660 that comprises respective, variable delay element 661, 662 . . . 669. Delay elements 661–669 are all fabricated on the same IC and in like manner as are delay elements 601–609. Tap points of delay chain 660 are loaded in the same way as those of delay chain 621. Accordingly, the delay elements of chain 660 acquire essentially the same delay values as those in the DLL 620'.

Multiplexer 690 is matched to multiplexer 680 and taps into all the respective tap points of chain 660. However, multiplexer 690 is not limited to selecting an end tap point as is multiplexer 680. Instead, multiplexer 690 has two respective outputs 692 and 693 which respectively output signals selected by a rising-edge tap-value setting circuit 682 and a falling-edge tap-value setting circuit 683. Outputs 692 and 693 are respectively coupled to the SET and RESET terminals of SR flip-flop 694. (The SET signals may be tapped off from tap points that provide the noninverted but delayed version of a next-described $DCLK_{in}$ signal 696 while the RESET signals are tapped off from tap points that provide the inverted but delayed version of $DCLK_{in}$.) The Q output of flip-flop 694 produces an output signal 695 that has respective rising and falling edges with phases defined by the outputs of tap-value setting circuits 682 and 683.

During read synchronization, the input data clock ($DCLK_{in}$) 696 is supplied to delay chain 660. Setting circuits 682 and 683 are operated to adjust the phases of their respective outputs 692, 693 such that the produced clock signal 695 has respective rising and falling edges that align as close as possible with optimal-detection, sampling points (e.g., the word centers) of the predefined synchronization signals (the SYNC sequence). This 'bulls-eye' acquisition is illustrated by the vertically aligned relationship in FIG. 6B between the centers of DQI words 697 and the respective rising and falling edges of generated clock signal 695. In one embodiment, each of the tapped serial chains 621, 660 includes at least 16 tap points for dividing the clock period of master clock 686 into 16 fractional units.

Figure 7:
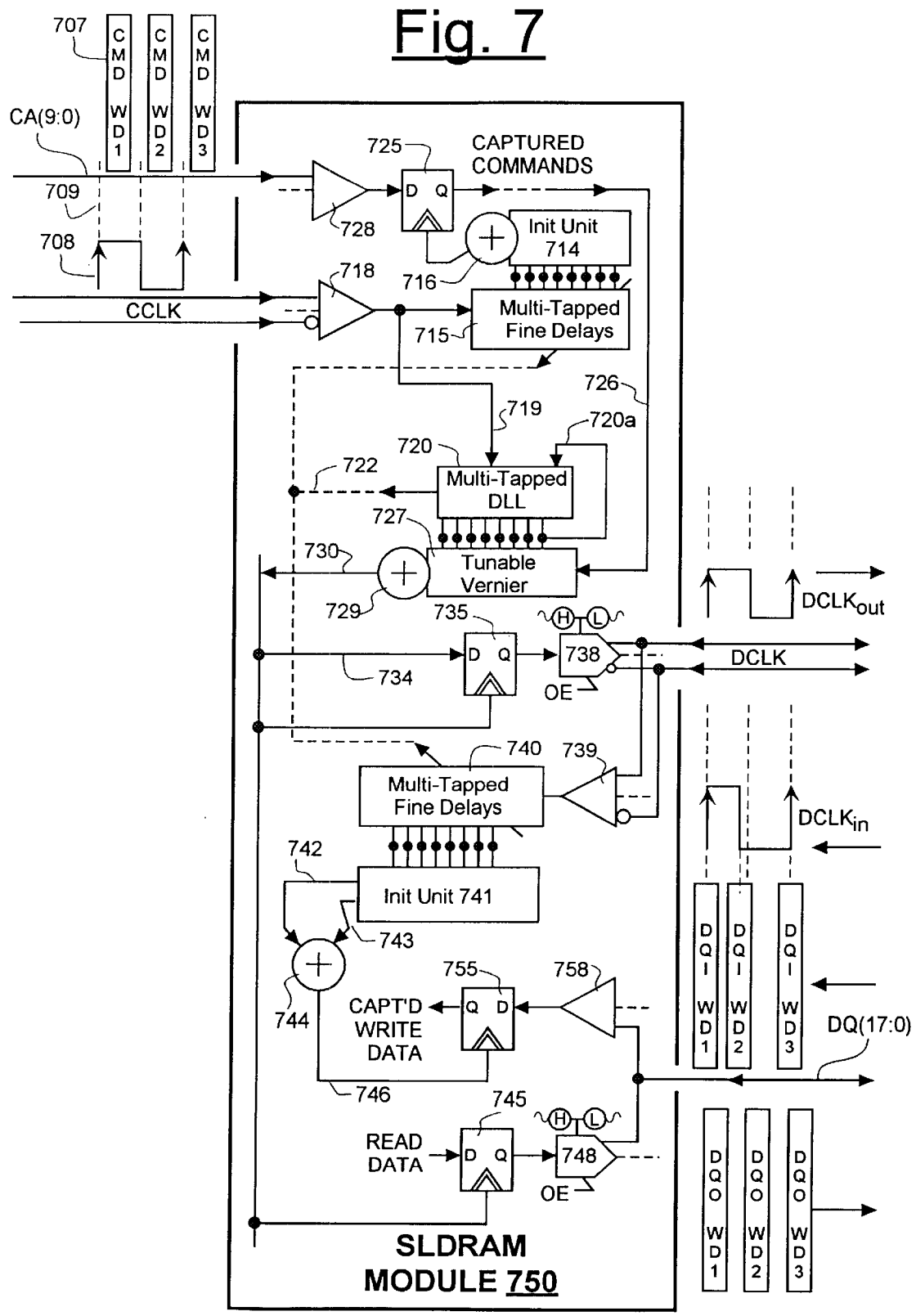
FIG. 7 is a block diagram of a SLDRAM module having timing circuits that complement those used in the memory controller of FIG. 6A.

Referring to FIG. 7, an SLDRAM integrated circuit module 750 is shown that complements the command module integrated circuit 650 of FIG. 6A. SLIO receiver 728 receives the command words output by SLIO line driver 628 (FIG. 6A) while differential SLIO receiver 718 receives the CCLK signals output by driver 618. Due to minor differences in transmission line characteristics, the arriving command words 707 may be slightly out of synchronization with the arriving CCLK signal 708 as indicated by timing lines 709 (e.g., a fraction of a tick data/clock skew).

Output 719 of the CCLK receiver 718 is supplied to one input of a multi-tapped DLL 720. An end-tap of the DLL 720 is fed back to its other input 720a. Signal 722 represents the phase-locking control voltage developed by multi-tapped DLL 720 for matching the phases of rising edges of signals on its main input 719 and its feedback input 720a.

Delay-establishing signal 722 is fed to a delay control input of a multi-tapped delay unit 740. Delay unit 740 corresponds to unit 630 of FIG. 6A. It receives data-clock (DCLK) signals by way of SLIO receiver 739 and provides fraction-of-a-tick delayed versions on its respective taps to initialization unit 741. Output lines 742 and 743 of the initialization unit 741 provide respective rising edge and falling edge signals to combiner 744. The resulting strobe pulses are carried by line 746 to the clock input of dual-edge latch 755.

During write synchronization, when the command module 650 is outputting the SYNC sequence signal on the DQ(17:0) bus and toggling the DCLK buses, initialization unit 741 adjusts the phases of the rising and falling edges on line 746 to optimize the sampling times of latch 755 for best detecting the predefined bit sequences (the SYNC sequence) in the incoming data words that pass through SLIO receiver 758 to the D input of latch 755. At the same time SLIO receiver 739 is transferring the incoming data clock signals ($DCLK_{in}$) to multi-tapped unit 740. This initialization operation therefore corresponds to the one carried out in FIG. 6A by units 639, 640, 641, 644, 645 and 648 except that now the command module 650 is outputting the SYNC sequence and each SLDRAM module (e.g., 750) adjusts its internal clock on its respective line 746 to compensate for the unique, in-circuit positioning of that SLDRAM module relative to the system reference points (e.g., the pins of the command module 650.)

Further during the write initialization process, the SYNC signal is also being broadcast to all the SLDRAM modules (e.g., 750) by way of the CA(9:0) bus while the CCLK is running. In FIG. 7, the incoming CCLK pulses are transferred from SLIO receiver 718 to a second multi-tapped delay unit 715. The variable delay-establishing control of multi-tapped delay unit 715 is driven by signal 722, which latter signal is output by multi-tapped DLL 720. The fine delay components of multi-tapped delay unit 715 are matched with those in multi-tapped DLL 720 and also those in multi-tapped delay unit 740. As such each can provide equal increments of a fraction-of-a-tick delay amount.

Initialization unit 714 receives the multiple, tapped delay signals output by multi-tapped delay unit 715. Circle-and-plus_sign symbol 716 represents yet another combiner like 744. Element 716 receives signals for defining the respective phases of rising and falling edges from initialization unit 714. Initialization unit 714 adjusts the respective phases of the rising and falling edges that are strobed into dual-edge latch 725 so as to bring the sampling points of latch 725 into alignment with the optimal-detection or 'bull's eye' positions of the SYNC signals then coming in on the CA(9:0) bus. Dual-edge latch 725 is accordingly conditioned while in-circuit to synchronously capture the respective bits of incoming command words 707.

During a later calibration phase of the SLDRAM system, the command module (650) sends individualized tuning commands to each respective SLDRAM module (750). One of these commands is a vernier-tuning command which is transferred along path 726 from the already-calibrated latch/initializer combination 725/714 to a tunable vernier unit 727. The tunable vernier unit 727 receives the tapped fine-delays of DLL unit 720. Like symbol 716, the circle-and-plus_sign symbol 729 represents a combiner which receives separate timings for respective phases of rising and falling edges from vernier controller 727. Element 716 outputs the corresponding clock signals onto line 730.

The clock signals output on line 730 may be thought of as the internal master clock of the given SLDRAM module 750. This master clock is transferred by way of line 734 to the D input of dual-edge latch 735 while the clock input of latch 735 is further strobed by the local master clock 730. The Q output of latch 735 drives SLIO differential line driver 738. Line driver 738 is tristatable and drives a corresponding DCLK bus when SLDRAM module 750 is given mastery over that DCLK bus (that mastery being given by way of a command packet issued by the command module 650). It may be noted that elements 734, 735, 738 of FIG. 7 correspond to elements 634, 635 and 638 of FIG. 6A. Line driver 738 does not have to be perfectly matched to line driver 638 (FIG. 6A) because the combination of tunable vernier 727 and initialization unit 641 can compensate for timing differences. Also the tunability of the $V_{OH}$ and $V_{OL}$ levels of each DCLK line-driver such as 738 helps to compensate for differences in current sourcing and current sinking capabilities of each SLDRAM module (e.g., 750) in the memory system.

Clock signal 730 is further coupled to the clock input of dual-edge latch 745. The D input of latch 745 receives read data that is to be output as bursts from SLDRAM module 750 during read operations. The Q output of latch 745 drives a tristatable, SLIO line-driver 748. The $V_{OH}$ and $V_{OL}$ output levels of line-driver 748 are also tunable by further commands that are captured by latch 725. These may be adjusted during the DC portion of the individual calibration of SLDRAM module 750. The data words such as DQO_WD1, DQO_WD2, DQO_WD3 that are output by line-driver 748 should appear on the DQ(17:0) bus in synchronism with the $DCLK_{out}$ signal that is simultaneously output by line-driver 738. Elements 745 and 748 of FIG. 7 correspond to elements 655 and 658 of FIG. 6A. It should be apparent now that line-driver 748 should be matched with line-driver 738 so that DQO output bursts are sourced in synchronism with the DCLK signals output by the corresponding SLDRAM module 750. Thus, source synchronization is provided in combination with destination tunability to thereby allow for mixing and matching of devices from different vendors while not requiring tightly-fixed tolerances in any one device.

To review here, the present disclosure provides at least the following features:

(a) A memory device (e.g., 310/320) may be divided into separate bank groups, each servicing a different DataLink (355/356) and concurrent operation may be obtained with pipelined commands.

(b) The CommandLink 151 uses a separate clocking signal (CCLK) from those (DCLK0/1) of the DataLinks, and this separateness allows for fully independent non-blocking access to further commanding SLDRAM modules even while one or more of the DataLinks are being used.

(c) Memory devices may be designed with internal memory units (IAMU's) that are semi-independent (e.g., having only different sub-ID's). Completely independent memory units offer flexibility from the standpoint of external control; however, the increase in die size caused by replicating circuitry for controlling each memory unit (each IAMU) may become too large as the number of internal memory units increases. Semi-independent memory units allow for sharing of access-control circuitry among proximal banks (i.e., shared sense amplifiers in a DRAM) provided some minor restrictions in external control are adhered to. For example, if a given row in bank N is active, then no same or differently-addressed rows in control-sharing banks N−1, N, or N+1 should be activated.

(d) A high-speed timing alignment scheme is provided that not only can adjust the coarse timing of when a response is returned relative to a command packet, but also the fine timing offset of the returned response relative to its associated clock.

(e) A memory device is provided where the read data latency can be programmed independently of the write data latency, and where an offset between the two latencies may be programmed to allow for optimal data bus performance/efficiency.

(f) A signaling technology is provided that uses a DC termination resistor, and allows for adjustment of the device's output high level and the output low level relative to the DC termination resistor. With the DC termination scheme, the output level adjustments can equalize the device's series on-resistance (see elements 130a, P1 of FIG. 1C) during output of a logic '1' to the device's series on-resistance (see elements 130b, N1 of FIG. 1C) during output of a logic '0'. Because of such equalized resistances for current sourcing and sinking, the resulting rise/fall times may be made approximately equal. Further, the voltage swings of one device calibrated on a bus may be made nearly equal to that of other devices on the bus, and this can result in no or very small timing skews for any device or voltage level. Setting the reference point to the midpoint between logic high and logic low also provides the lowest possible AC power dissipation during line togglings.

(g) By using differential I/O on only the clocks for strobing signals in a memory device, pin count may be reduced as compared to systems that force every I/O path to be differential. The use of differential signaling on the clock paths improves timing stability by reducing sensitivity to common mode noise and reference voltage variances, and it improves control of clock duty cycle. While an ideal high speed system might use differential signaling on all the data and command pins, such a system would not satisfy the desire for low-pin count in memory packages. The use of differential I/O at least for the clocks improves the stability of the timing references.

(h) The use of a daisy-chained serial link (152) in the system to sequentially enable individual devices to respond to commands on a shared CommandLink is advantageous during initialization before ID's are assigned. The daisy chain may be use to exclusively address a specific device in a system. The daisy chain may be used at different times to indicate the completion of respective different events (self-calibration and ID acceptance) by all devices.

(i) The use of a special first FLAG pin sequence to delineate the beginning of one command packet and the end of a previous command packet is advantageously combined with the use of a special second and different FLAG pin sequence to identifying special functions or operations, such as timing synchronization or calibration. Violation of the normal "1000" sequence (i.e., two or more 1's in a row) indicates the entry into a synchronization mode.

(j) A predefined synchronization pattern (SYNC) is used in an in-circuit calibratable memory system to allow optimization of data capture timing within devices, and to allow alignment of timing between devices to improve the bus efficiency of shared buses.

(k) Register read operations allow optimization of data capture timing for each device by identifying specific components and ranges of timing skew.

(l) Both exclusive addressing, and multi-cast programmable addressing schemes are used within a memory system to allow operations to be performed on appropriate groups of devices, in addition to exclusive operations. Multi-cast addressing can include broadcast addressing.

(m) Methods are disclosed for monitoring for a clock signal transition or level to determine the current latency time between a read command and its respective response in a memory system. This may be used to determine the difference in latencies of various devices in the system. This feature can be used to optimize the use of faster versus slower devices for different operations, or it may be used (possibly in conjunction with programmable latencies) to equalize latencies between devices, or to group devices together logically that have similar latencies.

(n) A memory system is disclosed wherein an initialization sequence includes assigning device ID's for optimal system configuration, and calibration output levels, and aligning and synchronizing the timing on the system bus for optimal performance.

(o) A special pseudo-random bit sequence (e.g., '111101011001000') that produces different 4-bit sequences is disclosed for implementing a synchronization pattern in a memory system.

(p) A method is disclosed of reading unique device characteristics information such as a manufacturer's code from a memory device to determine which manufacturer fabricated the device. This feature provides an advantage for detecting counterfeit memory devices that are physically marked with another manufacturer's name. The system may actually detect and report which devices populate a memory module or board. Other information that may be accessed from such a memory device includes manufacturing information such as date code, mask revision, configuration information such as organization and speed grade information.

(q) A method is disclosed of reading and writing unique device characteristics information. This includes the ability to program or to read a register in a device that specifies a value that is comprised of both analog (time) and digital (number of clock periods, or countable events) components. This allows a device to be optimized for a particular frequency, or any intermediate frequency with better timing resolution; and (r) The use of a non-free running strobe (DCLK's) for capturing data or information in a memory system whereby the strobe has a preamble of edge transitions prior to the data is advantageous in that it allows the receiving device to lock onto the strobe frequency, and to compensate for internal delays of the latching signals in the receiving device, and/or to reduce intersymbol interference of the strobe signal and thereby reduce timing uncertainty.

The above disclosure is to be taken as illustrative of the invention, not as limiting its scope or spirit. Numerous modifications and variations will become apparent to those skilled in the art after studying the above disclosure.

Given the above disclosure of general concepts and specific embodiments, the scope of protection sought is to be defined by the claims appended hereto.

What is claimed is:

1. A Synchronous-Link Dynamic Random Access Memory (SLDRAM) System comprising:

(a) a command module for issuing unicast command packets directed to uniquely addressable ones of plural memory units and for issuing multicast command packets directed to addressable collections of said memory units;

(b) a command link for carrying the command packets;

(c) one or more data links for carrying data corresponding to packet-commanded data-transfer actions; and (d) one or more, in-circuit programmably-calibratable SLDRAM modules each having one or more of said addressable memory units, where each SLDRAM module is capable of interfacing with the command link and at least one of the data links for appropriately responding to informational queries provided by command packets, for further appropriately responding to tuning (adjustment, or calibrating) commands provided by command packets, and for yet further appropriately responding to data addressing and other data-transfer-related commands provided by command packets.

2. A method for initializing a SLDRAM system having one or more, in-circuit programmably-calibratable SLDRAM modules, said method comprising the steps of:

(a) first initializing the SLDRAM system by broadcasting from a reference location a predefined first synchronization sequence over command/address lines and data lines of the system while simultaneously and synchronously outputting from the reference location a continuously-running clock train over one or more clock lines of the system for allowing one or more SLDRAM modules present in the system to each self-adjust local command-receiving circuits and data-receiving circuits of the SLDRAM module to synchronously recognize the predefined first synchronization sequence at the locality of the SLDRAM module;

(b) second initializing the SLDRAM system by sequentially assigning identification codes to individually-addressable, memory units within the in-system SLDRAM modules;

(c) third initializing the SLDRAM system by sequentially commanding each in-circuit SLDRAM module to adjust output levels of the SLDRAM module's data-clock driving circuits and data-line driving circuits to levels acceptable to an in-circuit memory controller;

(d) fourth initializing the SLDRAM system by sequentially commanding each in-circuit SLDRAM module to respectively output a predefined second synchronization sequence over the data lines of the system while simultaneously and synchronously outputting from the commanded SLDRAM module, a continuously-running clock train over one or more data-clock lines of the system, this for allowing the in-circuit memory controller to command adjustments (e.g., individual phase changes) to local data-outputting circuits and local data-clock outputting circuits of the sequence-outputting SLDRAM module So that the memory controller will be able to synchronously recognize the predefined second synchronization sequence at the locality of the memory controller; and (e) fifth initializing the SLDRAM system by sequentially determining data read and data write latency times of respective ones of the in-circuit, individually-addressable, memory units.

3. A packaged memory part comprising:

a plurality of at least sixty-four, sequentially ordered, interconnection terminals for interconnecting internal circuitry of the memory part with external circuitry, wherein said sequentially ordered, interconnection terminals of the memory part are arranged as a first group of odd-enumerable terminals and a second group of even-enumerable terminals provided along a periphery of the memory part, and wherein correspondence between said enumeration and signals carried by the respective interconnection terminals is as set forth in the following, two-column list in which terminal number is on the left and signal name is on the right:

1 Vdd
2 Vss
3 Vdd
4 Vss
5 TEST
6 LINKON
7 RESET#
8 LISTEN
9 Vdd
10 Vss
11 VddQ
12 VssQ
13 DQ17
14 DQ0
15 DQ1
16 DQ2
17 DQ3
18 DQ4
19 VddQ
20 VssQ
21 DQ5
22 DQ6
23 DQ7
24 DCLK0#
25 DCLK0
26 DCLK1#
27 DCLK1
28 CCLK#
29 CCLK
30 CA0
31 CA1
32 CA2
33 Vdd
34 Vss
35 CA3
36 CA4
37 CA5
38 CA6
39 CA7
40 CA8
41 CA9
42 FLAG
43 DQ8
44 DQ9
45 DQ10
46 VssQ
47 VddQ
48 DQ11
49 DQ12
50 DQ13
51 DQ14
52 DQ15
53 DQ16
54 VssQ
55 VddQ
56 Vss
57 Vdd
58 Vref
59 SI
60 SO
61 Vss
62 Vdd
63 Vss
64 Vdd.

4. The packaged memory part of claim 3 wherein said first group of odd-enumerable terminals and a second group of even-enumerable terminals are provided respectively on opposed sides of the memory part.

5. The packaged memory part of claim 3 wherein said external circuitry includes a command link, a serial link and one or more data links, and (10.1) wherein the command link is for carrying a plurality of command link signals, including:
(10.1a) a first complementary pair of command clock signals identifiable respectively as CCLK and CCLK# and provided respectively for coupling to said terminal numbers 29 and 28.

6. The packaged memory part of claim 5 wherein said plurality of command link signals further include:
(10.1b) a parallel set of at least ten command/address signals synchronized with the command clock signals, the command/address signals being representative at least of command packets, being identifiable respectively as CA0 through CA9 and being provided respectively for coupling to said terminal numbers 30, 31, 32, 35, 36, 37, 38, 39, 40 and 41.

7. The packaged memory part of claim 6 wherein said plurality of command link signals further include:
(10.1c) a plurality of FLAG signals, each for identifying a start of a corresponding command packet, said FLAG signals being provided for coupling to said terminal number 42.

8. The packaged memory part of claim 7 wherein said plurality of command link signals further include:
(10.1d) ) a LISTEN signal for indicating when commands can be present on the command link, said LISTEN signal being provided for coupling to said terminal number 8.

9. The packaged memory part of claim 8 wherein said plurality of command link signals further include:
(10.1e) a LINKON signal for indicating when the packaged memory part may enter a power-saving, shutdown mode, said LINKON signal being provided for coupling to said terminal number 6.

10. The packaged memory part of claim 9 wherein said plurality of command link signals further include:
(10.1e) a RESET# signal for indicating when the packaged memory part should enter a reset mode, said RESET# signal being provided for coupling to said terminal number 7.

11. The packaged memory part of claim 5 wherein:
(10.2) the serial link is for carrying a daisy-chained, set of serial signals including a SI signal and a SO signal, said SI and SO signals being provided respectively for coupling to said terminal numbers 59 and 60.

12. The packaged memory part of claim 11 wherein:
(10.3) at least one of said data links is for carrying a plurality of data link signals, said plurality of data link signals including:
(10.3a) first and second complementary pairs of data clock signals identifiable respectively as DCLK0, DCLK0#, DCLK1, and DCLK1#, said DCLK0, DCLK0#, DCLK1, and DCLK1# signals being provided respectively for coupling to said terminal numbers 25, 24, 27 and 26.

13. The packaged memory part of claim 12 wherein said plurality of data link signals further include:
(10.3b) a parallel set of at least eighteen data signals synchronized with one of the complementary first and second pairs of said data clock signals, where at least a subset of the data signals are representative at least of data stored or to be stored in memory and where said at least eighteen data signals are individually identifiable respectively as DQ0 through DQ17, said DQ0 through DQ17 signals being provided respectively for coupling to said terminal numbers 14, 15, 16, 17, 18, 21, 22, 23, 43, 44, 45, 48, 49, 50, 51, 52, 53 and 13.

14. The packaged memory part of claim 12 further comprising within the packaged memory part:
a first differential SLIO transceiver for at different times receiving and outputting the DCLK0 and DCLK0# signals by way of said terminal numbers 25 and 24; and
a second differential SLIO transceiver for at different times receiving and outputting the DCLK1 and DCLK1# signals by way of said terminal numbers 27 and 26.

15. The packaged memory part of claim 14 wherein:
each of the first and second differential SLIO transceivers has a tunable output by way of which $V_{OH}$ and $V_{OL}$ voltage levels of said DCLK0, DCLK0#, DCLK1 and DCLK1# signals on said terminal numbers 25, 24, 27 and 26 can be programmably tuned.

16. The packaged memory part of claim 15 further comprising within the packaged memory part:
local calibration means for incrementing or decrementing the $V_{OH}$ and $V_{OL}$ voltage levels of said DCLK0, DCLK0#, DCLK1 and DCLK1# signals in response to externally-supplied commands.

17. The packaged memory part of claim 5 and further wherein:
among said named signals, those whose names begin with Vdd are current sourcing, voltage rails, and those whose names begin with Vss are current sinking, voltage rails, Vref is a predefined reference voltage, and TEST is a test enabling signal.

18. The packaged memory part of claim 17 wherein said Vref reference voltage is approximately 1.25 volts.

19. The packaged memory part of claim 14 wherein each of said Vdd and VddQ current sourcing, voltage rails provides approximately 2.5 volts.

20. The packaged memory part of claim 5 further comprising within the packaged memory part, a differential SLIO receiver for receiving the CCLK and CCLK# signals from said terminal numbers 29 and 28.

21. An initialization method for use with one or more packaged memory parts of a memory system, wherein each memory part has a predefined number of sequentially ordered, interconnection terminals for interconnecting internal circuitry of the memory part with external circuitry, said external circuitry includes a command link, a serial link and one or more data links,
(53.1) wherein the command link is for carrying on lines thereof, a plurality of command link signals, including:
(53.1a) a first complementary pair of command clock signals identifiable respectively as CCLK and CCLK#;
(53.1b) a parallel set of at least ten command/address signals synchronized with the command clock signals, the command/address signals being representative at least of command packets and being identifiable respectively as CA0 through CA9;
(53.1c) a plurality of FLAG signals, each for identifying a start of a corresponding command packet;
(53.1d) a LISTEN signal for indicating when commands can be present on the command link;
(53.1e) a LINKON signal for indicating when the packaged memory part may enter a power-saving, shutdown mode; and
(53.1f) a RESET# signal for indicating when the packaged memory part should enter a reset mode,
(53.2) wherein the serial link is for carrying a daisy-chained, set of serial signals including a SI signal and a SO signal;

(53.3) wherein at least one of said data links is for carrying on lines thereof, a plurality of data link signals, including:
  (53.3a) first and second complementary pairs of data clock signals identifiable respectively as DCLK0, DCLK0#, DCLK1, and DCLK1#;
  (53.3b) a parallel set of at least eighteen data signals synchronized with one of the complementary first and second pairs of said data clock signals, where at least a subset of the data signals are representative at least of data stored or to be stored in memory and where said at least eighteen data signals are individually identifiable respectively as DQ0 through DQ17; and
(53.4) wherein each said memory part of the memory system includes at least respective SI and SO terminals for carrying the SI and SO signals, CA0 through CA9 terminals for respectively carrying the CA0 through CA9 signals, and DQ0 through DQ17 terminals for respectively carrying the DQ0 through DQ17 signals;
said initialization method comprising the steps of:
(a) applying a first activating signal to the SI terminal of each memory part of the memory system for initiating a respective first initialization operation in each memory part where the part auto-synchronizes itself to recognize a pre-defined synchronization pattern broadcast onto the CA and DQ lines from a reference location; and
(b) after said first initialization operation completes in each memory part of the system, applying a second activating signal to the SI terminal of each memory part of the memory system for initiating a respective second initialization operation in each memory part wherein the part is individually tuned according to its respective position relative to the reference location.

22. The initialization method of claim 21 wherein said second initialization operation of each memory part includes the steps of:
  (b.1) in response to said applying of the second activating signal to a given memory part and the supplying of a predefined default address, if the given memory part has not yet acquired an individual address for a respective data-storing, memory portion therein, causing the given memory part to receive and store an individual address from an external address-assigning source, said individual address being one that the memory part will thereafter individually respond to; and
  (b.2) allowing the given memory part to thereafter individually respond to the individual address assigned to the memory part from the external address-assigning source.

23. The initialization method of claim 22 wherein said predefined default address also serves as a universal broadcast address in said memory system.

24. The initialization method of claim 22
  wherein each said memory part of the memory system includes at least local calibration means for incrementing or decrementing the $V_{OH}$ and $V_{OL}$ voltage levels of one or more signals output by the memory part in response to externally-supplied commands that address the memory part,
  wherein said second initialization operation of each memory part includes the steps of:
  (b.3) in response to said applying of the second activating signal to a given memory part and the supplying of a pre-assigned individual address, allowing the given memory part to respond to register write commands that increment or decrement at least one of $V_{OH}$ and $V_{OL}$ voltage levels of one or more signals output by the memory part.

25. The initialization method of claim 22
  wherein each said memory part of the memory system includes read synchronization means for outputting a predefined synchronization sequence onto each data-reading line of the memory system; and
  wherein said second initialization operation of each memory part includes the steps of:
  (b.3) in response to said applying of the second activating signal to a given memory part and the supplying of a pre-assigned individual address, allowing the given memory part to respond to read synchronization commands that activate said outputting by the read synchronization means of the given memory part, of the predefined synchronization sequence onto each data-reading line of the memory system so that a data receiving device at a predefined receiving location can lock onto the predefined synchronization sequence at said predefined receiving location.

26. The initialization method of claim 25
  wherein said read synchronization means of each said memory part is further for outputting a predefined synchronization sequence onto each data-clock carrying line of the memory system; and
  wherein said second initialization operation of each memory part includes the steps of:
  (b.4) in response to said applying of the second activating signal to a given memory part and the supplying of a pre-assigned individual address, allowing the given memory part to respond to read synchronization commands that activate said outputting by the read synchronization means of the given memory part, of the predefined synchronization sequence onto each data-clock carrying line of the memory system so that a corresponding clock-receiving part of the data receiving device can lock onto the predefined synchronization sequence at said predefined receiving location.

27. The initialization method of claim 25
  wherein said read synchronization means of each said memory part is further for varying the phase of output of the predefined synchronization sequence output onto each data-clock carrying line of the memory system in response to supplied tuning commands; and
  wherein said second initialization operation of each memory part includes the steps of:
  (b.4) in response to said applying of the second activating signal to a given memory part and the supplying of a pre-assigned individual address and to supplied, phase tuning commands, causing the given memory part to respond by correspondingly varying the phase of output of the predefined synchronization sequence output thereby onto each data-clock carrying line.

28. The initialization method of claim 22
  wherein each said memory part of the memory system includes a programmable read delay means for delaying output of read data; and
  wherein said second initialization operation of each memory part includes, the steps of:
  (b.3) in response to said applying of the second activating signal to a given memory part and the supplying of a pre-assigned individual address, allowing the given memory part to respond to individualized read latency commands that cause the individually-addressed memory part to adjust the delay of its respective, programmable read delay means in accordance with the individualized read latency commands.

29. The initialization method of claim 28 wherein at least one of said individualized read latency commands defines a page read latency value that applies to an already-opened row within an already-opened bank of the given memory part.

30. The initialization method of claim 29 wherein at least one of said individualized read latency commands defines a bank read latency value that applies to a not-yet-opened row within a specifiable bank of the given memory part.

31. The initialization method of claim 28 wherein for plural and differently situated memory parts, the individualized read latency of each given memory part is adjusted in-circuit to provide a same turn-around time between arrival of read data bursts from the differently situated memory part and output from a reference location of a respective read command.

32. The initialization method of claim 22 wherein each said memory part of the memory system includes a programmable write delay means for delaying capture of write data after receipt of a write command; and
wherein said second initialization operation of each memory part includes the step of:
(b.3) in response to said applying of the second activating signal to a given memory part and the supplying of a pre-assigned individual address, allowing the given memory part to respond to individualized write latency commands that cause the individually-addressed memory part to adjust the delay of its respective, programmable write delay means in accordance with the individualized write latency commands.

33. The initialization method of claim 32 wherein said second initialization operation of each memory part includes the step of:
(b.4) measuring the minimum, in-circuit write latency of one or more memory parts.

34. The initialization method of claim 33 wherein said measuring step includes the substeps of:
(b.4a) commanding a writing of a predefined sequence of unique values to a given memory part;
(b.4b) transmitting the predefined sequence of unique values to the given memory part under assumed timing of a zero write latency;
(b.4c) reading back from the given memory part the values that were actually recorded in the given memory part under the assumed timing of a zero write latency; and
(b.4d) determining from said reading back where the values of the predefined sequence of unique values begin in the actually recorded data in the given memory part, said determining step being indicative of the minimum write latency of the given memory part.

35. A re-calibration method for use with one or more packaged and in-circuit resident memory parts of a memory system, wherein each said memory part includes a data-storing memory, and a configuration memory storing configuration indicia representing characteristics of the memory part, the configuration memory including a tunable portion, and said initialization method comprising the steps of:
(a) tuning the tunable portion of the configuration memory at a first time under initial, in-circuit conditions; and
(b) re-tuning at least part of the tunable portion of the configuration memory at a second time wherein in-circuit conditions may have changed.

36. The re-calibration method of claim 35 wherein said tunable portion of the configuration memory comprises at least one of the following tunable features:
(a.1) output drive levels of one or more line drivers of the memory part;
(a.2) command capturing phase of a command capturing mechanism of the memory part;
(a.3) write-data capturing phase of a write-data capturing mechanism of the memory part;
(a.4) read-data output fine phase of a read-data outputting mechanism of the memory part;
(a.5) page read, coarse delay that applies to reading of an already-opened row within an already-opened bank of the given memory part;
(a.6) bank read, coarse delay that applies to reading of a not-yet-opened row within a specifiable bank of the given memory part;
(a.7) page write, coarse delay that applies to writing to an already-opened row within an already-opened bank of the given memory part; and
(a.8) bank write, coarse delay that applies to writing to a not-yet-opened row within a specifiable bank of the given memory part.

37. The re-calibration method of claim 36 wherein said re-tuning of the one or more features is carried out at least on a periodic basis.

38. The re-calibration method of claim 36 wherein said re-tuning of the one or more features is carried out during at least one of AutoRefresh and SelfRefresh periods of the given memory part.

39. A Synchronous-Link Dynamic Random Access Memory (SLDRAM) System comprising:
(a) a command module for issuing unicast command packets directed to uniquely addressable ones of plural memory units and for issuing multicast command packets directed to addressable collections of said memory units;
(b) a command link for carrying the command packets;
(c) one or more data links for carrying data corresponding to packet-commanded data-transfer actions; and
(d) one or more, in-circuit programmably-calibratable SLDRAM modules each having one or more of said addressable memory units, where each SLDRAM module is capable of interfacing with the command link and at least one of the data links for appropriately responding to informational queries provided by command packets, for further appropriately responding to tuning (adjustment, or calibrating) commands provided by command packets, and for yet further appropriately responding to data addressing and other data-transfer-related commands provided by command packets.

40. A method for initializing a SLDRAM system having one or more, in-circuit programmably-calibratable SLDRAM modules, said method comprising the steps of:
(a) first initializing the SLDRAM system by broadcasting from a reference location a predefined first synchronization sequence over command/address lines and data lines of the system while simultaneously and synchronously outputting from the reference location a continuously-running clock train over one or more clock lines of the system for allowing one or more SLDRAM modules present in the system to each self-adjust local command-receiving circuits and data-receiving circuits of the SLDRAM module to synchronously recognize the predefined first synchronization sequence at the locality of the SLDRAM module;

(b) second initializing the SLDRAM system by sequentially assigning identification codes to individually-addressable, memory units within the in-system SLDRAM modules;

(c) third initializing the SLDRAM system by sequentially commanding each in-circuit SLDRAM module to adjust output levels of the SLDRAM module's data-clock driving circuits and data-line driving circuits to levels acceptable to an in-circuit memory controller;

(d) fourth initializing the SLDRAM system by sequentially commanding each in-circuit SLDRAM module to respectively output a predefined second synchronization sequence over the data lines of the system while simultaneously and synchronously outputting from the commanded SLDRAM module, a continuously-running clock train over one or more data-clock lines of the system, this for allowing the in-circuit memory controller to command adjustments (e.g., individual phase changes) to local data-outputting circuits and local data-clock outputting circuits of the sequence-outputting SLDRAM module so that the memory controller will be able to synchronously recognize the predefined second synchronization sequence at the locality of the memory controller; and (e) fifth initializing the SLDRAM system by sequentially determining data read and data write latency times of respective ones of the in-circuit, individually-addressable, memory units.

* * * * *